(12) United States Patent
Yamauchi

(10) Patent No.: US 11,587,804 B2
(45) Date of Patent: Feb. 21, 2023

(54) COMPONENT MOUNTING SYSTEM

(71) Applicant: BONDTECH CO., LTD., Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 686 days.

(21) Appl. No.: 16/484,450

(22) PCT Filed: Jan. 31, 2018

(86) PCT No.: PCT/JP2018/003308
§ 371 (c)(1),
(2) Date: Aug. 7, 2019

(87) PCT Pub. No.: WO2018/147147
PCT Pub. Date: Aug. 16, 2018

(65) Prior Publication Data
US 2020/0006099 A1    Jan. 2, 2020

(30) Foreign Application Priority Data

Feb. 9, 2017  (JP) .............................. JP2017-021953
Nov. 10, 2017  (WO) .................. PCT/JP2017/040651
Jan. 18, 2018  (WO) .................. PCT/JP2018/001467

(51) Int. Cl.
*H01L 21/67*          (2006.01)
*B29C 35/08*          (2006.01)
(Continued)

(52) U.S. Cl.
CPC .... *H01L 21/67144* (2013.01); *B29C 35/0805* (2013.01); *B29C 45/14065* (2013.01);
(Continued)

(58) Field of Classification Search
CPC ........ B29C 2035/0827; B29C 35/0805; B29C 35/0888; B29C 45/14065;
(Continued)

(56) References Cited

U.S. PATENT DOCUMENTS 5,692,292 A * 12/1997 Asai ................... H05K 13/0061
                                                         700/121
8,266,787 B2 *  9/2012 Oyama .............. H05K 13/0419
                                                          29/739

(Continued)

FOREIGN PATENT DOCUMENTS

JP    H10-135408 A    5/1998
JP    2002-252251 A   9/2002
(Continued)

OTHER PUBLICATIONS

Office Action dated Jun. 21, 2021, issued for the corresponding TW patent application No. 107104495.
(Continued)

*Primary Examiner* — Minh N Trinh
(74) *Attorney, Agent, or Firm* — Aslan Law, P.C.

(57) ABSTRACT

A component mounting system for mounting a component on a substrate, the mounting system comprising a component supplying unit configured to supply the component; a substrate holding unit configured to hold the substrate in an orientation such that a mounting face for mounting the component on the substrate is facing vertically downward; a head configured to hold the component from vertically below; and a head drive unit that, by causing vertically upward movement of the head holding the component, causes the head to approach the substrate holding unit to mount the component on the mounting face of the substrate.

26 Claims, 67 Drawing Sheets

(51) Int. Cl.

| | | |
|---|---|---|
| *B29C 45/14* | (2006.01) | |
| *H01L 21/02* | (2006.01) | |
| *H01L 21/56* | (2006.01) | |
| *H01L 21/677* | (2006.01) | |
| *H01L 21/68* | (2006.01) | |
| *H01L 21/683* | (2006.01) | |
| *H01L 21/66* | (2006.01) | |
| *H01L 23/544* | (2006.01) | |
| *H01L 23/00* | (2006.01) | |
| *H05K 13/04* | (2006.01) | |
| *B29L 31/34* | (2006.01) | |

(52) U.S. Cl.
CPC .. *B29C 45/14655* (2013.01); *H01L 21/02057* (2013.01); *H01L 21/565* (2013.01); *H01L 21/6715* (2013.01); *H01L 21/67017* (2013.01); *H01L 21/67051* (2013.01); *H01L 21/67098* (2013.01); *H01L 21/67259* (2013.01); *H01L 21/67742* (2013.01); *H01L 21/681* (2013.01); *H01L 21/6838* (2013.01); *H01L 22/12* (2013.01); *H01L 23/544* (2013.01); *H01L 24/75* (2013.01); *H01L 24/81* (2013.01); *H05K 13/0413* (2013.01); *B29C 2035/0827* (2013.01); *B29L 2031/3406* (2013.01); *H01L 2223/54426* (2013.01); *H01L 2224/7501* (2013.01); *H01L 2224/7565* (2013.01); *H01L 2224/75102* (2013.01); *H01L 2224/75745* (2013.01); *H01L 2224/75753* (2013.01); *H01L 2224/75843* (2013.01); *H01L 2224/8109* (2013.01); *H01L 2224/8113* (2013.01); *H01L 2224/81908* (2013.01); *H05K 13/0409* (2018.08)

(58) Field of Classification Search
CPC ....... B29C 45/14655; B29L 2031/3406; B81C 1/00; H01L 21/02057; H01L 21/565; H01L 21/67017
See application file for complete search history.

(56) References Cited

U.S. PATENT DOCUMENTS

| | | |
|---|---|---|
| 2004/0163242 A1 | 8/2004 | Fukunaga |
| 2009/0001133 A1 | 1/2009 | Kuramochi |
| 2010/0072665 A1 | 3/2010 | Imai et al. |
| 2010/0081224 A1 | 4/2010 | Yanagisawa |
| 2012/0127485 A1 | 5/2012 | Yamauchi |
| 2012/0171858 A1 | 7/2012 | Iwatsu |
| 2012/0291950 A1 | 11/2012 | Sugiyama et al. |
| 2014/0138875 A1 | 5/2014 | Torii et al. |
| 2015/0048523 A1 | 2/2015 | Suga et al. |
| 2016/0193759 A1 | 7/2016 | Hattori |
| 2020/0006099 A1* | 1/2020 | Yamauchi ............... H01L 24/81 |

FOREIGN PATENT DOCUMENTS

| | | |
|---|---|---|
| JP | 2004-140287 A | 5/2004 |
| JP | 2005-277009 A | 10/2005 |
| JP | 2006-351848 A | 12/2006 |
| JP | 2010-76300 A | 4/2010 |
| JP | 2010-080763 A | 4/2010 |
| JP | 2012-238775 A | 12/2012 |
| JP | 2013-038365 A | 2/2013 |
| JP | 2013-048249 A | 3/2013 |
| JP | 2015-008228 A | 1/2015 |
| JP | 2016-127167 A | 7/2016 |
| JP | 2016-152329 A | 8/2016 |
| KR | 10-2004-0020795 A | 8/2004 |
| KR | 10-2008-0114531 A | 12/2008 |
| KR | 10-1422401 B | 7/2014 |
| KR | 10-2015-0006845 A | 1/2015 |
| KR | 10-2015-0018405 A | 2/2015 |
| TW | 201131674 A | 9/2011 |
| WO | WO 2008/126312 A1 | 7/2010 |
| WO | WO 2011/033797 A | 3/2011 |
| WO | WO 2011/081095 A | 7/2011 |

OTHER PUBLICATIONS

Office Action dated Aug. 13, 2019, issued for the corresponding JP patent application No. 2018-567387 and the English translation.
Office Action dated Sep. 28, 2021, Japan, issued for the corresponding JP patent application No. 2020-042357, 4 pages.
Office Action dated Jan. 14, 2020, issued for the corresponding JP patent application No. 2018-567387 and the English translation.
Office Action dated Feb. 1, 2022, JPO, Japan, issued for the corresponding JP patent application No. 2019-188125 pp. 1-5, and the English translation.
Office Action dated Apr. 20, 2022, issued for the corresponding KR patent application No. 10-2019-7023767, Korea Intellectual Property Office, 17 pages.

* cited by examiner

COMPONENT MOUNTING SYSTEM

CROSS-REFERENCE TO RELATED APPLICATIONS

This application claims priority to JP Patent Application No. 2017-021953 filed on Feb. 9, 2017, and to PCT Application No. PCT/JP2018/003308 filed on Jan. 31, 2018, and to PCT Application No. PCT/JP2017/040651 filed on Nov. 10, 2017, and to PCT Application No. PCT/JP2018/001467 filed on Jan. 18, 2018, the entire contents of which are hereby incorporated by reference.

TECHNICAL FIELD

The present disclosure relates to a component mounting system, a resin shaping device, a resin placing device, a component mounting method, and a resin shaping method.

BACKGROUND ART

A component mounting system is proposed (for example, see Cited Reference 1) that is equipped with a stage for holding a substrate and a bonding unit disposed above the stage; after alignment of a chip relative to the substrate is performed by horizontal movement of a stage in a state in which the chip is held by a head of the bonding unit, the bonding unit is lowered, and the chip is mounted on the substrate (for example, see Patent Citation 1).

CITATION LIST

Patent Literature

Patent Literature 1: Unexamined Japanese Patent Application Kokai Publication No. 2012-238775

SUMMARY OF INVENTION

Technical Problem

However, according to the configuration described in Patent Literature 1, the components of the substrate are held by the stage in a state in which a mounting face for mounting the components is oriented upward. Thus if a particle generated by the bonding unit attaches to the substrate, a bonding failure may occur between the chip and the substrate. In this case, a malfunctioning product may occur due to the bonding failure between the chip and the substrate of the product in which the chip is mounted on the substrate.

Moreover, conventionally the mainstream type of bonding is bonding performed via bumps that are protruding electrodes so that a particle falling onto the inter-bump gap does not result in a problem for bonding. However, a substrate bonding technique termed "hybrid bonding" is beginning to be used in recent years for surface bonding between the substrate and a chip within bonding faces for which the electrode surfaces and the dielectric surfaces are the same. The hydrophilization-treated chip connecting face and substrate mounting face are directly bonded together by this substrate bonding method, and thus the bonded state between the chip and the substrate is greatly affected by a particle present on the mounting face of the substrate. For example, if even a single particle of about 1 μm diameter is present on the substrate, the resultant void has a range of the diameter of the circumference that is several mm. For bonding between substrates, mass production technology is established for bonding between substrates in an environment in which particle density is controlled. However, from the standpoint of improvement of chip yield, the chip-on-wafer (so-called "COW") method chip mounting system that selects non-defective chips is advantageous. Thus development of a chip mounting system having particle countermeasures is desirable.

In consideration of the aforementioned circumstances, an objective of the present disclosure is to provide a component mounting system, a resin shaping device, a resin placing device, a component mounting method, and a resin shaping method that suppress the generation of malfunctioning products.

Solution to Problem

In order to attain the aforementioned objective, the component mounting system according to the present disclosure is a component mounting system for mounting a component on a substrate and includes: a component supplying unit configured to supply the component, a substrate holding unit configured to hold the substrate in an orientation such that a mounting face for mounting the component on the substrate is facing vertically downward, a head configured to hold the component from vertically below, and a head drive unit that, by causing vertically upward movement of the head holding the component, causes the head to approach the substrate holding unit to mount the component on the mounting face of the substrate.

A resin shaping device according to another aspect of the present disclosure is a resin shaping device configured to cure a resin placed in a mold in a state in which the mold is pressed against a substrate. The resin shaping device includes: a substrate holding unit configured to hold the substrate in an orientation such that a forming face for forming a resin part on the substrate faces vertically downward; a head configured to hold the mold from vertically below; a head drive unit configured to cause the head to face a position for formation of a resin part on the substrate, and then cause vertically upward movement of the head so that the head approaches the substrate holding unit and presses the mold from vertically below the substrate; and a resin curing unit configured to cure the resin placed in the mold in a state in which the mold is pressed against the substrate.

A resin placing device according to another aspect of the present disclosure is a resin placing device for placing a resin in a mold. The resin placing device includes: a chamber within which the mold is disposed; a vacuum source configured to raise a degree of vacuum within the chamber by evacuating gas present within the chamber; a resin dispensing unit configured to dispense the resin into the mold; and a mold heating unit configured to, after dispensing of the resin into the mold in the state of increased degree of vacuum of the chamber due to the vacuum source, when a periphery of the mold is an atmospheric pressure environment, raise temperature of the resin placed in the mold by heating the mold.

A component mounting method according to another aspect of the present disclosure is a component mounting method for mounting a component on a substrate. The component mounting method includes: a component supplying step in which a component supplying unit supplies the component; a substrate holding step in which the substrate holding unit holds the substrate in an orientation such that a mounting face for mounting the component on the substrate faces vertically downward; a component holding step in which a head holds the component from vertically below; and a component mounting step of mounting the component on the mounting face of the substrate by causing the head and the substrate holding unit to approach each other.

A resin shaping method according to another aspect of the present disclosure is a resin shaping method in which a resin placed in a mold is cured in a state in which the mold is pressed against a substrate. The resin shaping method includes: a substrate holding step in which a substrate holding unit holds the substrate in an orientation such that a forming face for forming a resin part on the substrate faces vertically downward; a mold holding step in which a head holds the mold from vertically below; a mold pressing step in which a head drive unit causes the head to face a position for formation of the resin part on the substrate and causes the head and the substrate holding unit to approach each other, and then presses the mold from vertically below the substrate; and a resin curing step in which a resin curing unit, in a state in which the mold is pressed against the substrate, cures the resin placed in the mold.

Advantageous Effects of Invention

According to the component mounting system of the present disclosure, the substrate holding unit holds the substrate in an orientation such that the mounting face for mounting of the component on the substrate faces vertically downward, and the head drive unit causes vertically downward movement of the head holding the component, thereby positioning the head near the substrate holding unit and mounting the component on the mounting face of the substrate. Such configuration enables lowering of the accumulation of particles on the mounting face of the substrate, and thus enables suppression of the occurrence of bonding failures between the component and the substrate. Thus in products in which the component is mounted on the substrate, the occurrence of malfunctioning products due to failure of bonding between the chip and the substrate is suppressed. In particular, such configuration is suitable for so-called chip-on-wafer processing that mounts multiple components on a single substrate.

Moreover, according to the resin shaping device according to the present disclosure, the substrate holding unit holds the substrate in an orientation such that the forming face for forming the resin part on the substrate faces vertically downward. Moreover, by pressing the head against the position for formation of the resin part on the substrate and moving the head vertically upward, the head drive unit causes the head to approach the substrate holding unit, and then presses the mold. Then the resin curing unit, in the state in which the mold is pressed against the resin part, cures the resin placed in the mold. Such operation enables a lowering of the accumulation of particles on the forming face of the substrate on which the resin part is formed, and thus particle contamination of the interface between the resin part and the substrate can be suppressed. Thus for products produced by forming the resin part on the substrate, the occurrence of malfunctioning products due to particle contamination of the interface between the resin part and the substrate is suppressed. In particular, such configuration is suitable for performing resin forming by the so-called step-and-repeat method that forms multiple resin parts on a single substrate.

DESCRIPTION OF EMBODIMENTS

Embodiment 1

A chip mounting system that is a component mounting system according to an embodiment of the present disclosure is described below with respect to drawings.

The chip mounting system according to the present embodiment is a device for mounting an electronic component on a substrate. The electronic component, for example, is a semiconductor chip (referred to hereinafter simply as a "chip") supplied from a diced substrate. This mounting system performs activation processing of a surface of the substrate on which the chip is mounted and a connecting face of the electronic component, and thereafter causes contact between the chip and the substrate and presses the chip against the substrate to mount the substrate on the chip.

Figure 1:
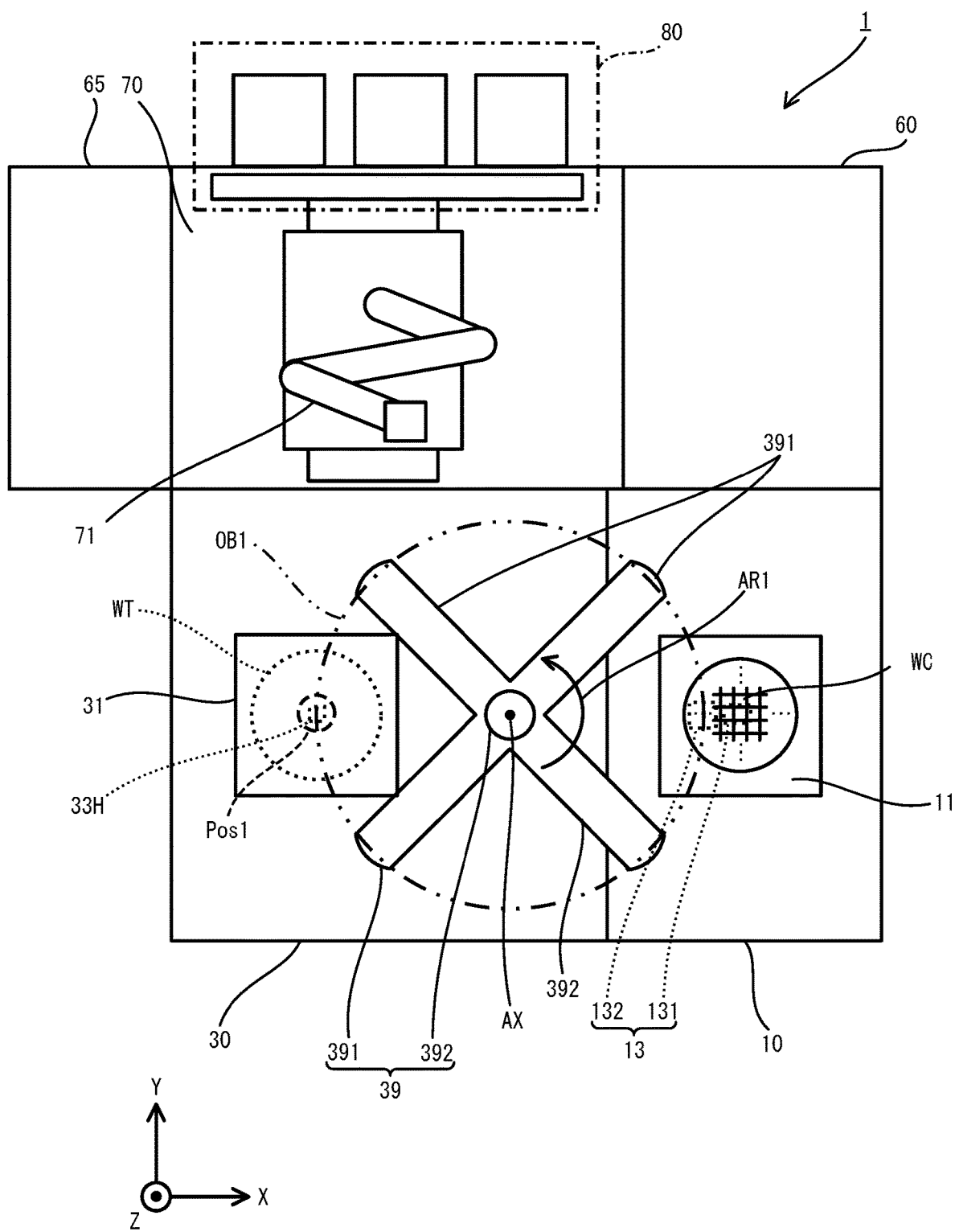
FIG. 1 is schematic configuration view of a component mounting system according to Embodiment 1 of the present disclosure.
Figure 2:
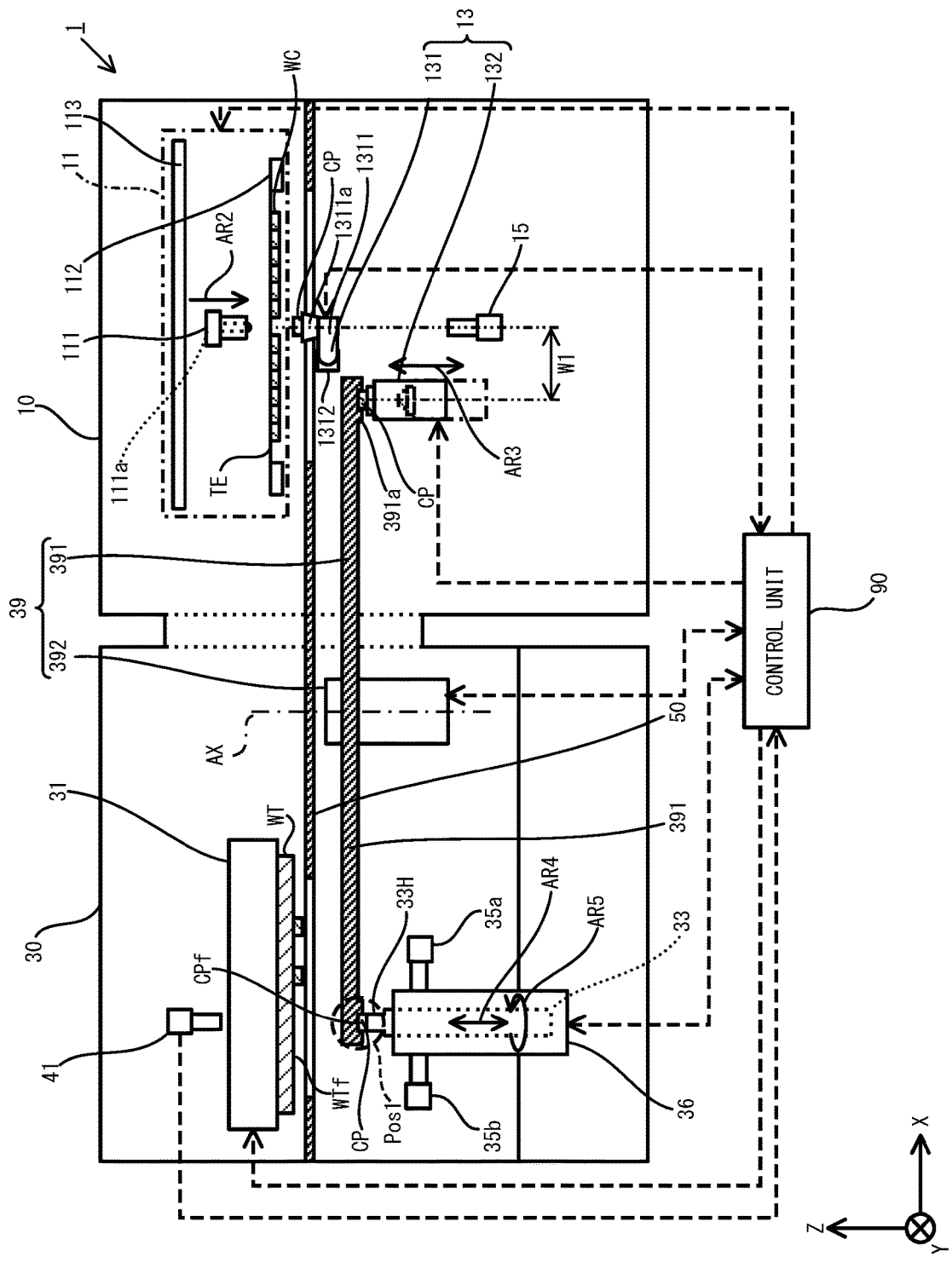
FIG. 2 is a schematic configuration view of the component mounting system according to Embodiment 1 as viewed from the side.

As illustrated in FIGS. 1 and 2, a chip mounting system 1 according to the present embodiment is equipped with a chip supplying device 10, a bonding device 30, a cover 50, a hydrophilization treating device 60, a water washing unit 65, a conveying device 70, a loading-unloading unit 80, and a control unit 90. The chip supplying device 10 dices a substrate WC, takes a chip CP from the diced substrate WC, and supplies the chip CP to the bonding device 30. Here, the term "dicing" refers to processing to make chips by longitudinal direction and lateral direction slicing of the substrate WC on which multiple electronic components are formed. As illustrated in FIG. 2, the chip supplying device 10 has a chip supplying unit (component supplying unit) 11, a chip transferring unit 13, and a supply chip imaging unit 15.

The chip supplying unit 11 supplies the chip CP to the bonding device 30. The chip supplying unit 11 has a tape holding part (sheet holding unit) 112 for holding a dicing tape (sheet) TE attached to the diced substrate (dicing substrate) WC and a picking mechanism 111 for picking in a vertically downward direction the chip CP formed in the substrate WC. Moreover, the chip supplying unit 11 has a tape holding part drive unit 113 for driving the tape holding part 112 in an XY direction, or for causing rotation of such around a Z axis. The tape holding part 112 holds the substrate WC to which the dicing tape TE is attached in an orientation such that the dicing tape TE is positioned at the vertically upward (+Z direction) side of the substrate WC. That is to say, the tape holding part 112 holds the dicing tape TE under conditions such that the surface of attachment of the dicing tape TE to the substrate WC is downwardly directed. The picking mechanism 111 has a needle 111a, and by protrusion of the needle 111a in the vertically downward direction (−Z direction) from vertically above (+Z direction) the dicing tape TE as illustrated by arrow AR2 in FIG. 2, pushes the chip CP to supply the chip vertically downward (−Z direction). Then each of the chips CP formed in the substrate WC to which the dicing tape TE is attached is pushed downward one at a time by the needle 111a of the chip supplying unit 11 to be delivered to the chip transferring unit 13. Due to the tape holding part drive unit 113 driving the tape holding part 112 in the XY direction or in rotation around the Z axis, the position and orientation of the substrate WC are changed.

The chip transferring unit 13 has a chip inverting unit (component inverting unit) 131 for vertical direction inverting of the chip CP delivered from the chip supplying unit 11 and a chip delivering unit (component delivering unit) 132 for delivering the chip CP received from the chip inverting unit 131 to the chip conveying unit 39. The chip inverting unit 131 causes vertical direction inversion of the chip CP supplied from the chip supplying unit 11. The chip inverting unit 131 has an L-shaped arm 1311 provided at a distal part with a suction part 1311a and an arm drive unit 1312 for rotating the arm 1311. The distal part of the arm 1311 has a non-illustrated protrusion part protruding to the periphery of the suction part 1311a. The distal part of the arm 1311 holds an upper surface side of the chip CP under conditions in which a connecting face CPf side for bonding of the chip CP to the substrate WT faces vertically upward (+Z direction). Then under conditions by which a distal part of the protrusion part is made by the distal part of the arm 1311 to abut against a peripheral part of the chip CP, the chip CP is held by suction of the suction part 1311a.

The chip delivering unit 132 receives, and passes to the chip conveying unit 39, the vertically inverted chip CP from the chip inverting unit 131. As indicated by arrow AR3 in FIG. 2, the chip delivering unit 132 has a suction part 1311a at the distal part (upper end part) thereof that moves in the vertical direction. This chip delivering unit 132 waits at a standby position below the distal part of the arm 1311 under conditions in which the distal part of the arm 1311 of the arm of the chip inverting unit 131 is downwardly directed. The position of the chip delivering unit 132 in the direction (X axis direction) perpendicular to the vertical direction (Z direction) is displaced by a distance W1 from the position of the suction part 1311a in a state in which the suction part 1311a of the chip inverting unit 131 is facing vertically upward. Further, depending on the dimensions of the substrate WT and/or the diced substrate WC, the X axis direction distance between the chip supplying unit 11 and the head 33H is sometimes long in comparison of the X axis direction movement distance that is attainable by the chip inverting unit 131 and the chip conveying unit 39. In this case, a configuration may be used by which the chip delivering unit 132 moves in the X axis direction so that the chip CP is delivered to a distal part of a plate 391 of the chip conveying unit 39. Such configuration enables responding even when the diameter of the diced substrate WC is increased to a certain degree.

The supply chip imaging unit 15 is disposed below (−Z direction) the chip supplying unit 11 of the chip supplying device 10. Under conditions in which the arm 1311 of the chip inverting unit 131 is oriented such that the suction part 1311a points in the Z direction, that is, such that the suction part 1311a is not located at an optical axis of the supply chip imaging unit 15, the supply chip imaging unit 15 images the chip CP included in the substrate WC.

The distal part of the arm 1311 points toward the chip supplying unit 11 side (upper side) so that the chip inverting unit 131 by the suction part 1311a attaches to and receives the chip CP pushed out by the needle 111a of the chip supplying unit 11. Under conditions by which the chip CP is attached by suction to the distal part of the arm 311, then the chip inverting unit 131 rotates the arm 1311 by the arm drive unit 1312 so that the distal part of the arm 1311 is downwardly directed. However, the chip delivering unit 132 moves upward from the standby position to receive the chip CP attached by suction to the distal part of the arm 1311. Moreover, after delivery of the chip CP to the chip delivering unit 132, the chip inverting unit 131 rotates the arm 1311 to arrange the distal part of the arm 1311 in an upwardly directed state.

Figure 3:
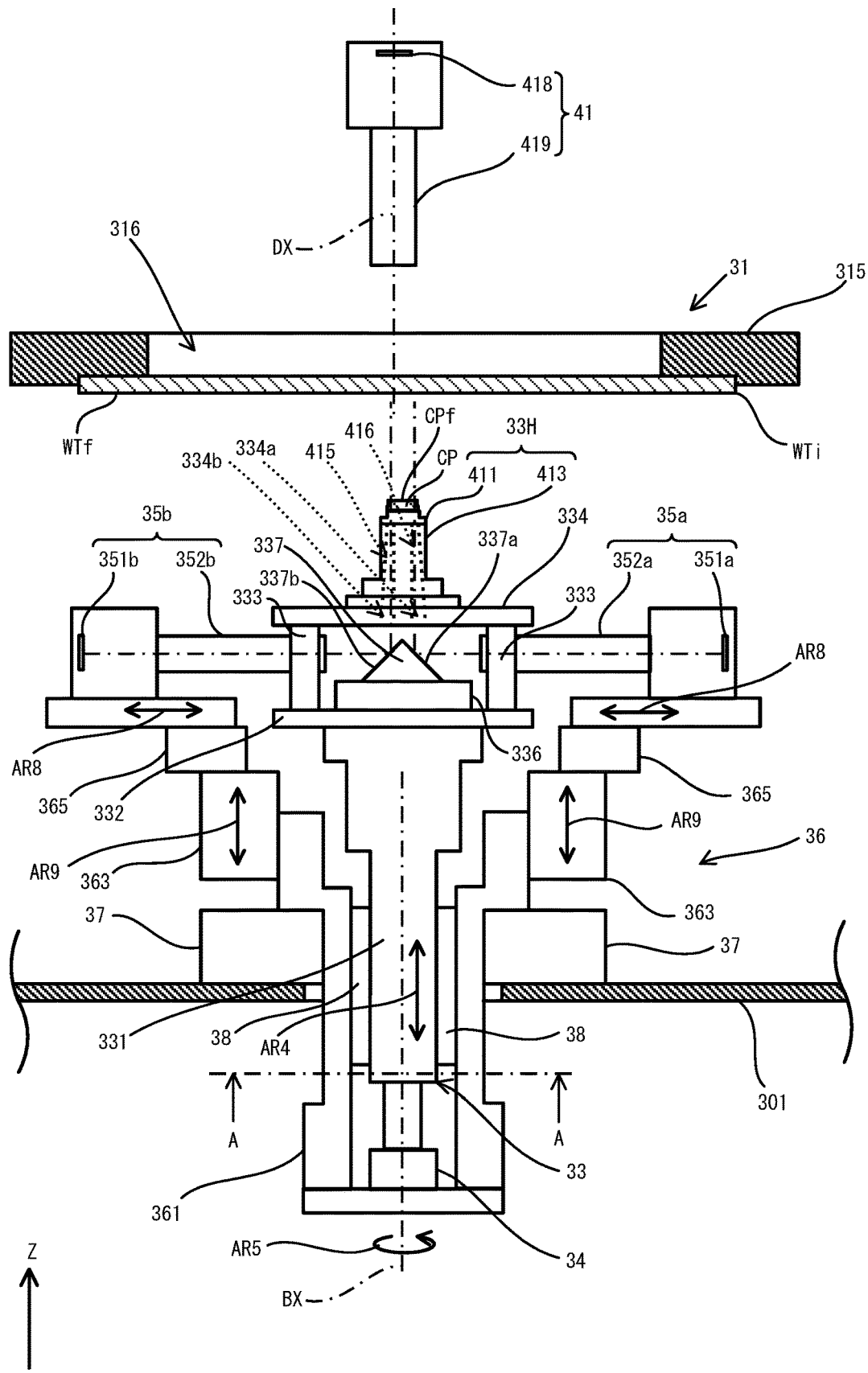
FIG. 3 is a schematic configuration view of a bonding device according to Embodiment 1.

As illustrated in FIG. 3, the bonding device 30 has a stage (substrate holding unit) 31, a bonding unit 33 having a head 33H, a head drive unit 36 for driving the head 33H, first imaging units 35a and 35b, a second imaging unit 41, a camera F direction drive unit 365, and a camera Z direction drive unit 363. A so-called chip mounter, formed by the bonding unit 33 and the head drive unit 36, places the chip CP upon the substrate WT. Moreover, the bonding device 30 further has a chip conveying unit (component conveying unit) 39 for conveying the chip CP supplied from the chip supplying device 10 to the head 33H. As illustrated in FIG. 3, the bonding unit 33 has a Z direction movement member 331, a first disc member 332, a piezo actuator (component orientation adjusting unit) 333, a second disc member 334, a mirror-fixing member 336, a mirror 337, and a head 33H.

The first disc member 332 is fixed to an upper tip part of the Z direction movement member 331. Moreover, the second disc member 334 is disposed at the upper side of the first disc member 332. The first disc member 332 and the second disc member 334 are interconnected via a piezo actuator 333. Further, the head 33H is fixed to an upper surface side of the second disc member 334. The head 33H holds the chip CP by suction attachment.

Figure 4:
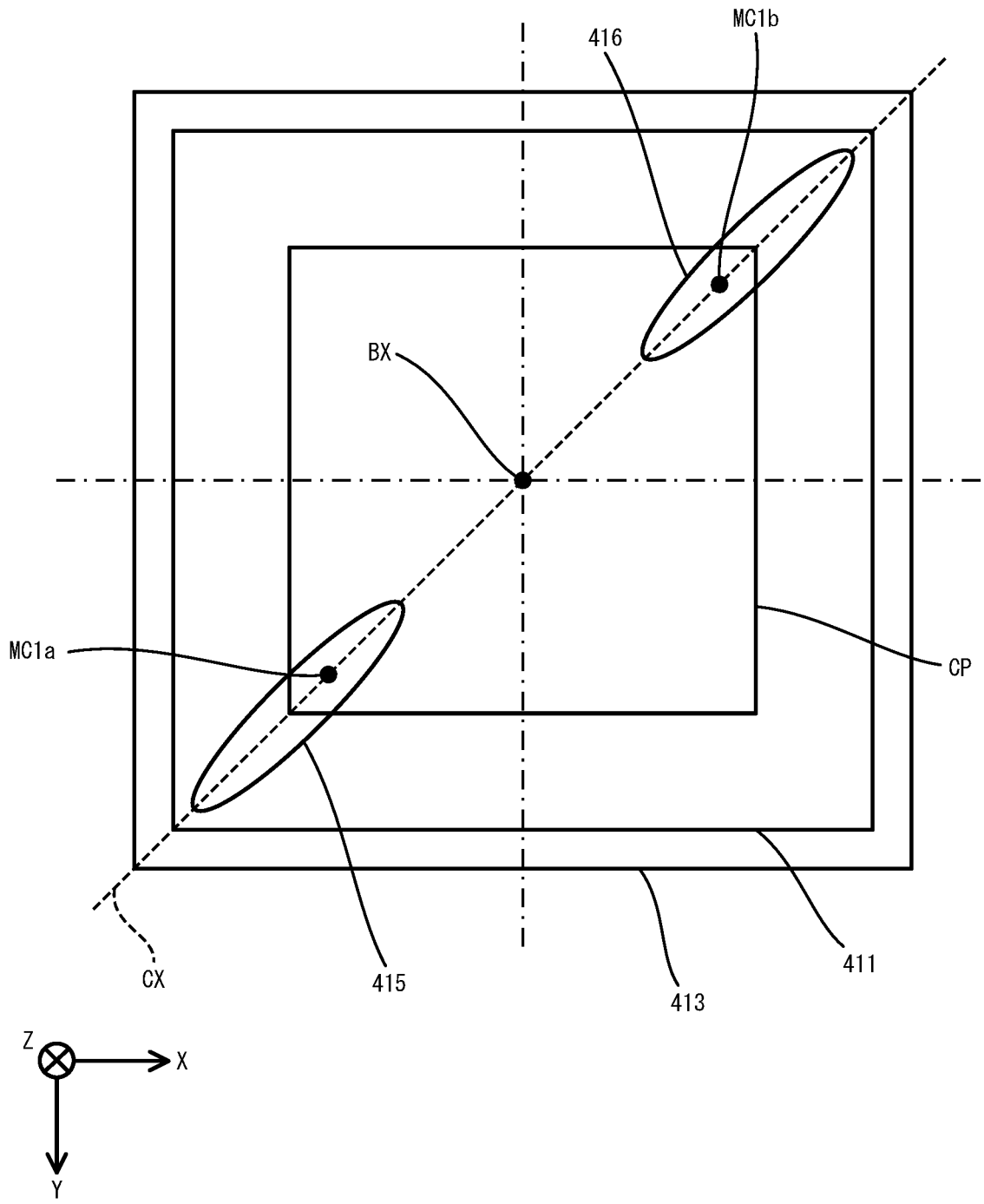
FIG. 4 is a drawing illustrating positional relationships between a hollow part of a head and an alignment mark of a chip according to Embodiment 1.

The head 33H holds the chip CP from the vertically downward direction (−Z direction). The head 33H has a chip tool 411 and a head main unit 413. The chip tool 411 is formed from a material such as silicon (Si) that transmits imaging light such as infrared light. Moreover, the head main unit 413 contains components such as a ceramic heater or coil heater. The head main unit 413 is provided with hollow parts 415 and 416 for allowing transmission (passage) of projected light. Each of the hollow parts 415 and 416 is a transmission part for transmission of the projected light, and is provided so as to penetrate in the vertical direction (Z direction) of the head main unit 413. Moreover, as illustrated in FIG. 4, each of the hollow parts 415 and 416 has an ellipsoidal shape as viewed from the upper surface. The two hollow parts 415 and 416 are disposed symmetrically relative to the center of an axis BX at opposing corner parts of the head main unit 413 that has an approximately square shape in plan view. Further, holes 334*a* and 334*b* are provided at parts corresponding to the hollow parts 415 and 416 in the second disc member 334 to allow transmission of the projected light.

Figure 5A:
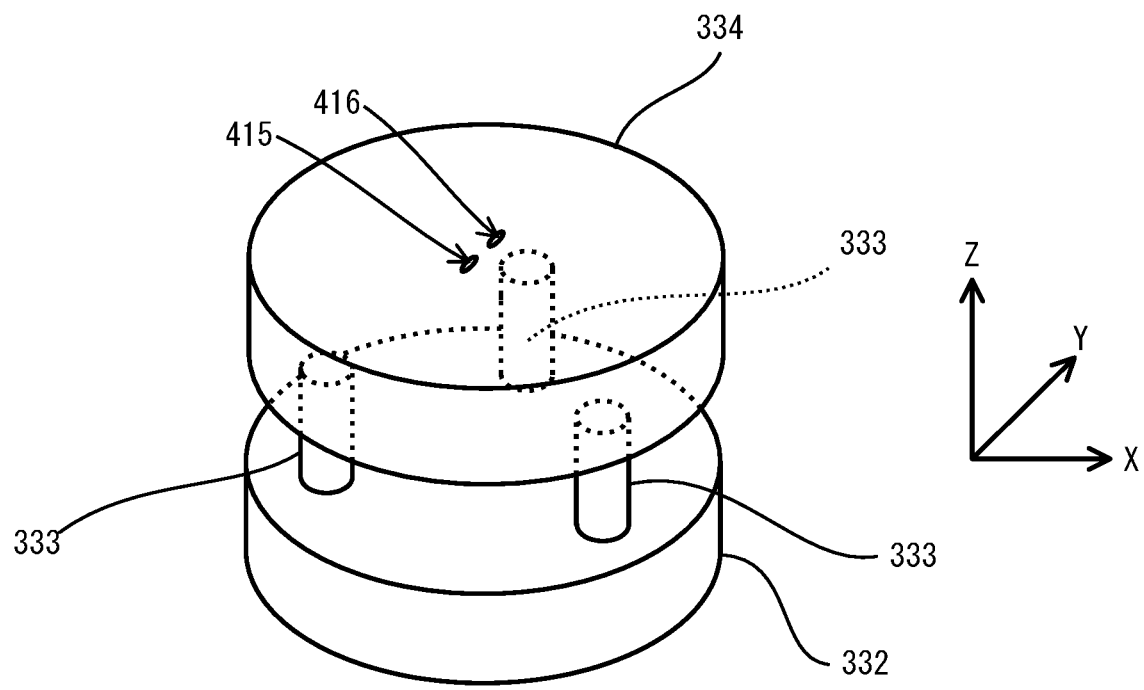
FIG. 5A is a schematic perspective view illustrating part of a bonding unit according to Embodiment 1.

The piezo actuator 333 adjusts at least one of a distance between a mounting face WTf of the substrate WT and a connecting face CPf of the chip CP, or a tilt of the chip CP relative to the mounting face WTf of the substrate WT. As illustrated in FIG. 5A, three of the piezo actuators 333 are present between the first disc member 332 and the second disc member 334, and each of these is capable of stretching and contracting in the Z direction. A tilt angle of the second disc member 334, and thus of the head 33H, relative to a horizontal plane is adjusted by control of the extent of stretching and contracting of each of the three piezo actuators 333. Further, at least one of a distance between the connecting face CPf of the chip CP held by the head 33H and the mounting face WTf of the substrate WT or a tilt of the connecting face CPf of the chip CP held by the head 33H relative to the mounting face WTf of the substrate WT is adjusted. Further, the three piezo actuators 333 are disposed at positions (planar positions) that are not irradiated with the irradiation light, including reflected light, of the first imaging units 35*a* and 35*b*.

The mirror 337 is fixed to the first disc member 332 via the mirror-fixing member 336 and is disposed in a gap between the first disc member 332 and the second disc member 334. The mirror 337 has inclined surfaces 337*a* and 337*b* having tilt angles downwardly tilting by 45°. Imaging light entering the inclined surfaces 337*a* and 337*b* of the mirror 337 from the first imaging units 35*a* and 35*b* is reflected upward.

The head drive unit 36, by upward vertical movement (+Z direction) of the head 33H holding the chip CP delivered to a receiving position Pos1 (see FIG. 2), causes the head 33H to approach the stage 31 so as to mount the chip CP on the mounting face WTf of the substrate WT. More specifically, the head drive unit 36, by vertically upward movement (+Z direction) of the head 33H holding the chip CP, causes the head 33H to approach the stage 31 so that the chip CP is made to contact the mounting face WTf of the substrate WT and surface bond to the substrate WT. Here, as described below, the mounting face WTf of the substrate WT and the connecting face CPf of the chip CP for bonding with the mounting face WTf are hydrophilized, for example, by the hydrophilization treating device 60. Thus the chip CP is bonded to the substrate WT by causing the connecting face CPf of the chip CP to contact the mounting face WTf of the substrate WT. Further, the connecting face CPf of the chip CP may be a face on which a flat metal electrode is exposed, for example.

The head drive unit 36 has a Z direction drive unit 34, a rotation member 361, and a θ direction drive unit 37. The Z direction drive unit 34 has components such as a servomotor and a ball screw. The Z direction drive unit 34 is provided at a bottom-tip side of the below-described rotation member 361, and as indicated by arrow AR4 in FIG. 2, drives the Z direction movement member 331 of the bonding unit 33 in the Z direction. The Z direction drive unit 34 moves the Z direction movement member 331 in the Z direction, and together with such movement, moves the head 33H provided at the upper tip part of the bonding unit 33 in the Z direction. That is to say, the Z direction drive unit 34 drives the head 33H in the Z direction.

Figure 5B:
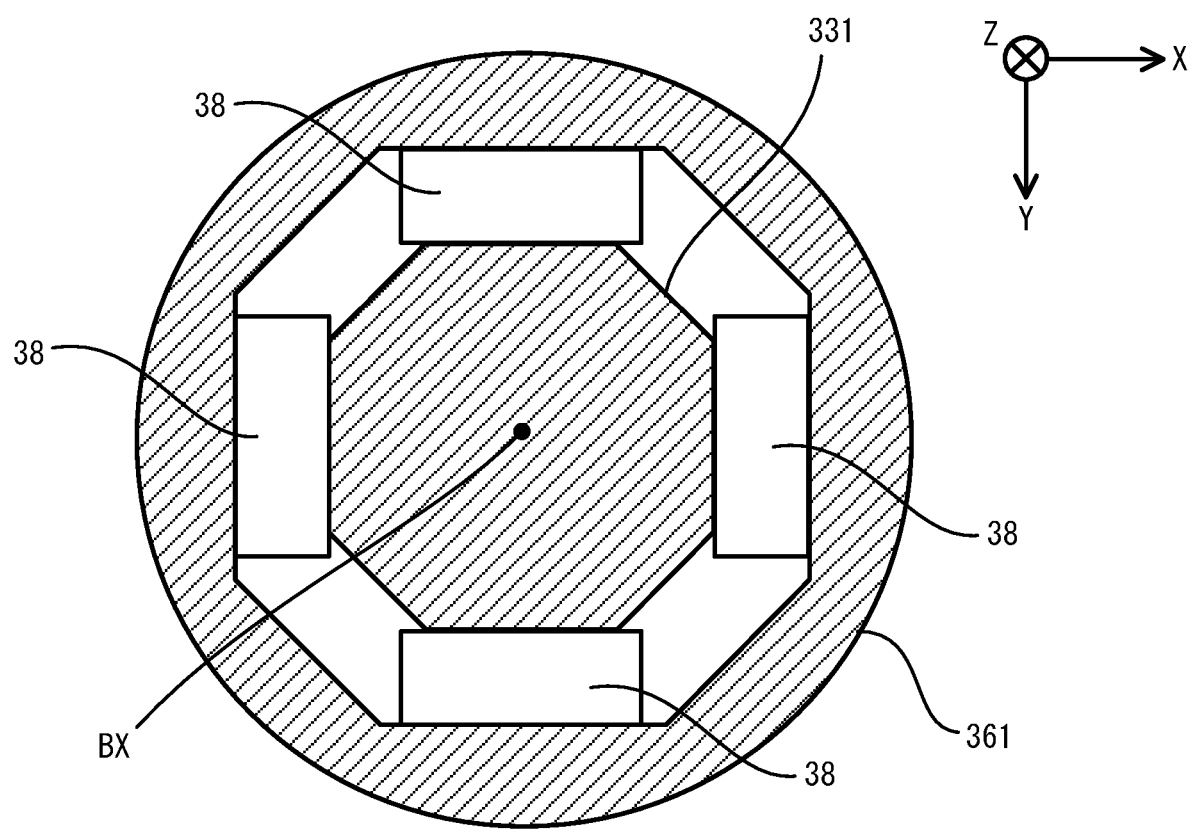
FIG. 5B is a cross-sectional drawing taken along line A-A of FIG. 3 of the bonding device according to Embodiment 1.

The rotation member 361 is cylindrical, and as illustrated in FIG. 5B, cross-sectional shape of the interior hollow part is octagonal. The Z direction movement member 331 has a bar-like part that has an octagonal cross-sectional shape and is inserted into the rotation member 361. Moreover, between the inner surfaces of the rotation member 361 and four side surfaces among the eight side surfaces of the Z direction movement member 331, the Z direction movement member 331 is provided with linear guides 38 that are shaped to allow sliding of the rotation member 361 in the Z direction. Upon rotation of the rotation member 361 around the rotation axis BX, rotation of the Z direction movement member 331 and the rotation member 361 rotate in a linked manner. That is to say, the bonding unit 33 and the rotation member 361 rotate in a linked manner around the rotation axis BX as indicated by arrow AR5 in FIG. 2.

As illustrated in FIG. 3, the θ direction drive unit 37 has components such as a servomotor and a reduction gear, and is fixed to a fixing member 301 provided within the bonding device 30. The rotation member 361 is supported by the θ direction drive unit 37 in a manner that enables rotation around the axis BX. Further, the θ direction drive unit 37 rotates the rotation member 361 around the rotation axis BX in response to a control signal input from the control unit 90.

In a state in which the chip CP is disposed at a position for mounting the chip CP on the substrate WT, the first imaging units 35*a* and 35*b* image alignment marks (first alignment marks) MC1*a* and MC1*b* of the chip CP as illustrated in FIG. 4 from the direction (−Z direction) vertically below the chip CP. As illustrated in FIG. 3, the first imaging unit 35*a* is fixed to the rotation member 361 via the camera Z direction drive unit 363 and the camera F direction drive unit 365. The first imaging unit 35*b* is also fixed to the rotation member 361 via the camera Z direction drive unit 363 and the camera F direction drive unit 365. Due to such configuration, the first imaging units 35*a* and 35*b* rotate together with the rotation member 361. Here, as described above, the mirror 337 is fixed to the Z direction movement member 331, and the rotation member 361 and the Z direction movement member 331 rotate in a linked manner. Therefore, the relative positional relationships between the mirror 337 and the first imaging units 35*a* and 35*b* are unchanged, and thus the imaging light reflected from the mirror 337 is guided to the first imaging units 35*a* and 35*b* irrespective of rotation operation of the rotation member 361.

The first imaging units 35*a* and 35*b* acquire image data that includes images of below described alignment marks MC1*a* and MC1*b* provided on the chip CP and images of below described alignment marks MC2*a* and MC2*b* provided on the substrate WT. The control unit 90, on the basis of the image data acquired by the first imaging units 35*a* and 35*b*, recognizes relative positions of the substrate WT for each chip CP in directions parallel to the surface of the substrate WT for mounting the chip CP. The first imaging units 35*a* and 35*b* have respectively non-illustrated coaxial illumination systems coaxial with the image sensors 351*a* and 351*b* and the optical systems 352*a* and 352*b*. Each of the first imaging units 35*a* and 35*b* acquires image data relating to reflected light of the illumination light, such as infrared light, output from a non-illustrated light source of the coaxial illumination system. Further, the illumination light output in the horizontal direction from the coaxial illumination systems of the first imaging units 35*a* and 35*b* is reflected by the inclined surfaces 337*a* and 337*b* of the mirror 337, and thus the traveling direction of such light is changed to the vertically upward direction. Then the light reflected by the mirror 337 progresses toward imaging target parts that include the chip CP held by the head 33H and the substrate WT disposed facing the chip CP, and is reflected by each imaging target part. The below-described alignment marks MC1*a* and MC1*b* are provided at the imaging target parts of the chip CP, and the below-described alignment marks MC2*a* and MC2*b* are provided at the imaging target parts of the substrate WT. The reflected light reflected respectively from the imaging target parts of the chip CP and the substrate WT, progresses in the vertically downward direction, and then is reflected again by the inclined surfaces 337*a* and 337*b* of the mirror 337, and has the traveling direction of the light changed to the horizontal direction so as to arrive at the first imaging units 35*a* and 35*b*. Due to such operation, the first imaging units 35*a* and 35*b* acquire respectively the image data of the imaging target parts of the chip CP and the substrate WT.

Here, hollow parts 415 and 416 of the head 33H rotation around the BX axis in a manner linked to the rotation of the rotation member 361. For example, as illustrated in FIG. 4, the alignment marks MC1*a* and MC1*b* are taken to be provided respectively at angles so that the marks oppose each other and sandwich the center of a square-shaped chip CP therebetween. In this case, when the first imaging units 35*a* and 35*b* are positioned on a diagonal line interconnecting two corners where the alignment marks MC1*a* and MC1*b* of the chip CP are provided, imaging data of the alignment marks MC1*a* and MC1*b* can be acquired by the first imaging units 35*a* and 35*b* via the hollow parts 415 and 416.

As illustrated by arrow AR8 in FIG. 3, the camera F direction drive unit 365 adjusts focal point positions of the first imaging units 35*a* and 35*b* by driving the first imaging units 35*a* and 35*b* in the focal directions.

As indicated by arrow AR9 in FIG. 3, the camera Z direction drive unit 363 drives the first imaging units 35*a* and 35*b* in the Z direction. The camera Z direction drive unit 363 usually moves the first imaging units 35*a* and 35*b* such that movement amounts of the Z direction movement member 331 in the Z axis direction are the same for the first imaging units 35*a* and 35*b*. Due to such operation, when the head 33H moves in the Z axis direction, the imaging target parts of the first imaging units 35*a* and 35*b* are unchanged before and after movement. However, sometimes the camera Z direction drive unit 363 moves the first imaging units 35*a* and 35*b* such that the Z axis direction movement amounts of the first imaging units 35*a* and 35*b* differ from the Z axis direction movement amount of the Z direction movement member 331. In this case, due to change in the relative positions of each of the first imaging units 35*a* and 35*b* relative to the mirror 337 in the Z axis direction, the imaging target parts on the chip CP and the substrate WT imaged by the first imaging units 35*a* and 35*b* change.

Figure 6A:
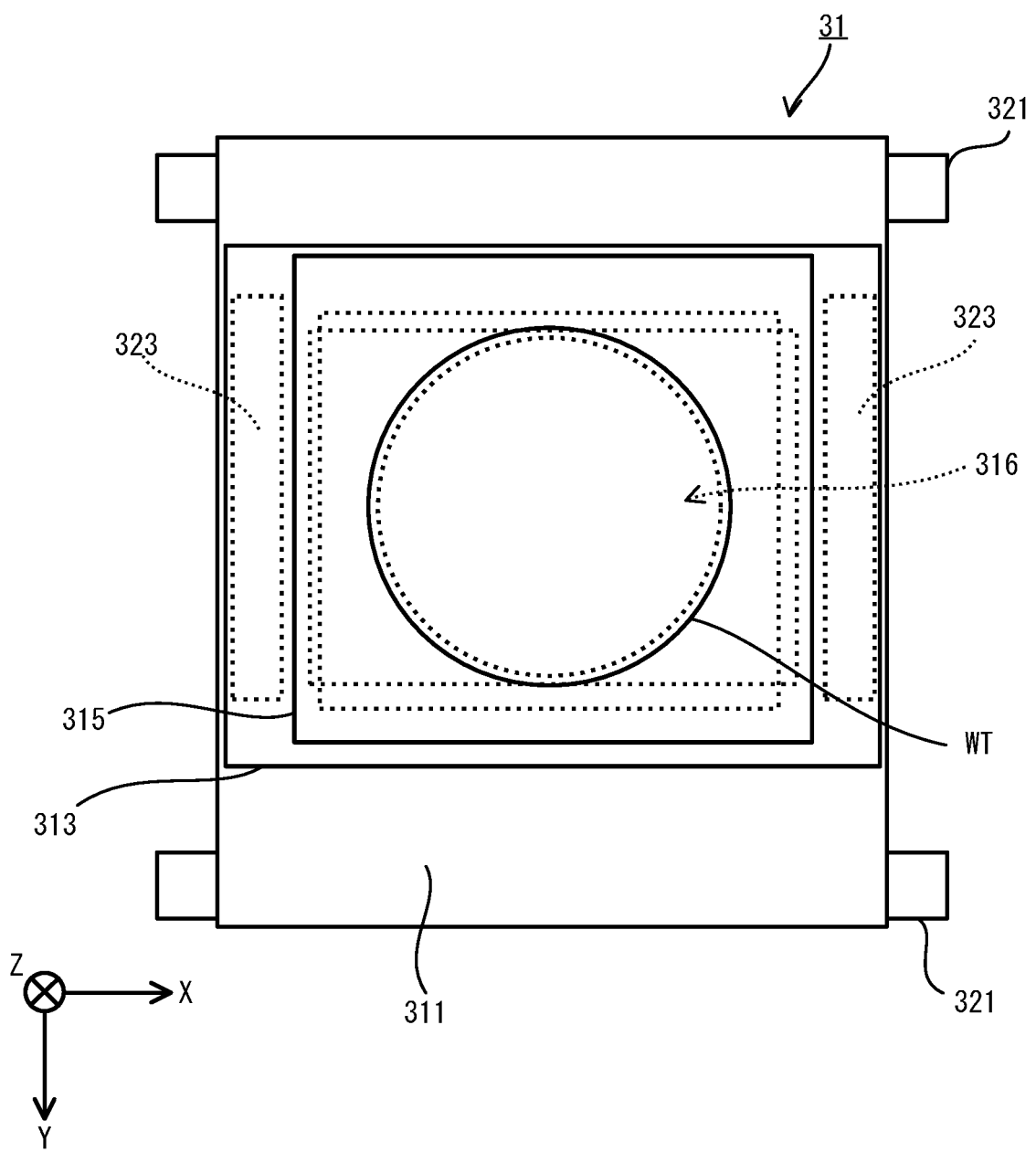
FIG. 6A is a plan view of a stage according to Embodiment 1.
Figure 6B:
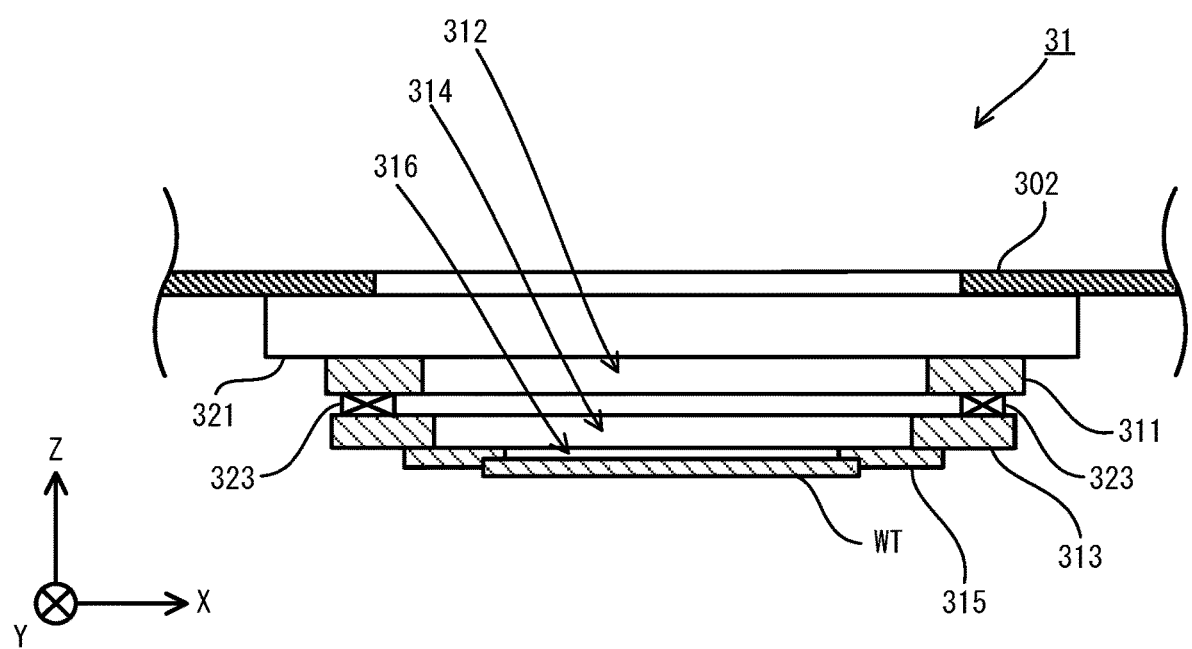
FIG. 6B is a side view of the stage according to Embodiment 1.

The stage 31 holds the substrate WT in an orientation such that the mounting face WTf of the substrate WT for mounting of the chip CP faces vertically downward (−Z direction). The stage 31 can move in the X direction, Y direction, and rotational direction. Due to such movement, the relative positional relationship between the bonding unit 33 and the stage 31 can be changed, and the mounting position of each chip CP on the substrate WT can be adjusted. As illustrated in FIGS. 6A and 6B, the stage 31 has an X direction moving unit 311, a Y direction moving unit 313, a substrate placing unit 315, an X direction drive unit 321, and a Y direction drive unit 323. The X direction moving unit 311 is fixed to a base member 302 of the bonding device 30 via two of the X direction drive units 321. Each of the two X direction drive units 321 extends in the X direction, and the units are disposed separately from each other in the Y direction. The X direction drive unit 321 has a linear motor and a slide rail, and the X direction moving unit 311 causes X direction movement relative to the fixing member 301.

The Y direction moving unit 313 is disposed below (−Z direction) the X direction moving unit 311 with two Y direction drive units 323 therebetween. Each of the two Y direction drive units 323 extends in the Y direction, and the units are disposed separately from each other in the X direction. The Y direction drive unit 323 has a linear motor and a slide rail, and the Y direction moving unit 313 causes Y direction movement relative to the X direction moving unit 311. The substrate placing unit 315 is fixed to the Y direction moving unit 313. The substrate placing unit 315 moves in the X direction and the Y direction in accordance with movement of the X direction drive unit 321 and the Y direction drive unit 323. Moreover, an opening part 312 having a rectangle shape in plan view is provided in the central part of the X direction moving unit 311, and an opening part 314 having a rectangle shape in plan view is provided in the central part of the Y direction moving unit 313. An opening part 316 having a rectangle shape in plan view is provided in the central part of the substrate placing unit 315. Further, the marks on the substrate WT can be recognized by an infrared transmission camera 41 via these opening parts 312, 314, and 316. Moreover, due to disposal of a non-illustrated infrared irradiation part, the substrate WT can be irradiated with infrared radiation so that the substrate WT is heated.

The chip conveying unit (also referred to as the "turret") 39 conveys the chip CP supplied from the chip supplying unit 11 to the receiving position Pos1 for the head 33H to receive the chip CP. As illustrated in FIG. 1, the chip conveying unit 39 has an even number of plates 391 (four in FIG. 1) and a plate drive unit 392 that rotationally drives the plates 391 simultaneously. As illustrated in FIG. 2, each of the even number of plates 391 is provided at one end part with a chip holding unit (component holding unit) 391*a* for holding a chip CP, and the end part rotates around the other end part (axis AX) between the chip supplying unit 11 and the head 33H. Each plate 391 is a thin plate of, for example, a few mm thickness, preferably 1 mm to 2 mm or less thickness. Moreover, in plan view, the plates 391 are disposed equidistantly from each other centered on the axis AX. The number of plates 391 is not limited to four, and may be an even number greater than or equal to six. The chip holding unit 391*a* for suction attachment of the chip CP is provided at the tip part of the plate 391. The chip delivering unit 132 and the bonding unit 33 of the head 33H are disposed at positions that overlap in the Z direction with an orbit OB1 traced out by the chip holding unit 391*a* during rotation of the plate 391. Upon receiving the chip CP from the chip delivering unit 132, as indicated by arrow AR1 of FIG. 1, the chip conveying unit 39 rotates around the central axis AX so as to convey the chip CP to the receiving position Pos1 that overlaps the head 33H within the bonding device

30. However, as illustrated in FIG. 2, the position of the chip delivering unit 132 in the X axis direction is displaced by a distance W1 from the position of the chip inverting unit 131 receiving the chip CP from the chip supplying unit 11. Thus the position of the chip delivering unit 132 receiving the chip CP from the chip inverting unit 131 is displaced by the distance W1 to the axis AX side (−X direction) from the position of the chip inverting unit 131 receiving the chip CP from the chip supplying unit 11. Thus, the length of the plate 391 can be shortened by the length W1, thereby enabling size reduction of the chip conveying unit 39.

Figure 7:
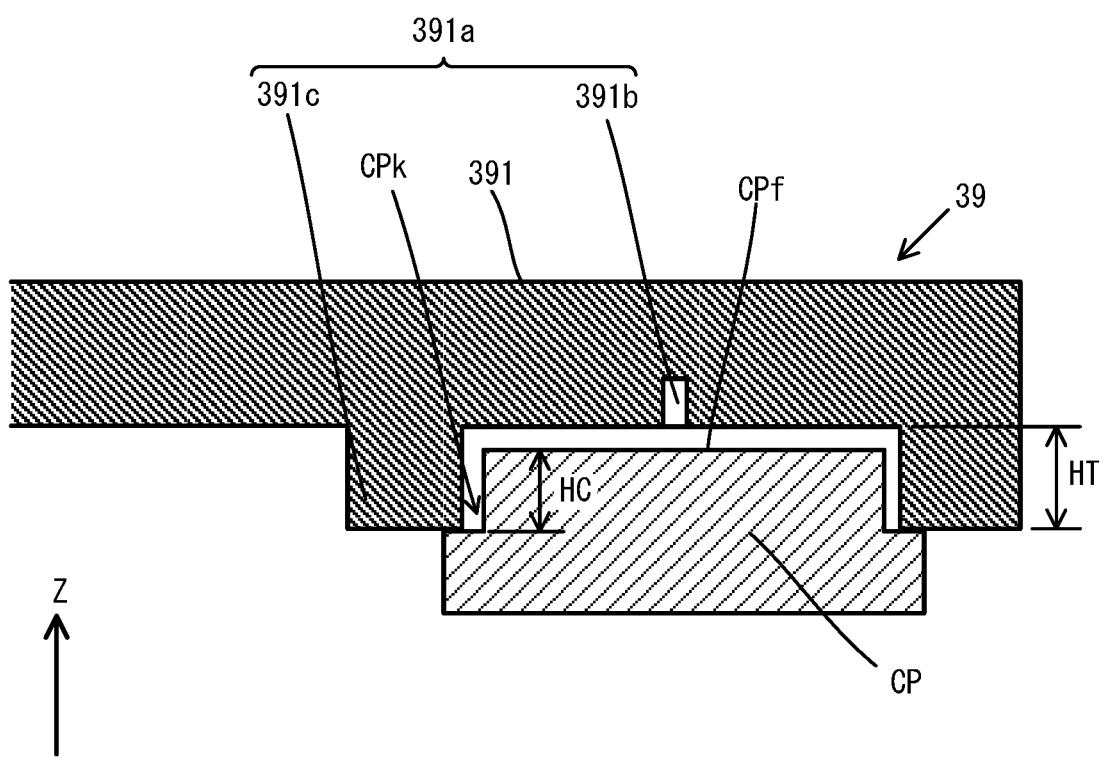
FIG. 7 is a schematic cross-sectional view of a chip holding unit according to Embodiment 1.

Moreover, as illustrated in FIG. 7, the chip holding unit 391*a* of the chip conveying unit 39 has a suction part 391*b* and a protrusion part 391*c* that protrudes at the periphery of the suction part 391*b*. The chip holding unit 391*a* holds the upper surface side of the chip CP in a state in which the connecting face CPf side for bonding of the chip CP to the substrate WT faces vertically upward (+Z direction). Here, the chip CP has a rectangular parallelepiped shape and has a cutout part CPk formed at the outer peripheral part of the connecting face CPf for bonding to the substrate WT. A protrusion amount HT of the protrusion part 391*c* of the chip holding unit 391*a* is greater than a height HC occurring in the direction (Z direction) perpendicular to the connecting face CPf of the cutout part CPk. Further, in the state in which distal part of the protrusion part 391*c* abuts against the lower end part of the cutout part CPk, the chip holding unit 391*a* holds the chip CP by suction attachment of the chip CP by the suction part 391*b*. At this time, as described above, the Z direction height HC of the cutout part CPk of the chip CP is less than the Z direction height HT of the protrusion part 391*c*, and thus the chip conveying unit 39 can convey the chip CP in a state in which the connecting face CPf of the chip CP does not contact the plate 391.

As illustrated in FIGS. 2 and 3, the second imaging unit 41 is disposed above the stage 31. Then in a state in which the chip CP is disposed at the position for mounting of the chip CP on the substrate WT, the second imaging unit 41 images below-described alignment marks (second alignment marks) MC2*a* and MC2*b* of the substrate WT from vertically above (+Z direction) the substrate WT, and thus the second imaging unit 41 acquires image data that includes images of the alignment marks MC2*a* and MC2*b* of the substrate WT. The control unit 90, on the basis of the image data acquired by the second imaging unit 41, recognizes a relative position with respect to the chip CP mounting position of the head 33H in the direction parallel to the surface of mounting of the chip CP on the substrate WT. The second imaging unit 41 has an image sensor 418, an optical system 419, and a non-illustrated coaxial illumination system. The second imaging unit 41 acquires the image data relating to reflected light of the illumination light, such as infrared light, output from a coaxial illumination system non-illustrated light source.

A cover 50 is disposed so as to partition the interiors of the chip supplying device 10 and the bonding device 30 into a space in which the head drive unit 36 and the chip conveying unit 39 are disposed and a space in which the chip supplying unit 11 and the stage 31 are disposed. Such configuration enables suppression of the accumulation of particles generated by the chip supplying unit 11 or the stage 31 on the head drive unit 36 of the chip conveying unit 39.

The hydrophilization treating device 60 performs hydrophilization treatment to make the mounting face of the substrate WT hydrophilic. The hydrophilization treating device 60 has, for example, components such as a non-illustrated chamber, a non-illustrated stage for holding the substrate WT within the chamber, a non-illustrated magnetron for generating high frequency waves, and a non-illustrated high frequency power source for applying a bias to the stage. Moreover, the hydrophilization treating device 60 also has a non-illustrated vacuum pump connected to the chamber for reducing pressure within the chamber. The hydrophilization treating device 60 executes the hydrophilization treatment by activating the mounting face WTf of the substrate WT by performing reactive etching or irradiation with $N_2$ or $O_2$ radicals of the mounting face WTf of the substrate WT held on the stage at reduced pressure. A water washing unit 65 is equipped with a water washing device such as a spin coater. By performing water washing of the conveyed substrate WT, the water washing unit 65 removes particles attached to the substrate WT and also applies water to the mounting face WTf of the substrate WT.

By using a conveying robot 71, the conveying device 70 conveys the substrate WT between the loading-unloading unit 80, the bonding device 30, and the hydrophilization treating device 60. The conveying device 70 firstly conveys the substrate WT from the loading-unloading unit 80 to within the hydrophilization treating device 60. Then the conveying device 70 conveys from the hydrophilization treating device 60 to within the bonding device 30 the substrate WT hydrophilization-treated in the hydrophilization treating device 60. Further, the conveying robot 71 conveys the substrate WT received from the hydrophilization treating device 60 into the bonding device 20 after appropriate vertical inversion.

The hydrophilization treating device 60 suppresses the attachment of particles to the connecting face of the substrate WT by performing the hydrophilization treatment with the connecting face of the substrate WT facing vertically downward, and by handling the substrate WT during treatment such that the connecting face is always facing vertically downward. In this case, an advantageous configuration for adoption by the hydrophilization treating device 60, for example, provides vertically below the substrate WT a particle beam irradiator for activation of the connecting face of the substrate WT by irradiation of the particle beam against the connecting face of the substrate WT from vertically below the substrate WT. Moreover, the configuration of the hydrophilization treating device 60 equipped with this particle beam irradiator is advantageous in comparison to a configuration equipped with a plasma source, for example. In the case of activation of the connecting face of a hybrid substrate, in which a dielectric layer and electrodes are both present, the activation of the connecting face of the substrate WC is assumed to be performed with the dicing tape TE, attached. In this case, if the hydrophilization treating device is equipped with a plasma source, impurity ions generated from the oxide included in the insulation layer, resin forming the dicing tape TE, or the like are attracted by a plasma electrical field to become reattached to the connecting faces of the substrate WT and WC. As a countermeasure, in the case of the hydrophilization treating device 60 equipped with the particle beam irradiator, treatment capable of activation is advantageous that uniformly activates the connecting faces of the substrates WT and WC in order to scatter impurities attached to the connecting faces of the substrates WT and WC by irradiating the particle beam on the connecting faces of the substrates WT and WC.

Figure 8:
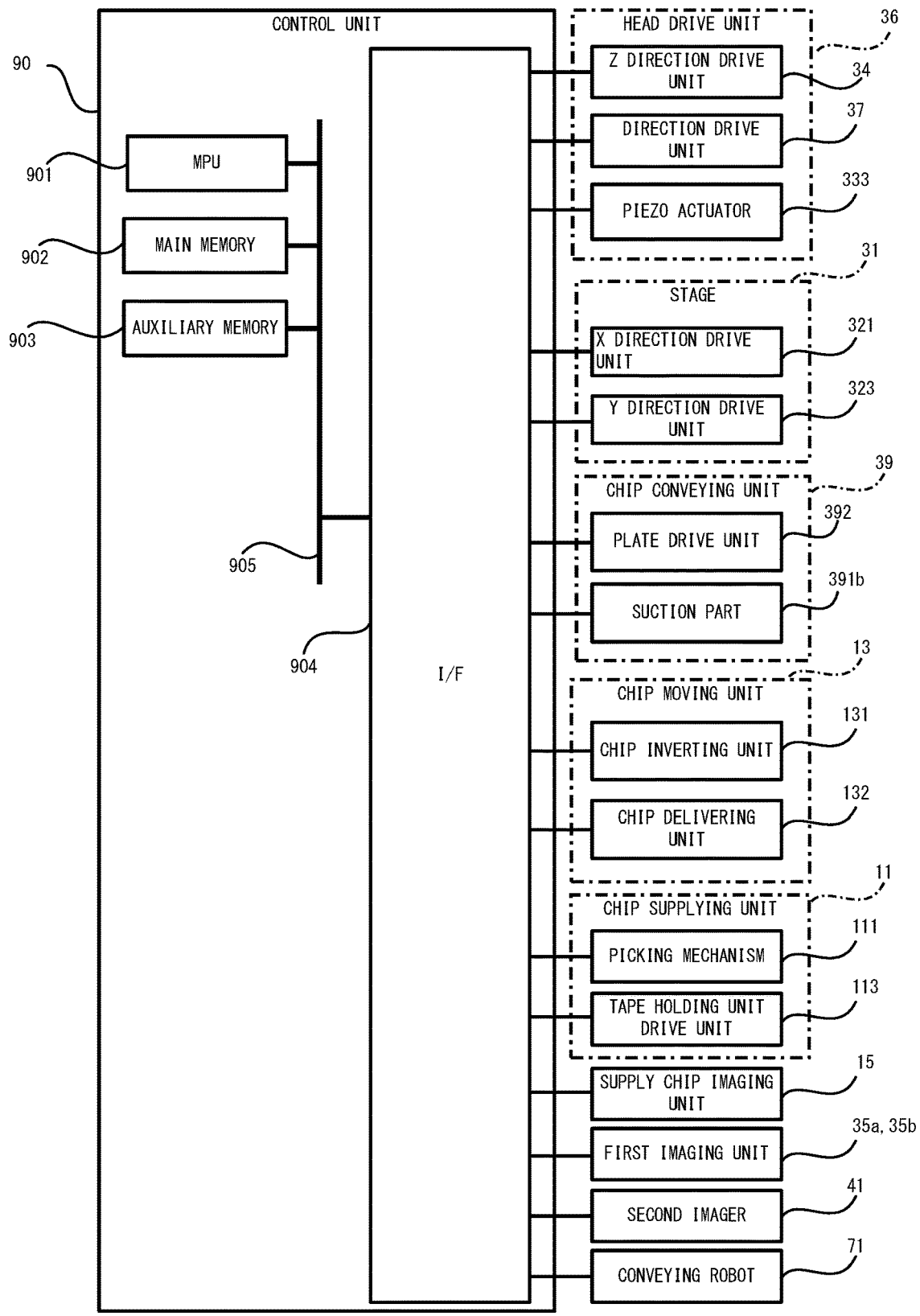
FIG. 8 is a block diagram illustrating a control unit according to Embodiment 1.

As illustrated in FIG. 8, the control unit 90 has a micro processing unit (MPU) 901, a main memory 902, an auxiliary memory 903, an interface 904, and a bus 905 for interconnecting the various components. The main memory 902 is configured from volatile memory and is used as a working region of the MPU 901. The auxiliary memory 903 is configured from non-volatile memory and stores programs to be executed by the MPU 901. Moreover, the auxiliary memory 903 also stores information indicating degree of rotation of the plate 391 of the below-described chip conveying unit 39. The interface 904 converts the image input from the supply chip imaging unit 15, the first imaging units 35a and 35b, and the second imaging unit 41 to imaging image information that is output to the bus 905. Moreover, by executing programs stored in the auxiliary memory 903 and written to the main memory 902, the MPU 901 via the interface 904 outputs control signals to each of the Z direction drive unit 34, the θ direction drive unit 37, the piezo actuator 333, the X direction drive unit 321, the Y direction drive unit 323, the plate drive unit 392, the suction part 391b, the chip inverting unit 131, the chip delivering unit 132, the picking mechanism 111, the tape holding part drive unit 113, and the conveying robot 71.

The control unit 90 calculates relative positional error occurring between the substrate WT and the chip CP on the basis of the images obtained by imaging the alignment marks MC1a, MC1b, MC2a, and MC2b in a state in which the substrate WT and the chip CP are in contact with each other. Then in response to the calculated relative positional error, the control unit 90 causes the Z direction drive unit 34 and the θ direction drive unit 37 of the head drive unit 36, as well as the X direction drive unit 321 and the Y direction drive unit 323 of the stage 31, to correct the position and orientation of the chip CP relative to the substrate WT. Moreover, in accordance with the position and orientation on the substrate WC of the chip CP passed to the chip inverting unit 131, the control unit 90 causes the tape holding part drive unit 113 to correct the position and the tilt around the Z axis of the tape holding part 112. Here, the control unit 90 recognizes the orientation of the chip CP on the basis of the image data input from the above-described supply chip imaging unit 15.

Figure 9:
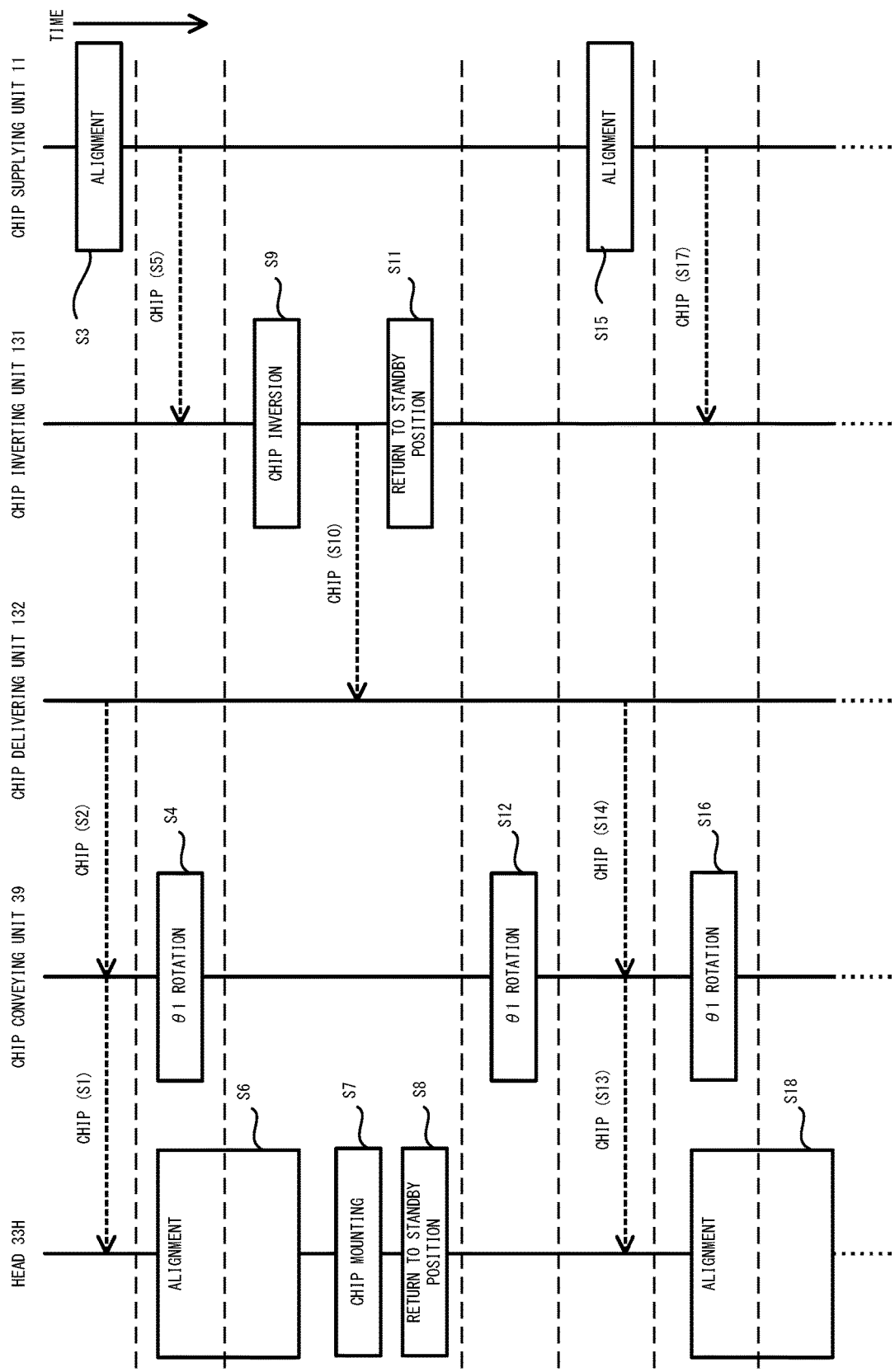
FIG. 9 is a sequence diagram illustrating operation of the component mounting system according to Embodiment 1.

Next, component mounting processing executed by the chip mounting system according to the present embodiment is described with reference to FIGS. 9 to 14. This component mounting processing starts upon startup of a program for component mounting processing executed by the control unit 90. In FIG. 9, the tape holding part 112 of the chip supplying unit 11 is taken to be holding the dicing tape TE in a state in which the surface of the dicing substrate WC where the dicing tape TE is attached faces downward. Moreover, the surface side where each chip CP forming the dicing substrate WC is mounted on the substrate WT is taken to be previously hydrophilization treated by the hydrophilization treating device 60 or another device.

Figure 10A:
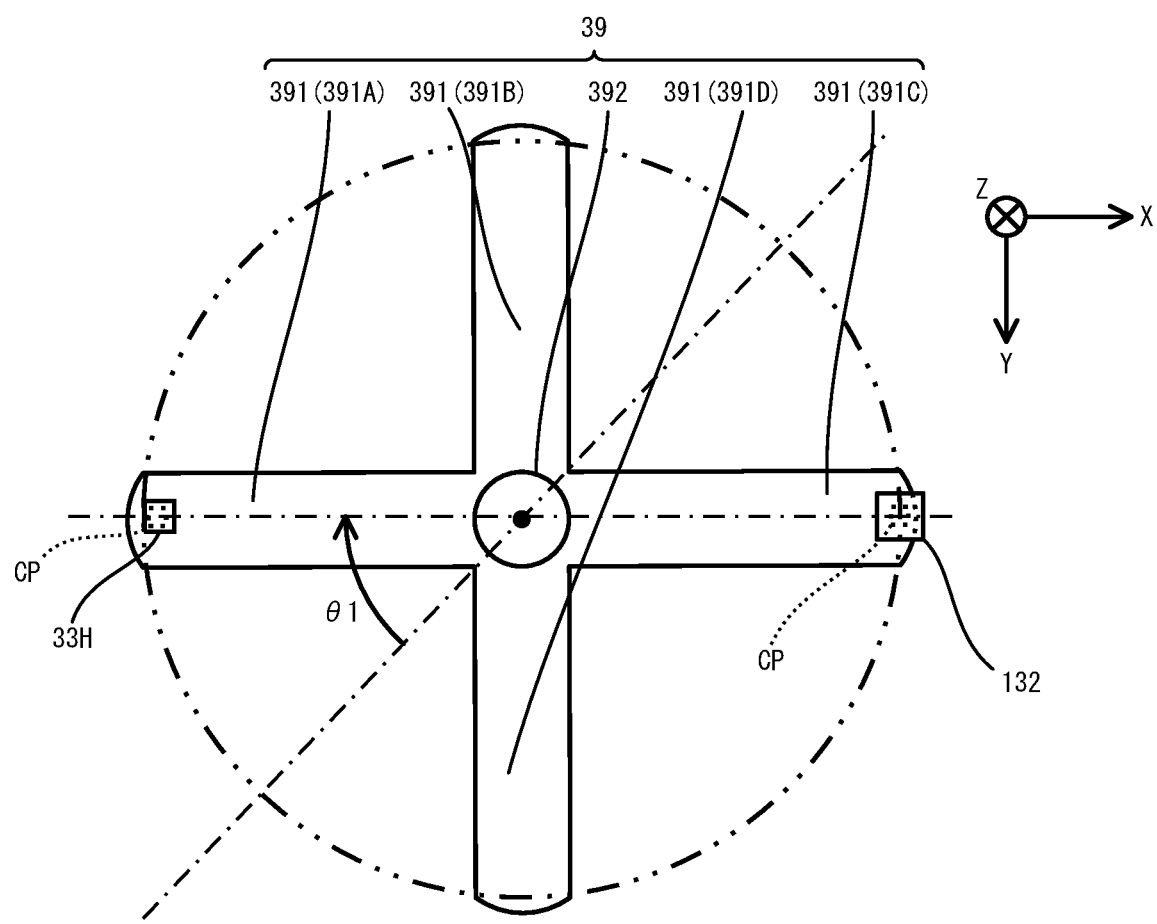
FIG. 10A is a schematic plan view illustrating positional relationships between the head, a chip conveying unit, and a chip delivering unit according to Embodiment 1.

Furthermore, the bonding device 30 is taken to use the stage 31 to hold the substrate WT hydrophilization-treated by the hydrophilization treating device 60 and conveyed to the interior of the bonding device 30 by the conveying device 70. The stage 31 holds (substrate holding step) the substrate WT in an orientation such that the mounting face for mounting the chip CP on the substrate WT is facing vertically downward. Moreover, as illustrated in FIG. 10A, a first state is assumed in which the distal part of the plate 391a overlaps the head 33H in the Z direction, and the distal part of the plate 391c overlaps the chip delivering unit 132. In this first state, one end part of any of the even number of plates 391 overlaps the head 33H in the vertical direction (Z direction). Here, the plate 391a is taken to hold the chip CP, and the plate 391c is taken to not hold the chip CP.

Moreover, the chip mounting system 1 is taken to move the stage 31 and cause the head 33H to face the mounting position for mounting the chip CP on the substrate WT. Here, the chip mounting system 1 recognizes the position of mounting the chip CP on the substrate WT firstly on the basis of the image data including the alignment marks of the substrate WT imaged by the second imaging unit 41. Then on the basis of the recognized mounting position of the chip CP, the substrate placing unit 315 of the stage 31 moves in the X direction or Y direction, and the chip CP held by the head 33H is made to face the part of the substrate WT where the chip CP is mounted.

Figure 10B:
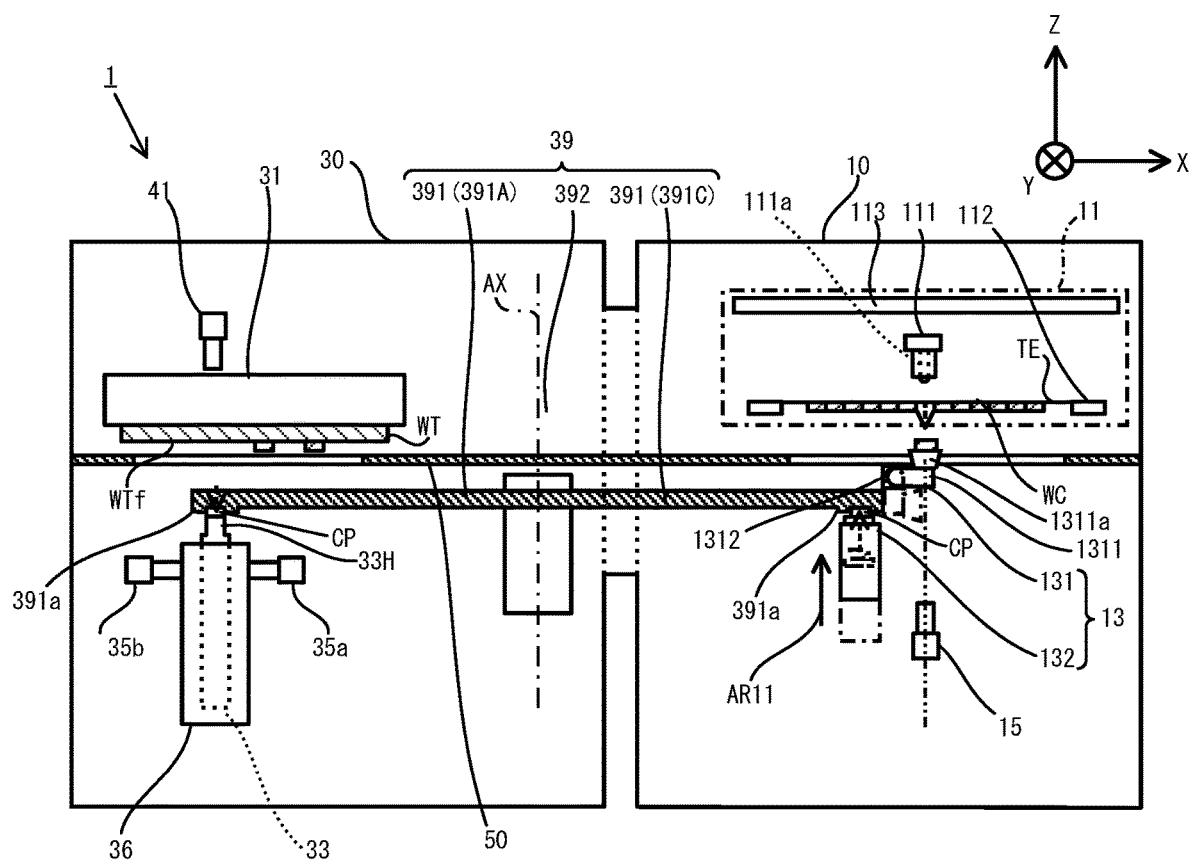
FIG. 10B is a schematic configuration view of the component mounting system according to Embodiment 1 as viewed from the side.

Firstly, in the case in which the chip conveying unit 39 is in the first state, as illustrated in FIG. 9, the chip mounting system 1 is passed to the head 33H the chip CP held by the plate 391a (step S1). As illustrated in FIG. 10B, in a state in which the head 33H approaches the plate 391a, the chip mounting system 1 passes the chip CP to the head 33H from the plate 391 by stopping vacuum attachment by the suction part 391b of the chip holding unit 391a of the plate 391a and by causing suction attachment of the chip CP to the head 33H. At this time, the head 33H holds the chip CP from the vertically downward direction (component holding step).

At the same time, as illustrated in FIG. 9, the chip mounting system 1 passes to the plate 391c of the chip conveying unit 39 the chip CP held by the chip delivering unit 132 (step S2). Here, as indicated by the arrow AR11 of FIG. 10B, by raising the chip delivering unit 132 holding the chip CP upward from the standby position, the chip mounting system passes the chip CP to the chip holding unit 391a of the plate 391c, and again the chip delivering unit 132 is lowered to the standby position.

Simultaneously, the chip mounting system 1 recognizes the position and orientation of the chip CP passed to the chip inverting unit 131 on the substrate WC on the basis of the image data obtained by imaging by the supply chip imaging unit 15. Then in accordance with the recognized position and orientation of the chip CP, the chip mounting system 1 has the tape holding drive unit 113 execute an alignment operation to correct the position and the tilt around the Z axis of the tape holding part 112 (step S3).

Figure 11A:
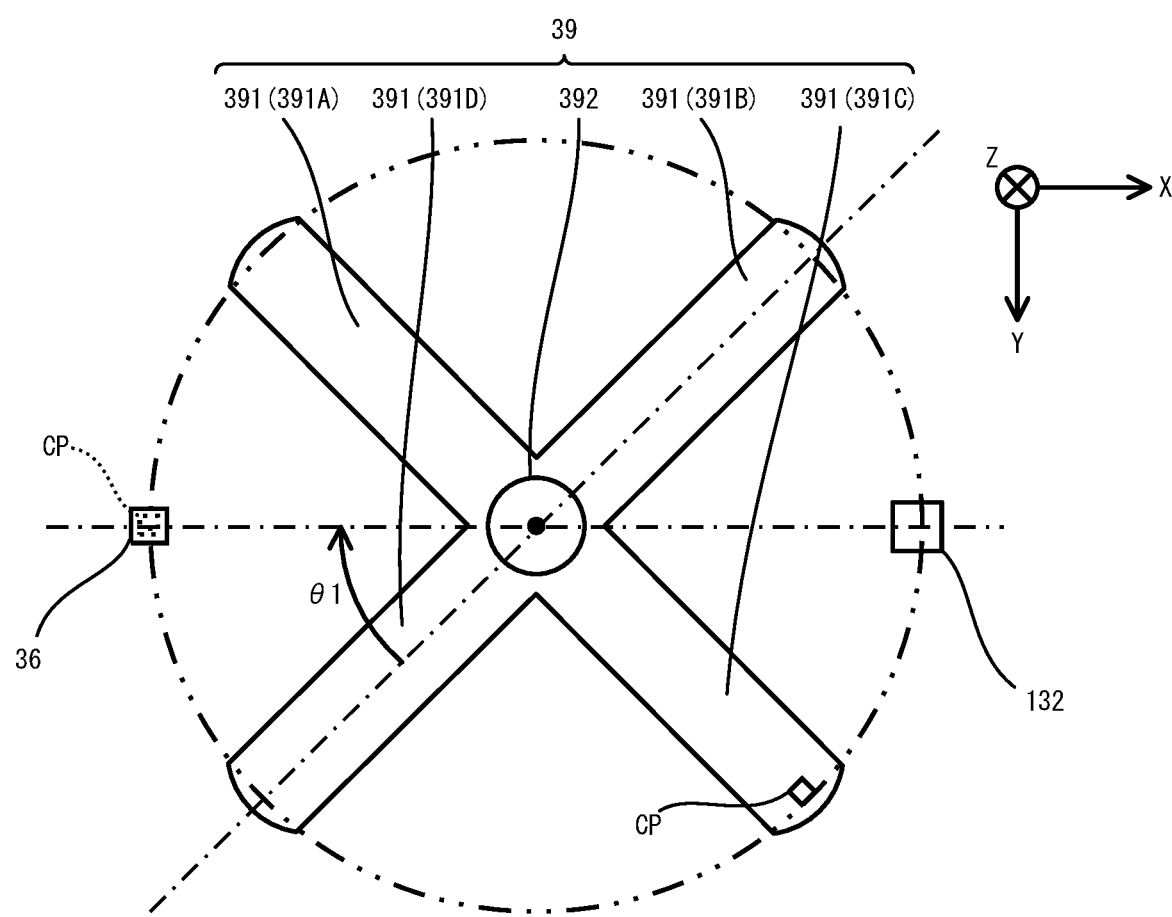
FIG. 11A is a schematic plan view illustrating positional relationships between the head, the chip conveying unit, and the chip delivering unit according to Embodiment 1.

Next, the chip mounting system 1 causes the plate 391 of the chip conveying unit 39 to rotate by a predetermined angle θ1 (step S4). Due to such operation, as illustrated in FIG. 11A, the chip conveying unit 39 is in a second state in which the plate 391 and the head 33H and the chip delivering unit 132 are not overlapping in the Z direction. In this second state, one end part of the even number of plates 391 and the head 33H do not overlap in the vertical direction (Z direction). Further, the angle θ1 is set to 22.5° in the case of four plates 391. That is to say, the angle θ1 is set to be 180/N degrees, assuming that the number of plates 391 is a positive integer N.

Moreover, when the plate 391 is rotated, the chip mounting system 1 passes (component supplying step) the chip CP to an arm 1311 of the chip inverting unit 131 from the chip supplying unit 11 (step S5). The chip mounting system 1 firstly moves the suction part 1311a of the chip inverting unit 131 to the position for receiving the chip CP. Thereafter, the chip mounting system 1 uses a needle 111a in a picking mechanism 111 of the chip supplying unit 11 to press downward the chip CP, causes the arm 1311 of the chip inverting unit 131 to approach the dicing tape TE, and passes the pushed-out chip CP to the arm 1311.

That is to say, in the first state of the chip conveying unit 39, the mounting of the substrate WT of the chip CP held by the head 33H of the head drive unit 36, the supply of the chip CP from the chip supplying unit 11 to the chip inverting unit 131, and the passing of the chip CP from the chip delivering unit 132 to the chip conveying unit 39 are executed simultaneously.

Moreover, upon rotating the plate 391, the chip mounting system 1 starts alignment of the chip CP held by the head 33H (step S6). As indicated by the arrow AR12 in FIG. 11B, the chip mounting system 1 firstly raises the head 33H, and causes the chip CP held by the head 33H to approach the mounting position of mounting of the chip CP on the substrate WT. The alignment marks MC1a and MC1b as illustrated in FIG. 12A, for example, are provided on the chip CP, and the alignment marks MC2a and MC2b as illustrated in FIG. 12B, for example, are provided at the positions for mounting the chip CP on the substrate WT. Then by use of the alignment marks MC1a and MC1b provided on the chip CP and the alignment marks MC2a and MC2b provided on the mounting position of the chip CP of the substrate WT, the chip mounting system 1 executes the alignment operation between the chip CP and the substrate WT. The chip mounting system 1 executes this alignment operation, for example, during the raising of the head 33H. In the state in which the chip CP and the substrate WT are mutually near to each other by a distance of several mμ to several tens of mμ, the chip mounting system 1 executes the alignment operation.

Figure 12A:
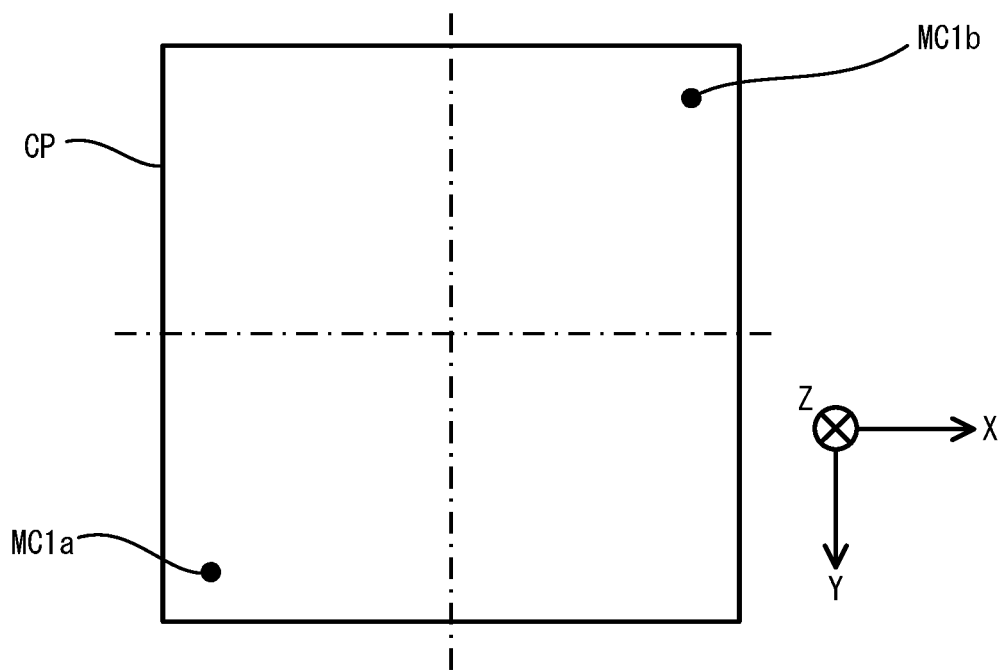
FIG. 12A is a drawing illustrating alignment marks provided on the chip.
Figure 12B:
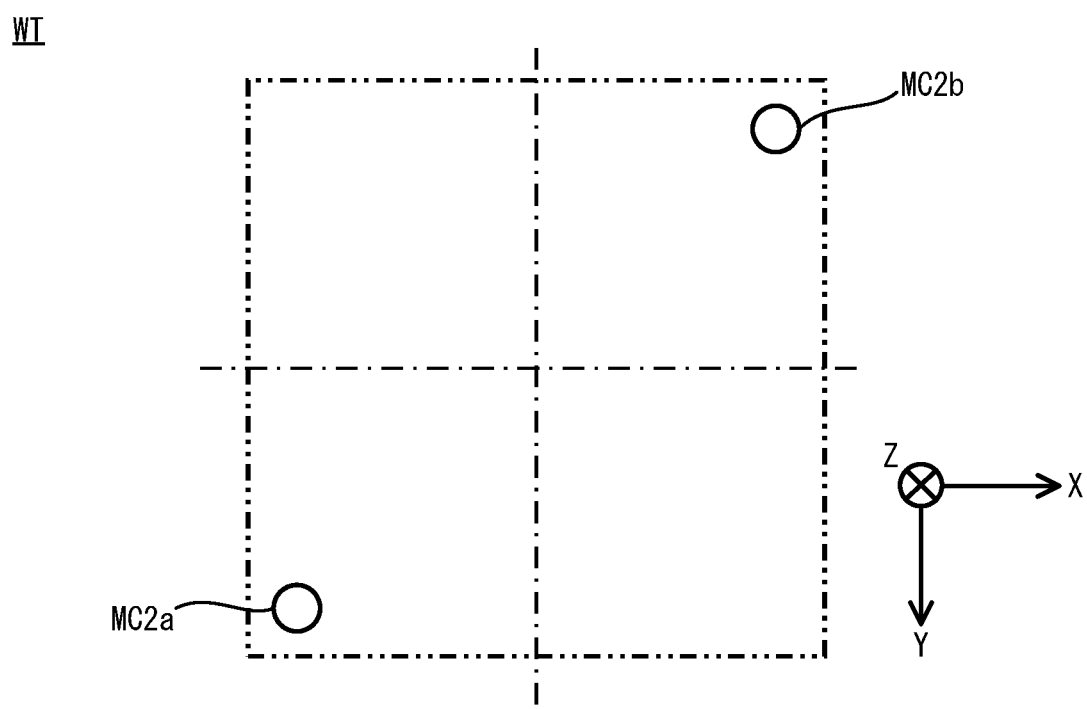
FIG. 12B is a drawing illustrating alignment marks provided on a substrate.
Figure 12C:
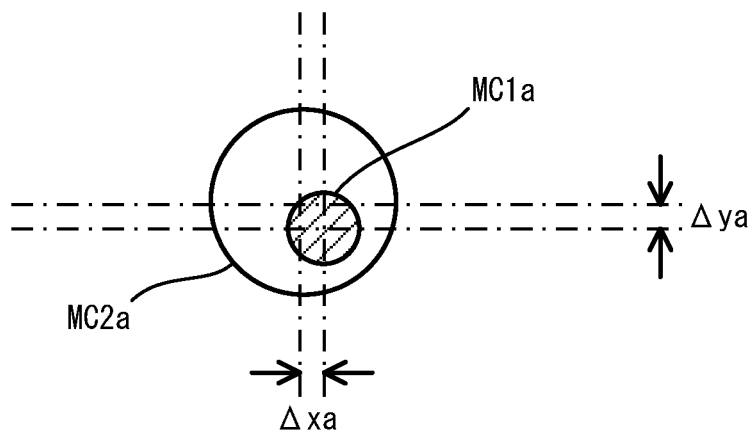
FIG. 12C is a drawing illustrating relative positional displacement of the alignment marks.
Figure 13:
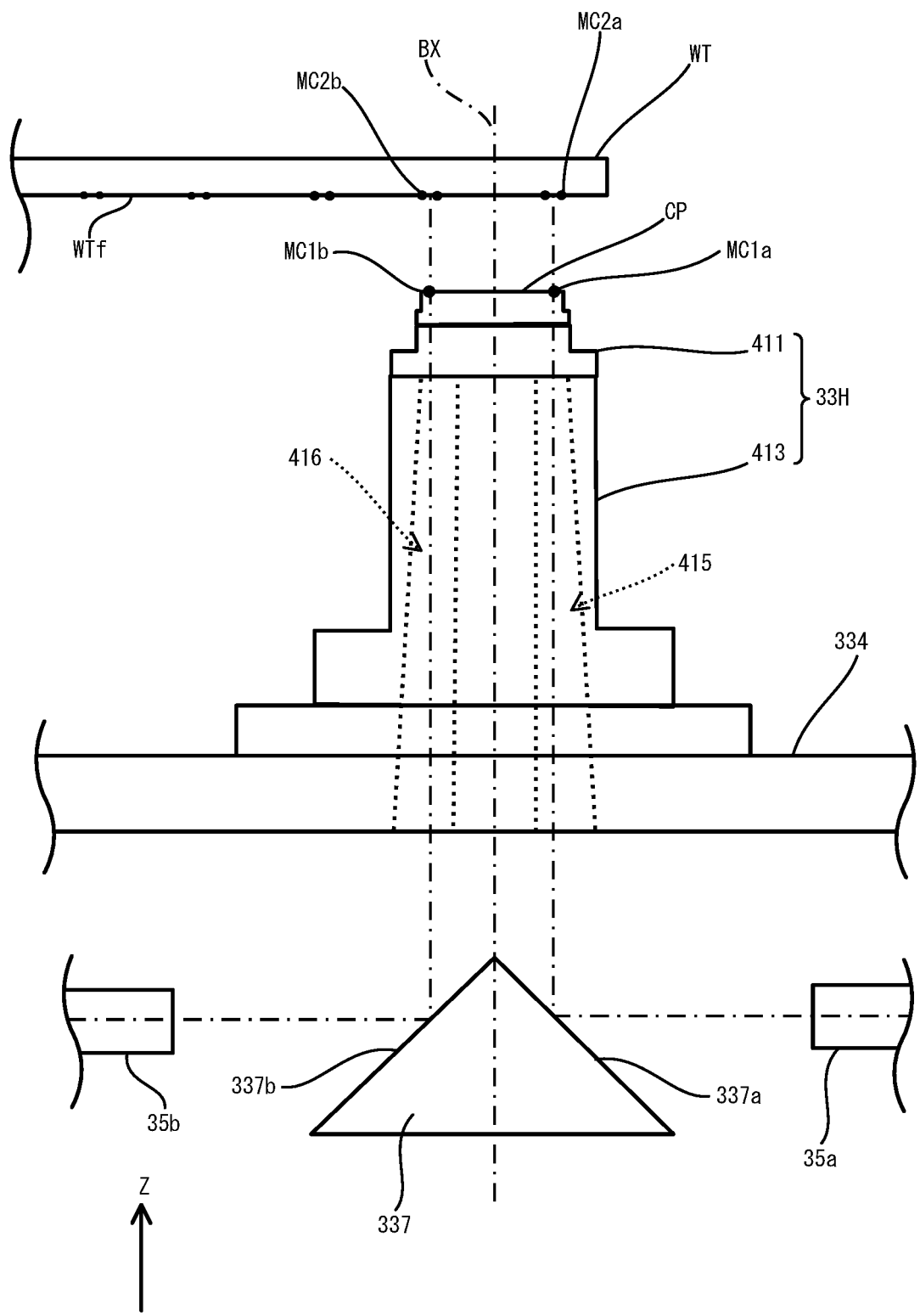
FIG. 13 illustrates details of the head according to Embodiment 1.

At this time as illustrated in FIG. 13, a part of the light output from the first imaging unit 35a, reflected from the mirror 337, and passed through the hollow part 415 of the head 33H passes through the chip tool 411 and the chip CP. A part of the light passing through the chip CP is reflected by a part of the substrate WT provided with the alignment mark MC2a. Moreover, a part of the remaining light passing through the hollow part 415 of the head 33H is reflected by the part of the chip CP provided with the alignment mark MC1a. The light reflected by the part of the substrate WT provided with the alignment mark MC2a and the part of the chip CP provided with the alignment mark MC1a passes through the chip tool 411 and passes through the hollow part 415 of the head 33H. Then such light passed through the hollow part 415 of the head 33H is reflected by the mirror 337, and thus enters the imaging element of the first imaging unit 35a. Due to such operation, the chip mounting system 1 acquires image data Ga including an image of the alignment mark MC2a provided on the substrate WT and an image of the alignment mark MC1a provided on the chip CP. Then as illustrated in FIG. 12C, the chip mounting system 1 recognizes the positions of the set of alignment marks MC1a and MC2a provided on the chip CP and the substrate WT on the basis of the image data Ga, and calculates positional displacement amounts $\Delta xa$ and $\Delta ya$ of this set of alignment marks MC1a and MC2a. Here, without moving the focal axis, the chip mounting system 1 performs simultaneous recognition from a single image acquisition of the set of the alignment mark MC1a of the chip CP and the alignment mark MC2a of the substrate WT by the same first imaging unit 35a.

Moreover, part of the light emitted from the first imaging unit 35b, reflected by the mirror 337, and passed through the hollow part 416 of the head 33H also passes through the chip tool 411 and the chip CP. The part of the light passed through the chip CP is reflected by the part of the substrate WT where the alignment mark MC2b is provided. Moreover, part of the remaining light passed through the hollow part 416 of the head 33H is reflected by the part where the alignment mark MC1b is provided on the chip CP. The light reflected from the part of the substrate WT where the alignment mark MC2b is provided or the part of the chip CP where the alignment mark MC1b is provided passes through the chip tool 411 and passes through the hollow part 416 of the head 33H. Then the light passed through the hollow part 416 of the head 33H reflects from the mirror 337 and enters the imaging element of the imaging unit 35b. Due to such operation, the chip mounting system 1 acquires image data Gb that includes an image of the alignment mark MC1b provided on the chip CP and an image of the alignment mark MC2b provided on the substrate WT. Then in the same manner as described above, on the basis of the image data Gb, the chip mounting system 1 recognizes the positions of the set of alignment marks MC1b and MC2b provided on the chip CP and the substrate WT, and calculates positional displacement amounts $\Delta xb$ and $\Delta yb$ of this set of alignment marks MC1b and MC2b. Here, without moving the focal axis, the chip mounting system 1 simultaneously recognizes from a single image acquisition by same first imaging unit 35b of the set of the alignment mark MC1b of the chip CP and the alignment mark MC2b of the substrate WT. In this manner, the chip mounting system 1 is capable of recognizing with high accuracy the positional displacements of the chip CP and the substrate WT.

Next, on the basis of the positional displacement amounts $\Delta xa$, $\Delta ya$, $\Delta xb$, and $\Delta yb$ of these two sets of alignment marks MC1a, MC2a, MC1b, and MC2b, the chip mounting system 1 calculates the relative positional displacement amounts $\Delta x$, $\Delta y$, and $\Delta \theta$, between the chip CP and the substrate WT occurring in the X direction, Y direction, and rotation direction around the axis BX. Here, $\Delta x$ indicates the relative positional displacement amount between the chip CP and the substrate WT in the X direction, and $\Delta y$ indicates the relative positional displacement amount between the chip CP and the substrate WT in the Y direction. Moreover, $\Delta \theta$ indicates the relative positional displacement amount between the chip CP and the substrate WT occurring in the rotation direction around the axis BX.

Thereafter, the chip mounting system 1 drives the stage 31 in the X direction and Y direction, and rotates the bonding unit 33 around the axis BX, to decrease the calculated relative positional displacement amount. Due to operation in this manner, the chip mounting system 1 executes the alignment operation to correct the relative positional displacement between the chip CP and the substrate WT.

Again with reference to FIG. 9, by further raising the head 33H holding the chip CP, the chip mounting system 1 mounts (component mounting step) the chip CP on the substrate WT (step S7). More specifically, the chip mounting system 1 causes the head 33H holding the chip CP to approach the stage 31, contacts the chip CP against the mounting face WTf of the substrate WT, and causes surface bonding of the chip CP to the substrate WT. As explained above, the connecting face CPf for bonding with the substrate WT that occurs between the mounting face WTf of the substrate WT and the chip CP is hydrophilization-treated by the hydrophilization treating device 60, for example. Therefore, the chip CP is bonded to the substrate WT by causing the connecting face CPf of the chip CP to contact the mounting face WTf of the substrate WT. Thereafter, the chip mounting system 1 lowers the head 33H as indicated by arrow AR15 in FIG. 14 and returns the head 33H to the standby position (step S8).

Figure 11B:
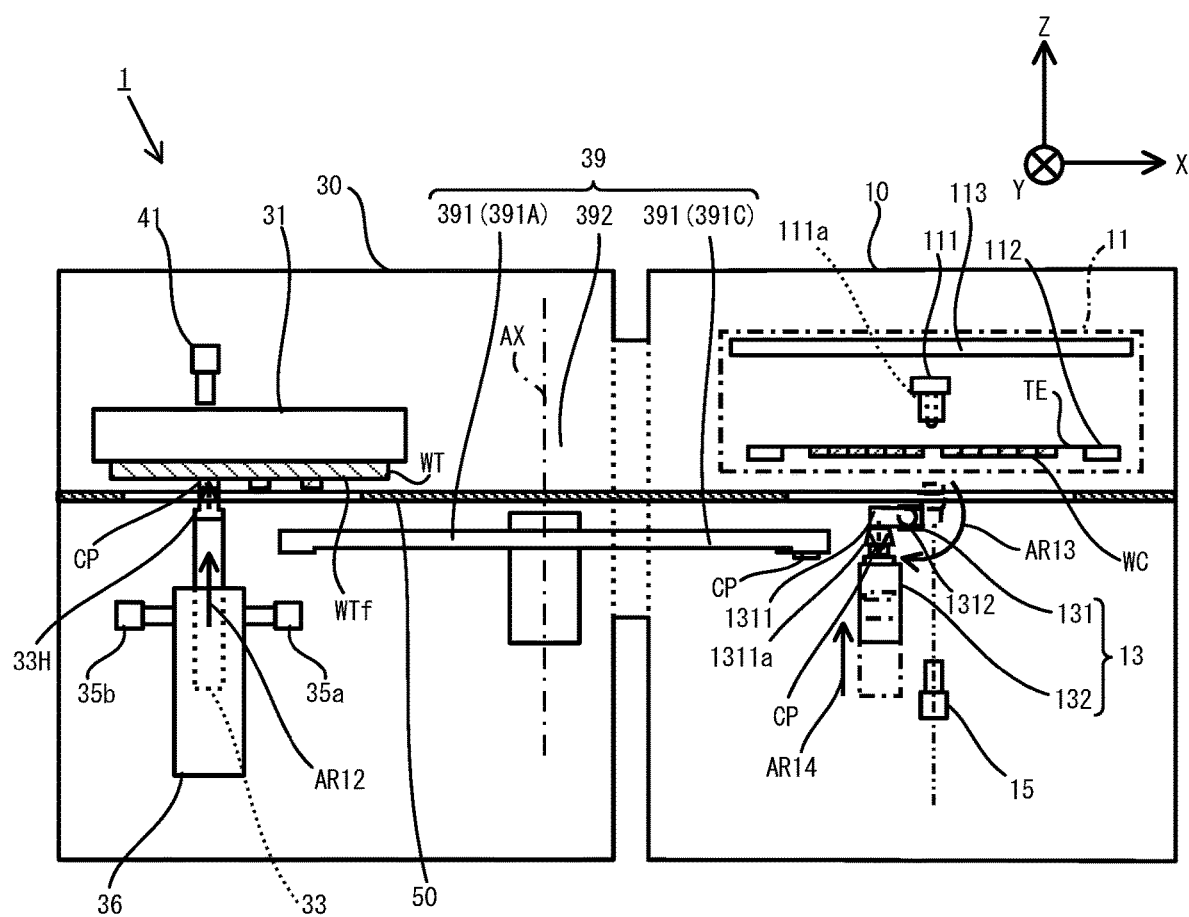
FIG. 11B is a schematic configuration view of the component mounting system according to Embodiment 1 as viewed from the side.

Moreover, simultaneously with the execution of the series of processing of steps S5 and S6, as indicated by arrow AR13 in FIG. 11B, the chip mounting system 1 causes vertical inversion of the chip CP by causing the chip inverting unit 131 to rotate the arm 1311 (step S9).

Thereafter, the chip mounting system 1 passes the chip CP from the arm 1311 of the chip inverting unit 131 to the chip delivering unit 132 (step S10). At this time, as illustrated by arrow AR14 of FIG. 11B, by causing the chip delivering unit 132 to rise from the standby position, the chip mounting system 1 passes the chip CP from the arm 1311 to the chip delivering unit 132. Thereafter, as illustrated by arrow AR16 in FIG. 14, the chip mounting system 1 again lowers the chip delivering unit 132 to the standby position.

Figure 14:
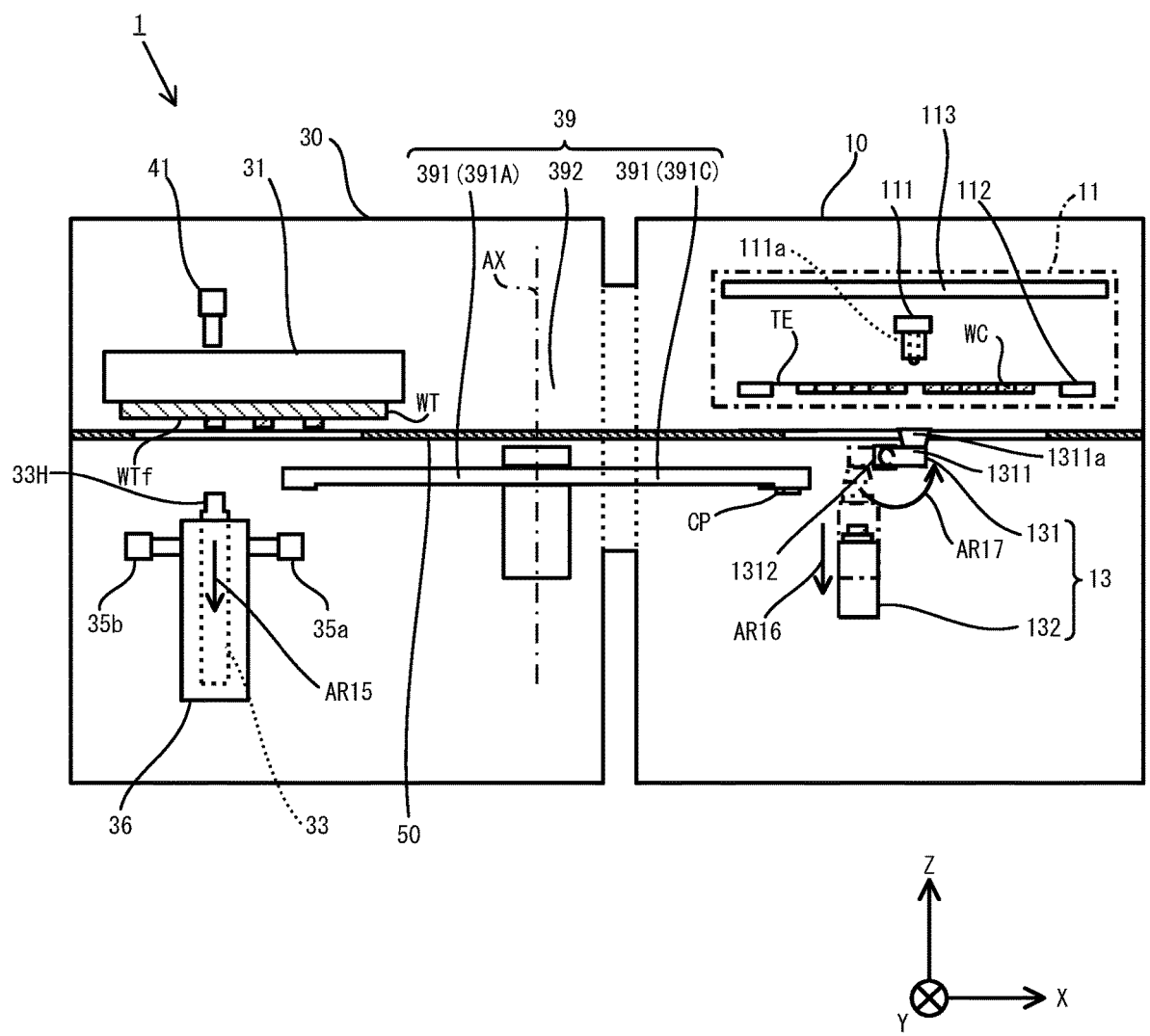
FIG. 14 is a schematic configuration view of the component mounting system according to Embodiment 1 as viewed from the side.

Thereafter, as illustrated by arrow AR17 in FIG. 14, by upward rotation of the arm 1311 of the chip inverting unit 131, the chip mounting system 1 returns the arm 1311 to the standby position (step S11).

That is to say, in the second state of the chip conveying unit 39, the mounting of the chip CP on the substrate WT by the head drive unit 36, the inverting of the chip CP by the chip inverting unit 131, and the receiving of the chip CP by the chip delivering unit 132 from the chip inverting unit 131 are executed.

Again with reference to FIG. 9, the chip mounting system 1 causes the plate 391 of the chip conveying unit 39 to rotate by the predetermined angle θ1 (step S12). Due to such operation, again as indicated in FIG. 10A, the chip conveying unit 39 enters the first state in which the distal part of the plate 391*a* overlaps the head 33H in the Z direction, and the distal part of the plate 391*c* overlaps the chip delivering unit 132.

Thereafter, in the same manner as the previously described step S1, the chip mounting system 1 returns the chip CP held by the plate 391*b* to the head 33H (step S13). Simultaneously, in the same manner as the previously described step S2, the chip mounting system 1 returns the chip CP held by the chip delivering unit 132 to the plate 391*d* of the chip conveying unit 39 (step S14). Furthermore, in the same manner as the previously described step S3, the chip mounting system 1, in response to the position and orientation of the chip CP occurring on the substrate WC, causes the tape holding part drive unit 113 to execute the alignment operation to correct the position and tilt around the Z axis of the tape holding part 112 (step S15). Thereafter, simultaneously with the rotation of the plate 391 of the chip conveying unit 39 by the predetermined angle θ1 (step S16), in the same manner as the above-described step S3, the chip mounting system 1 passes the chip CP from the chip supplying unit 11 to the arm 1311 of the chip inverting unit 131 (step S17). Moreover, when the plate 391 is rotated, in the same manner as in the aforementioned step S6, the chip mounting system 1 starts alignment of the chip CP held by the head 33H (step S18). Due to such operation, the chip conveying unit 39 enters the second state in which the plate 391, the head 33H, and the chip delivering unit 132 are not overlapped in the Z direction. Thereafter, the chip mounting system 1 repeatedly executes the processing of steps S7 to S18.

According to the chip mounting system 1 according to the present embodiment in the aforementioned manner, the stage 31 holds the substrate WT in an orientation such that the mounting face for mounting the chip CP on the substrate WT faces vertically downward. Moreover, by causing the head 33H holding the chip CP to move vertically upward, the head drive unit 36 causes the head 33H to approach the stage 31, and mounts the chip CP on the mounting face. Moreover, due to the ability to decrease attachment of particles to the mounting face of the substrate WT, the occurrence of bonding failures between the chip CP and the substrate WT can be suppressed. Therefore, the occurrence of malfunctioning products due to bonding failure between the chip CP and the substrate WT is suppressed for products produced by mounting the chip CP on the substrate WT.

Moreover, the tape holding part 112 in the present embodiment is frame-shaped and holds the substrate WC to which the dicing tape TE is attached in an orientation in which the dicing sheet TE is positioned directly above the substrate WC. Such configuration enables suppression of the attachment of particles to the surface side of the substrate WT where each chip CP forming the substrate WC is mounted. Moreover, each chip CP forming the substrate WC is pushed out in the vertically downward direction by the needle 111*a* from the vertically upward direction of the dicing tape TE, sheet so that the chip CP is pushed vertically downward so that the chip CP is supplied. Such operation can simplify the configuration of the chip supplying unit 11.

Furthermore, the chip conveying unit 39 according to the present embodiment, by the chip holding unit 391*a* through the peripheral part CPs of the chip CP, conveys the chip CP in a state in which the connecting face CPf side for bonding of the chip CP to the substrate WT faces vertically upward (+Z direction). Here, the chip CP is has a rectangular parallelepiped shape and has a cutout part CPk formed at the outer peripheral part of the connecting face CPf for bonding to the substrate WT. Moreover, as illustrated in FIG. 7, the chip holding unit 391*a* has a suction part 391*b* and a protrusion part 391*c* protruding at the periphery of the suction part 391*b*, and the protrusion amount HT of the protrusion part 391*c* is larger than the height HC in the direction (Z direction) perpendicular to the connecting face CPf of the cutout part CPk. Further, in the state in which the distal part of the protrusion part 391*c* abuts against the lower tip part of the cutout part CPk, the chip holding unit 391*a* holds the chip CP by suction attachment of the chip CP by the suction part 391*b*. Due to such operation, damage of the connecting face CPf of the chip CP during conveying of the chip CP can be suppressed, and thus the occurrence of bonding failures between the chip CP and the substrate WT can be decreased.

Moreover, according to the chip mounting system 1 according to the present embodiment, the receiving by the head 33H of the chip CP from the chip conveying unit 39, the supplying of the chip CP from the chip supplying unit 11 to the chip inverting unit 131, and the passing of the chip CP from the chip delivering unit 132 to the chip conveying unit 39 are performed in the first state of the chip conveying unit 39. Moreover, the mounting of the chip CP on the substrate WT by the head drive unit 36, the inverting of the chip CP by the chip inverting unit 131, and the receiving of the chip CP from the chip inverting unit 131 by the chip delivering unit 132 are executed in the second state of the chip conveying unit 39. Due to such operation, the period after the start of the mounting of the chips CP on the substrate WT up until completion of the mounting on the substrate WT of all the chips CP to be mounted on the substrate WT can be reduced in comparison to the case in which each of these operations is executed sequentially. Therefore throughput of manufacture of the substrate WT on which the chip CP is mounted improves.

Furthermore, in the chip mounting system 1 according to the present embodiment, in the state in which the chip CP is disposed at the position where the chip CP is mounted on the substrate WT, the first imaging units 35*a* and 35*b* image the alignment marks MC1*a* and MC1*b* of the chip CP from vertically below (−Z direction) the chip CP. Moreover, in the state in which the chip CP is disposed at the position of mounting of the chip CP on the substrate WT, the second imaging unit 41 images the alignment marks MC2*a* and MC2b of the substrate WT form vertically above (+Z direction) of the substrate WT. Due to such operation, the chip mounting system 1 can recognize with good accuracy the alignment marks MC1a and MC1b of the chip CP and the alignment marks MC2a and MC2b of the substrate WT, and such operation has the advantage of improving accuracy of alignment of the chip CP relative to the substrate WT.

Moreover, in the state in which the substrate WT and the chip CP contact each other, the control unit 90 according to the present embodiment measures the relative positional error between the substrate WT and the chip CP on the basis of the image data obtained by imaging of the alignment marks MC1a, MC1b, MC2a, and MC2b. Also, in accordance with the measured relative positional error, the control unit 90 executes correction of the position of mounting of the chip CP on the substrate WT by the head drive unit 36. Due to such operation, the chip mounting system 1 can execute with good accuracy the alignment of the chip CP relative to the substrate WT.

Furthermore, according to the chip mounting system according to the present embodiment, the head drive unit 36 causes the head 33H holding the chip CP to approach the stage 31 so that the connecting face CPf of the chip CP contacts the mounting face WTf of the substrate WT, thereby surface bonding the chip CP to the substrate WT. More specifically, the head drive unit 36 causes the mounting face WTf of the substrate WT hydrophilization-treated by the hydrophilization treating device 60 to contact the connecting face of the chip CP so that the chip CP bonds to the substrate WT.

Moreover, conventionally the mainstream type of bonding is performed via bumps that are protruding electrodes, and thus a particle falling into the inter-bump gap does not result in a problem for bonding. However, a substrate bonding technique termed "hybrid bonding" is beginning to be used in recent years for surface bonding between the substrate and a chip within connecting faces for which the electrode surfaces and the dielectric surfaces are the same. The hydrophilization-treated chip connecting face and substrate mounting face are directly bonded by this substrate bonding method, and thus the bonded state between the chip and the substrate is greatly affected by a particle present on the mounting face of the substrate. For example, if even a single particle of about 1 μm diameter is present on the substrate, the resultant void has a range of the diameter of the circumference that is several mm. For bonding between substrates, mass production technology is established for bonding between substrates in an environment in which particle density is controlled. However, from the standpoint of improvement of chip yield, the chip-on-wafer (so-called "COW") method chip mounting system that selects non-defective chips is advantageous. In contrast, in the aforementioned manner according to the chip mounting system 1 according to the present embodiment, particle countermeasures are used to suppress the attachment of particles on the mounting face WTf of the substrate WT. Due to such operation, hydrophilization treatment and bonding can be used for mounting the chip CP on the substrate WT.

Embodiment 2

A resin shaping device according to the present embodiment is a system for irradiating a resin part with ultraviolet light to perform curing of the resin part in a state in which a molding member (referred to hereinafter as the "mold") in which a resin that is an ultraviolet-curing resin is placed is pressed against the substrate. Use of this resin shaping device enables the formation of fine structures made from the resin on the substrate.

The resin part is made from a photo-curable resin. The term "photo-curable resin" means a photo-radically curable resin that includes at least one type of polymerizable compound, for example. Examples of photo-radically curable resins that can be used include mixtures of a photo-radical initiator and a liquid monomer such as an acrylate, methacrylate, vinyl ester, vinyl amide, or the like that rapidly undergoes radical type polymerization and curing upon irradiation with ultraviolet light. Moreover, a curing agent such as an aromatic carbonyl compound, ketone, phosphine oxide, or the like can be added to the photo-curable resin. Examples of the utilized substrate include glass substrates and sapphire substrates that are transparent to ultraviolet light.

Figure 15:
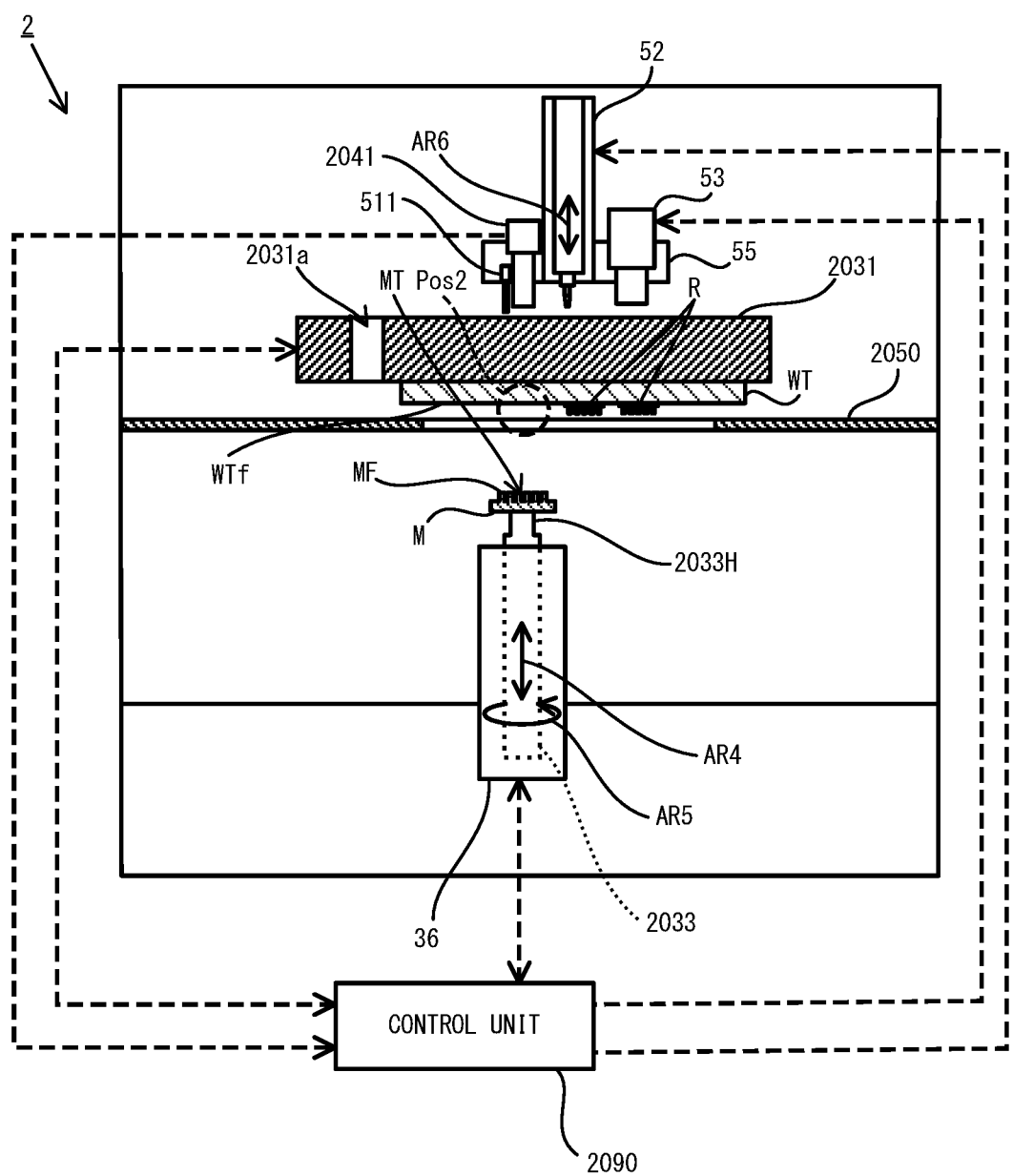
FIG. 15 is a schematic configuration view of a resin shaping device according to Embodiment 2.

As illustrated in FIG. 15, a resin shaping device 2 according to the present embodiment is equipped with a stage (substrate holding unit) 2031, a bonding unit 2033 having a head 2033H, a head drive unit 36 for driving the head 2033H, an imaging unit 2041, a distance measuring unit 511, a dispenser (resin dispensing unit) 52, an ultraviolet irradiating unit (resin curing unit) 53, a supporting unit 55, a cover 2050, and a control unit 2090. Structures in FIG. 15 that are the same as those of Embodiment 1 are assigned the same reference signs as those of FIG. 2. The stage 2031 holds the substrate WT in an orientation such that the forming face WTf for forming the resin part R on the substrate WT faces vertically downward (−Z direction).

By causing the head 2033H to face a position Pos2 for forming the resin part R on the substrate WT and then moving the head 2033H in the vertically upward direction (+Z direction), the head 2033H approaches the stage 2031, and the mold M is pressed against the stage 2031 from vertically below (−Z direction) the resin part R. In the state in which the head 2033H faces the position of formation of the resin part Ron the substrate WT, the imaging unit 2041 images, from vertically above (+Z direction) the mold M, below-described alignment marks (third alignment marks) MM1a and MM1b and below-described alignment marks (fourth alignment marks) MM2a and MM2b.

Figure 16:
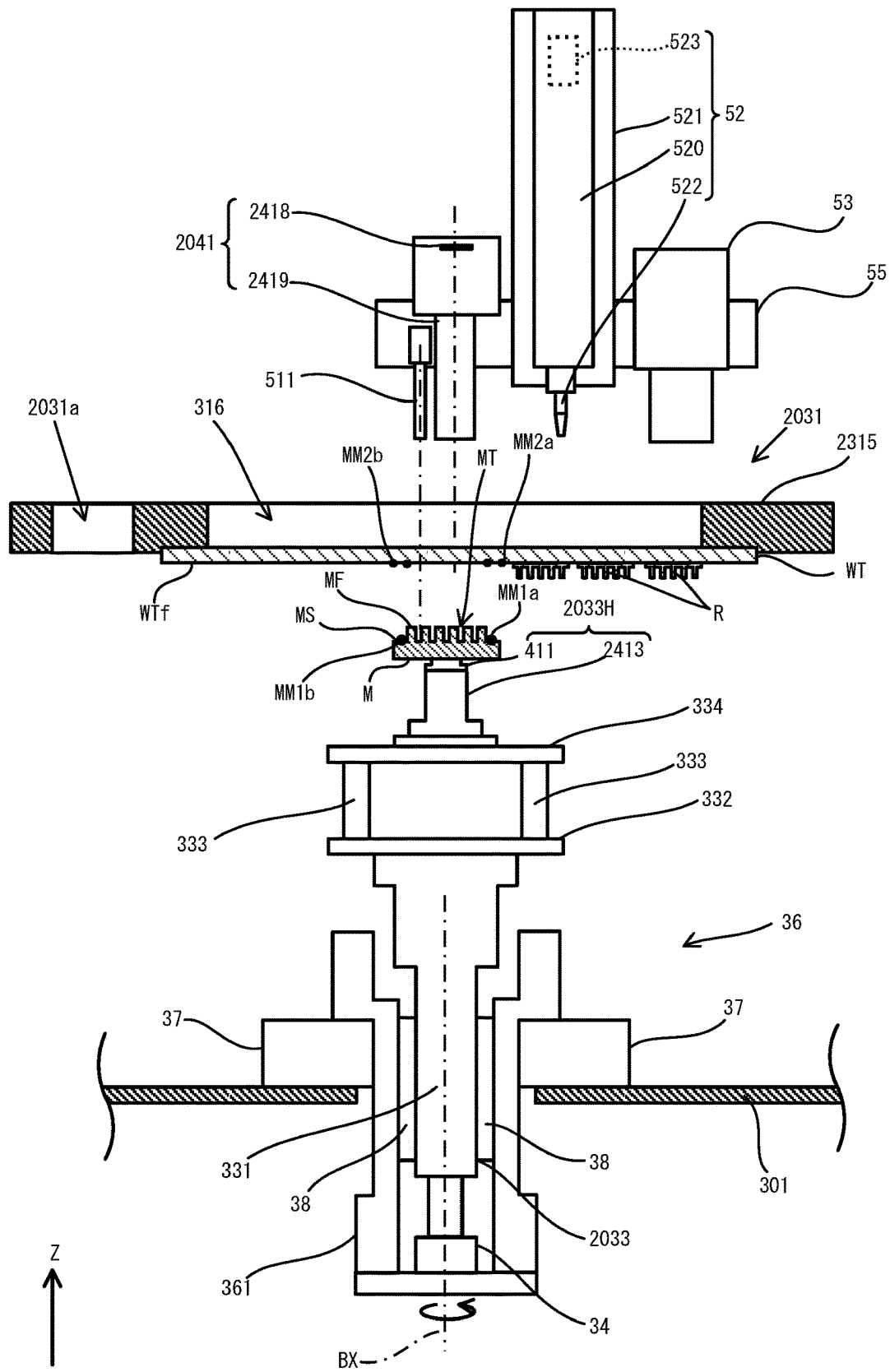
FIG. 16 is a schematic configuration view of part of the resin shaping device according to Embodiment 2.

As illustrated in FIG. 16, the bonding unit 2033 includes the Z direction movement member 331, the first disc member 332, the piezo actuator (mold orientation adjusting unit) 333, the second disc member 334, and the head 2033H. In FIG. 16, structures that are the same as in Embodiment 1 are assigned the same reference signs as in FIG. 3. The head 2033H holds by vacuum the mold M from the vertically downward direction (−Z direction). The head 2033H has the chip tool 411 and a head main unit 2413. The hollow part described in Embodiment 1 is not provided in the head main unit 2413. Three of the piezo actuators 333 exist, each of which operates separately in response to a control signal input from the control unit 2090. These piezo actuators 333 adjust orientation of the mold M on the basis of a distance measured by the distance measuring unit 511.

The mold M has concavities MT formed therein and is a molding member that has a flat surface MF that, in the state in which the mold M is attached by vacuum to the head 2033H, faces the surface for formation of the resin part R on the substrate WT. The mold M is made from a material such as a metal, glass, or ceramic. Moreover, a step part MS is formed in a peripheral part of the mold M, and the flat surface MF and the step part MS have flat surfaces capable of reflecting laser light.

The stage 2031 holds the substrate WT in an orientation such that the forming face WTf for forming the resin part R on the substrate WT faces vertically downward (−Z direction). The stage 2031 can move in the X direction and the Y direction. Due to such configuration, the relative positional relationship between the bonding unit 2033 and the stage 2031 can be changed, thereby enabling adjustment of the formation position of each resin part R on the substrate WT. The stage 2031 has a substrate placing unit 2315 provided with a through hole 2031a in a periphery thereof to allow insertion of a nozzle 522 of a dispenser 52.

The dispenser 52 forms the resin part R by dispensing ultraviolet light-curing resin on the forming face WTf of the substrate WT. The dispenser 52 has a main unit 520, a dispenser drive unit 521 for driving the main unit 520, the nozzle 522 that protrudes downward from the main unit 520, and a dispensing control unit 523 for control of a dispensing amount of the resin dispensed from the nozzle 522. The main unit 520 is connected via a non-illustrated supply line to a non-illustrated resin reservoir for storage of the resin, and the resin supplied from the resin reservoir is dispensed from the nozzle 522. The dispensing control unit 523 controls the dispensing amount of the resin dispensed from the nozzle 522 on the basis of a control signal input from the control unit 2090. The main unit 520 is capable of movement in the Z axis direction (see arrow AR6 in FIG. 15). The resin shaping device 2 firstly moves the stage 2031 in the X axis direction so as to overlap with the nozzle 522 and the through hole 2031a of the stage 2031 in the Z axis direction. Thereafter, the resin shaping device 2 uses the dispenser drive unit 521 to move the main unit 520 vertically below (−Z direction) the nozzle 522. Due to such operation, the dispenser 52 is in a dispensing preparation completed state in which preparation is completed for dispensing the resin into the concavity MT of the mold M and placing the resin in the mold M. Thereafter, the resin shaping device 2 pours the resin into the concavity MT of the mold M. Then the resin shaping device 2 uses the dispensing control unit 523 to pour the resin in the concavity MT of the mold M. Thereafter, the resin shaping device 2 uses the dispenser drive unit 521 to move the main unit 520 in the vertically upward direction (+Z direction), and the dispenser 52 enters a standby state.

The distance measuring unit 511 uses laser light to measure the distance between the forming face WTf for forming the resin part R on the substrate WT and the flat surface MF of the mold M disposed facing the substrate WT. Then the head drive unit 36, on the basis of the distance measured by the distance measuring unit 511, causes the head 2033H holding the mold M to approach the stage 2031 holding the substrate WT. Moreover, the distance measuring unit 511 measures the distance between the forming face WTf of the substrate WT and the flat surface MF of the mold M at three locations of the flat surface MF of the mold M. The distance measurement is not limited to measurement at three locations, and as long as distance is measured for at least three locations, measurement of the distance between the forming face WTf and the flat surface MF and measurement of parallelism of the flat surface MF relative to the forming face WTf are possible. Moreover, the measurement for at least three locations in order to adjust parallelism of the flat surface MF relative to the forming face WTf may be executed in a timely manner as required. Control may be used that, for each operation of pressing the mold MF against the substrate WT, measures the distance at only one location and then controls the gap between the forming face WTf of the substrate WT and the flat surface MF of the mold M.

In the state in which the mold M is disposed at the position of formation of the resin part R on the substrate WT as illustrated in FIG. 16, the imaging unit 2041 images, from vertically above (+Z direction) the substrate WT, the alignment marks (third alignment marks) MM1a and MM1b provided on the step part MS of the mold M and the alignment marks (fourth alignment marks) MM2a and MM2b provided on the substrate WT. The imaging unit 2041 is a so-called single-field camera, and without change of position in the XY directions, images sequentially the set of the alignment marks MM1a and MM2a and the set of alignment marks MM2a and MM2b. Then firstly in a state in which the distance between the alignment marks MM1a and MM1b and the alignment marks MM2a and MM2b is relatively long prior to pressing of the mold M, the resin shaping device 2 performs alignment (referred to hereinafter as "pre-alignment") while moving the imaging unit 2041 in the direction perpendicular to the focal direction axis. Thereafter, in the state in which the mold M is pressed against the substrate WT and the resin filling the concavity MT of the mold M contacts the forming face WTf of the substrate WT, resin-immersed alignment (referred to hereinafter as "immersion alignment") is performed by simultaneous single-image acquisition and recognition of the alignment marks MM1a and MM2a set and the alignment marks MM1b and MM2b set without movement on the respective focal axes. Due to such operation, highly accurate alignment is achieved since errors due to vibration and focal axes can be avoided by simultaneous recognition, positional displacement is corrected in a state in which the resin contacts the substrate WT after the resin is made to contact the substrate WT, and alignment is performed immediately prior to curing of the resin. In this alignment method, pre-alignment is executed beforehand in order to avoid an inability to recognize positional displacements of the alignment marks MM1a and MM1b and the alignment marks MM2a and MM2b simultaneously when such positional displacements are large. Moreover, in the state in which the resin filling the concavity MT of the mold M is made to contact the forming face WTf of the substrate WT, flowing of the resin is avoided due to lowering of the amount of movement of the mold M during the alignment.

However, in the case in which the alignment marks MM1a and MM1b are on the flat surface MF of the mold M, sometimes the images of the alignment marks MM1a and MM1b imaged by the imaging unit 2041 are out of focus due to bulging of a portion of the resin part R onto the part of the flat surface MF where the alignment marks MM1a and MM1b are provided. As a countermeasure, the alignment marks MM1a and MM1b are provided on the step part MS of the mold M. Due to such configuration, the imaging unit 2041 can image the alignment marks MM1a and MM1b through regions, between the substrate WT and the mold M, at which the resin part R is not interposed, thereby enabling good recognition of the alignment marks MM1a and MM1b.

The ultraviolet irradiating unit 53 cures the resin part R by irradiating the resin part R with ultraviolet light from vertically above (+Z direction) the substrate WT in a state in which the mold M is pressed against the resin part R formed on the substrate WT. This ultraviolet irradiating unit 53 includes, for example, a laser light source or a mercury lamp for irradiation with ultraviolet light.

The supporting unit 55 collectively supports the dispenser 52, the ultraviolet irradiating unit 53, the imaging unit 2041, and the distance measuring unit 511 and is capable of moving in the XY directions. Moreover, the supporting unit 55 is capable of moving in the Z axis direction. Such configuration enables focal adjustment by the imaging unit 2041. The dispenser 52, the ultraviolet irradiating unit 53, the imaging unit 2041, and the distance measuring unit 511 may be each supported separately by a supporting unit, and each of the supporting units may be configured to as to be capable of moving independently in the XY directions.

The cover 2050 is disposed so as to partition the space within the resin shaping device 2 into a space for disposal of the head drive unit 36 and a space for disposal of the stage 2031. Such configuration suppresses the attachment onto the head drive unit 36 of particles generated by the stage 2031.

Figure 17:
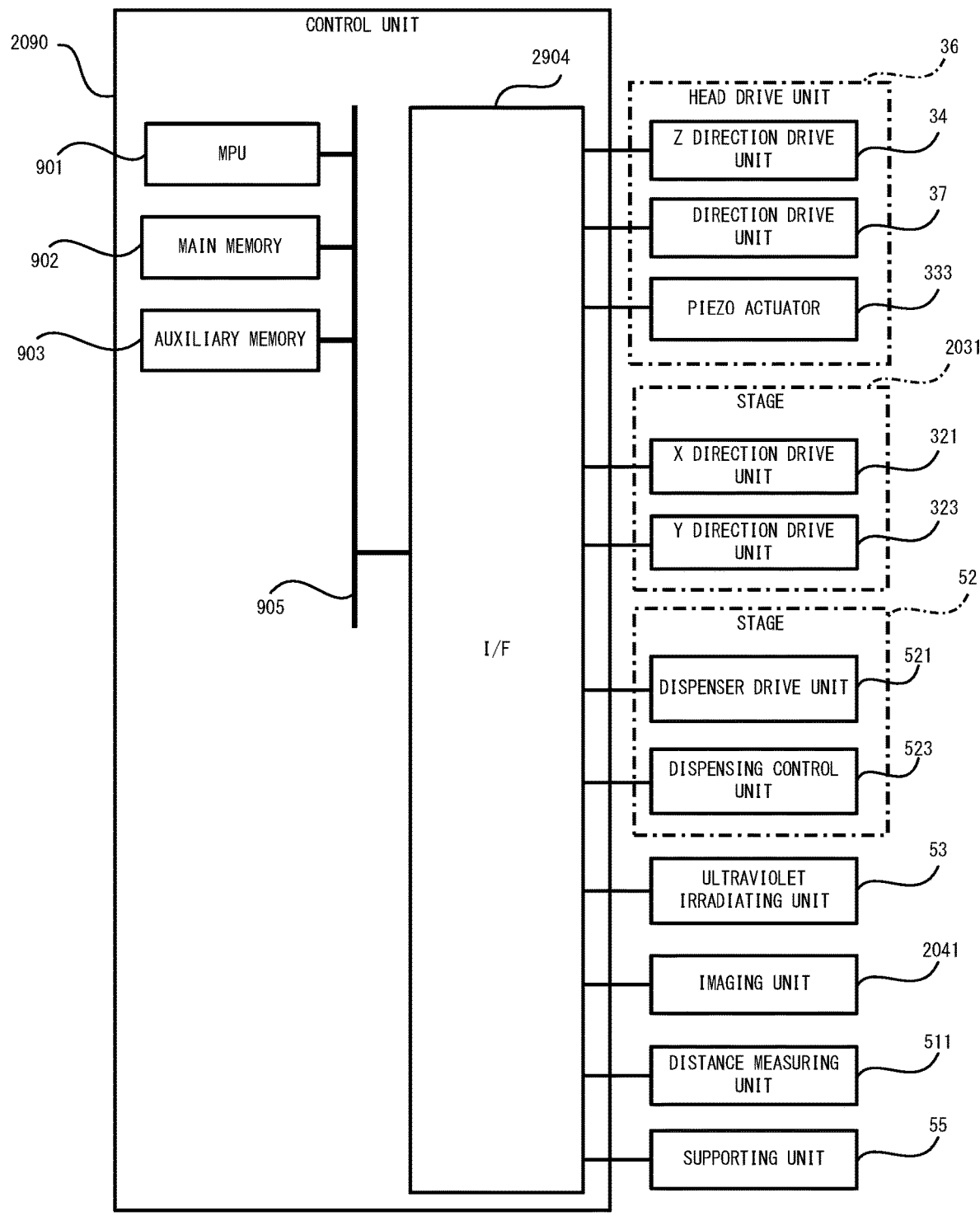
FIG. 17 is a block diagram illustrating a control unit according to Embodiment 2.

As illustrated in FIG. 17, the control unit 2090 has the micro processing unit (MPU) 901, the main memory 902, the auxiliary memory 903, the interface 2904, and the bus 905 interconnecting these components. Furthermore, structures in FIG. 17 that are the same as those of Embodiment 1 are assigned the same reference signs as those of FIG. 8. The interface 2904 converts a measurement signal input from the distance measuring unit 511 into measurement information, for output to the bus 905. Moreover, the interface 2904 converts the imaging image signal input from the imaging unit 2041 for output to the bus 905. By reading programs stored in the auxiliary memory 903 to the main memory 902 and then executing the read programs, the MPU 901 via the interface 2904 sends control is signals to the Z direction drive unit 34, the θ direction drive unit 37, the piezo actuator 333, the X direction drive unit 321, the Y direction drive unit 323, the dispenser drive unit 521, the dispensing control unit 523, the ultraviolet irradiating unit 53, and the supporting unit 55.

The control unit 2090 calculates the relative positional error between the substrate WT and the mold M by imaging the alignment marks MM1*a*, MM1*b*, MM2*a*, and MM2*b* in the state in which the mold M is pressed against the resin part R. Then in accordance with the calculated relative positional error, the control unit 2090 uses the Z direction drive unit 34 and the θ direction drive unit 37 of the head drive unit 36 and the X direction drive unit 321 and the Y direction drive unit 323 of the stage 2031 to correct the position and orientation of the mold M relative to the substrate WT. In this case, after completion of the correction of the position and orientation of the mold M relative to the substrate WT, the ultraviolet irradiating unit 53 irradiates the resin part R with ultraviolet light.

Figure 18:
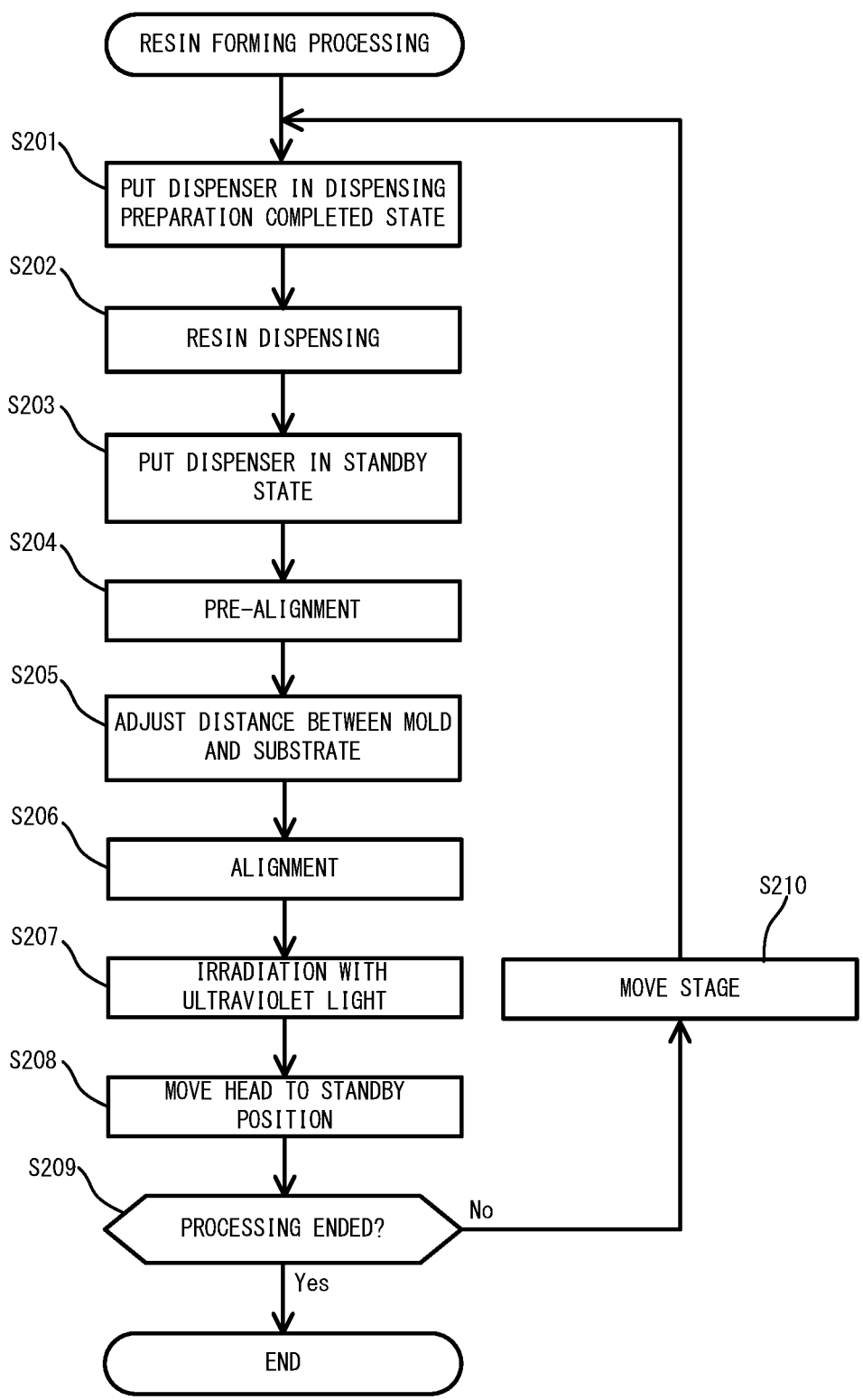
FIG. 18 is a flowchart illustrating an example of resin forming processing executed by the resin shaping device according to Embodiment 2.

Imprint processing executed by the resin shaping device 2 according to the present embodiment is described next with reference to FIGS. 18 to 21C. This nano-imprint processing begins by starting of a program for the control unit 2090 to execute the imprint processing. In FIG. 18, the resin shaping device 2 is taken to use the stage 2031 to hold the substrate WT and to use the head 2033H to hold the mold M. Here, the stage 2031 holds the substrate WT in an orientation such that the forming face WTf for forming the resin part R on the substrate WT faces vertically downward (substrate holding step). Moreover, the head 2033H holds the mold M from vertically below (mold holding step).

Figure 19:
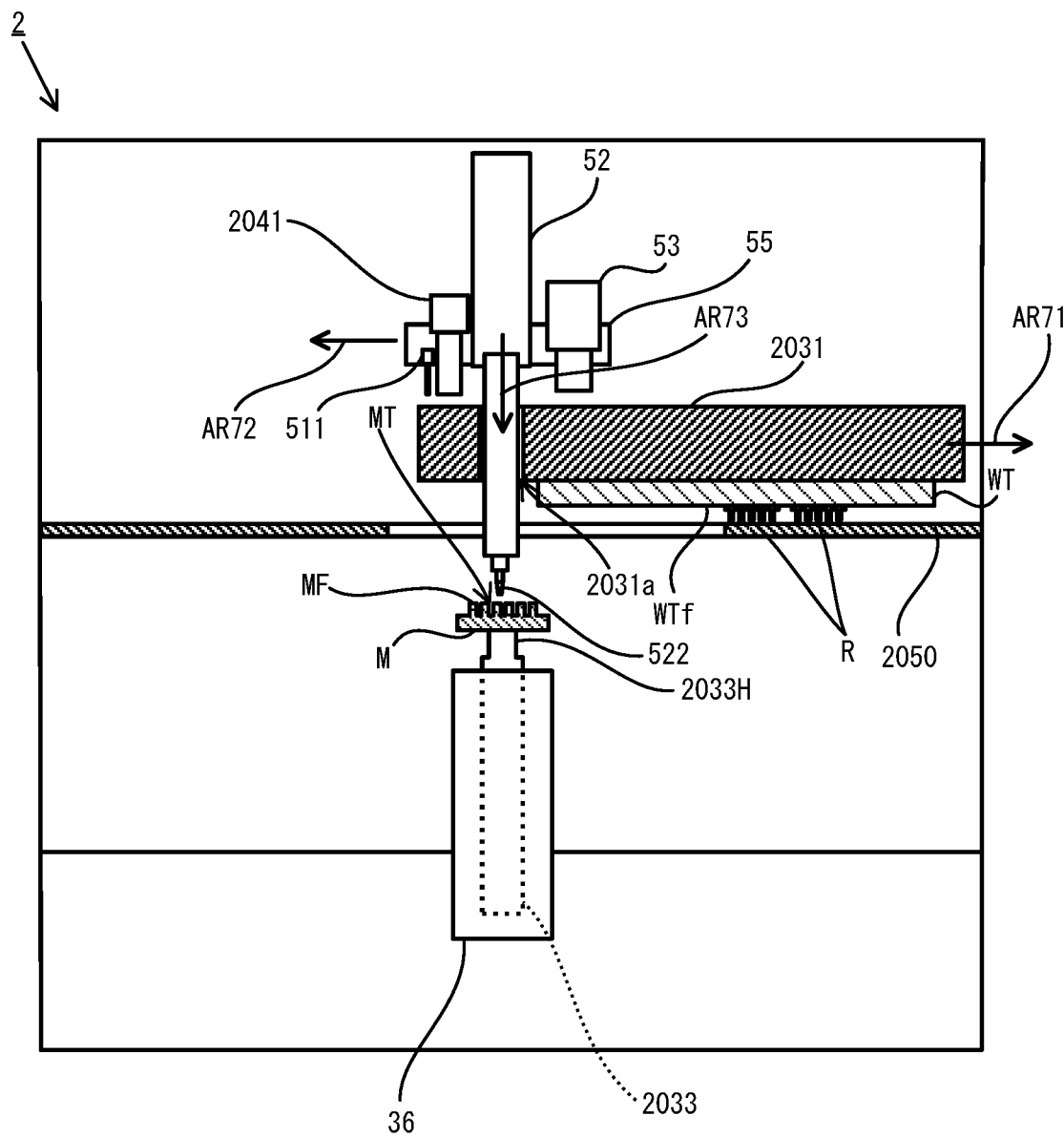
FIG. 19 is a drawing illustrating conditions under which, for the resin shaping device according to Embodiment 2, a resin is poured into a mold by a dispenser.

Firstly, the resin shaping device 2 causes the supporting unit 55 to move such that the dispenser 52 is in a state positioned vertically above (+Z direction) the head 2033H in the Z direction (see arrow AR72 in FIG. 19). Thereafter, the resin shaping device 2 causes the stage 2031 to move such that the dispenser 52 and the through hole 2031*a* of the stage 2031 overlap (see arrow AR71 in FIG. 19). Thereafter, the resin shaping device 2 causes the disperser drive unit 521 to lower the main unit 520 vertically lower (−Z direction) so that the nozzle 522 approaches the mold M as illustrated in FIG. 19. In this manner, the resin shaping device 2 places the dispenser 52 in the dispensing preparation completed state as illustrated in FIG. 18 (step S201).

Figure 20:
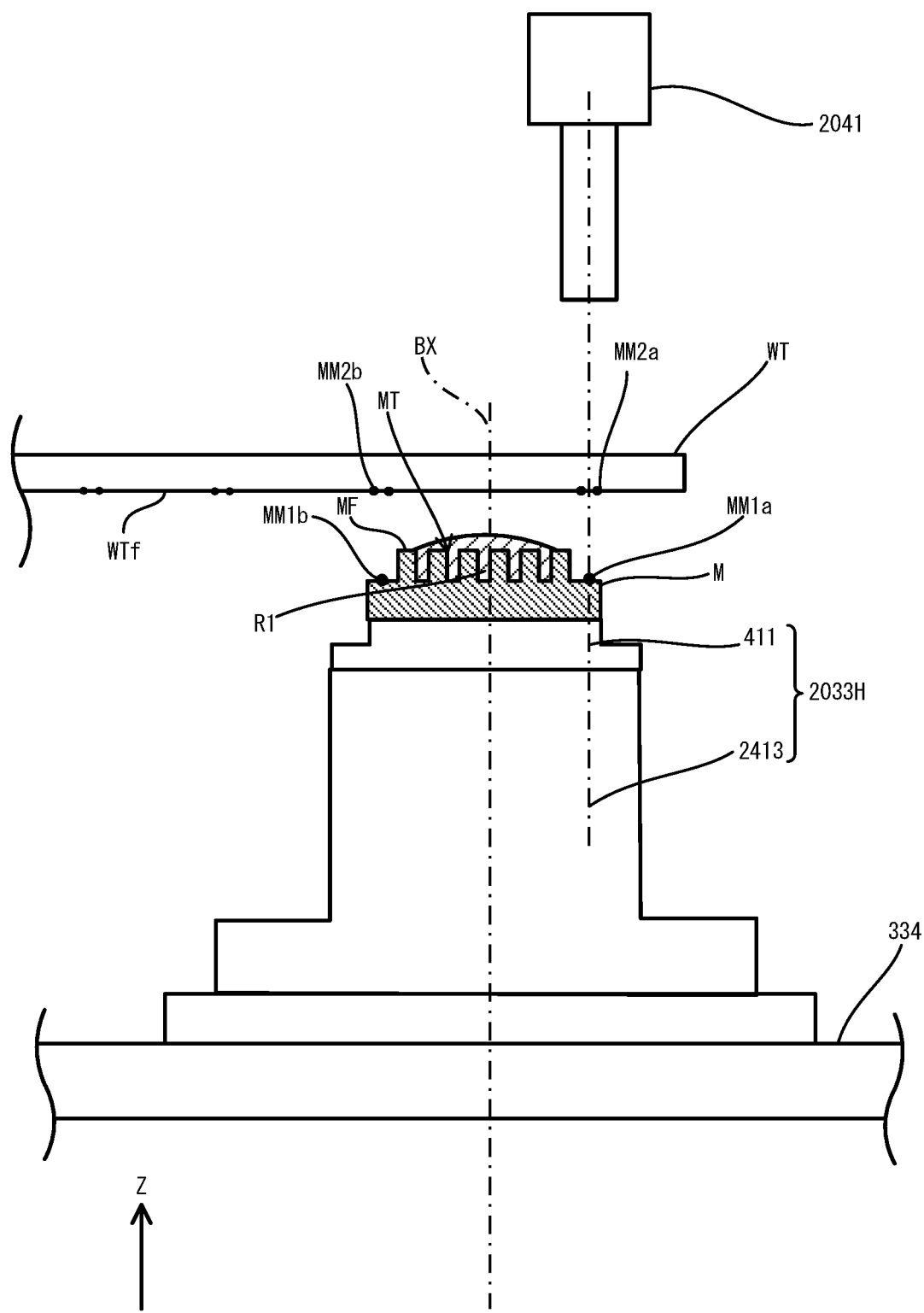
FIG. 20 is a drawing illustrating details of a head according to Embodiment 2.

Next, the resin shaping device 2 causes the dispensing control unit 523 to dispense the predetermined dispensing amount of the resin into the concavity MT of the mold M from the nozzle 522 (step S202, dispensing step). That is to say, the dispenser 52 dispenses the resin into the concavity MT of the mold M held by the head 2033H. Due to such operation, a state results in which the inner part of the concavity MT of the mold M is filed by a resin R1 as illustrated in FIG. 20, for example.

Thereafter, the resin shaping device 2 causes the dispenser drive unit 521 to move the main unit 520 of the dispenser 52 vertically upward (+Z direction). Due to such operation, the resin shaping device 2 puts the dispenser 52 in the standby state as illustrated in FIG. 18 (step S203).

Thereafter, the resin shaping device 2 causes movement of the stage 2031 for placement in a state in which the head 2033H and the position for forming the resin part R on the substrate WT overlap in the Z direction. Then the resin shaping device 2 executes pre-alignment of the mold M held by the head 2033H (step S204). That is to say, in a state in which the distances between the alignment marks MM1*a* and MM1*b* and the alignment marks MM2*a* and MM2*b* are relatively long prior to pressing of the mold M, the resin shaping device 2 performs pre-alignment by causing the imaging unit 2041 to move in the direction perpendicular to the focal direction. At this time, the distance between the flat surface MF of the mold M and the forming face WTf of the substrate WT is set to roughly several mm.

Then the resin shaping device 2 firstly raises the head 2033H so that the mold M held by the head 2033H approaches the position of formation of the resin part R on the substrate WT. As illustrated in FIG. 20, the alignment marks MM1*a* and MM1*b* are provided on the mold M, and the alignment marks MM2*a* and MM2*b* are provided at the position of formation of the resin part R on the substrate WT. Then the resin shaping device 2 executes the pre-alignment operation to pre-align the mold M and the substrate WT by using the alignment marks MM1*a* and MM1*b* provided on the mold M and the alignment marks MM2*a* and MM2*b* provided on the position of formation of the resin part R on the substrate WT. In the pre-alignment operation, the resin shaping device 2 executes rough positioning of the mold M relative to the substrate \VT to be in a state such that neither the alignment marks MM1*a* and MM1*b* of the mold M nor the alignment marks MM2*a* and MM2*b* of the substrate WT mutually overlap when brought into focus.

Figure 21A:
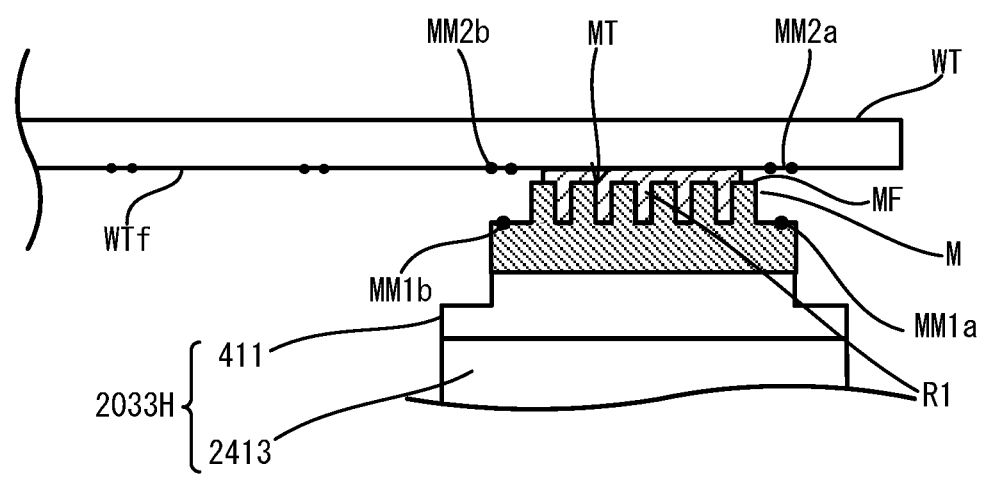
FIG. 21A is a drawing illustrating conditions under which the mold held by the head according to Embodiment 2 is pressed against the resin part.

Thereafter, the resin shaping device 2 uses the distance measuring unit 511 to measure the distance between the forming face WTf of the substrate WT and the flat surface MF of the mold M to adjust the distance between the mold M and the substrate WT (step S205). The resin shaping device 2 adjusts the distance between the forming face WTf of the substrate WT and the flat surface MF of the mold M to be a distance of several mμ to several tens of mμ. At this time, the mold M is in a state of approach to the substrate WT that results in a portion of the resin R1 bulging at an outer peripheral part of the concavity MT of the mold M as illustrated in FIG. 21A. At this time, the head drive unit 36 causes the head 2033H to approach the stage 2031 by causing the head 2033H to face the position for forming the resin part R on the substrate WT and then moving the head 2033H vertically upward to press the mold M against the substrate WT from vertically below (mold pressing step).

Thereafter, the resin shaping device 2 executes alignment again (referred to also as "immersion alignment") in a state in which the resin R1 placed in the mold M is contacted against the forming face WTf of the substrate WT as illustrated in FIG. 21A (step S206). In this case, the resin shaping device 2 simultaneously recognizes the set of the alignment marts MM1a and MM2a and the set of alignment marks MM1b and MM2b in a single imaging operation without movement of the focal axes. Due to such operation, the resin shaping device 2 can perform highly accurate relative alignment of the mold M relative to the substrate WT without being affected by vibration or accuracy of the focal axes of the imaging unit 2041. Moreover, highly accurate alignment can be achieved by executing alignment to correct positional displacements in a state in which the resin is made to contact the substrate WT immediately prior to curing the resin and after contacting the resin filling the concavity MT of the mold MT against the forming face WTf of the substrate WT in this manner.

Here, the resin shaping device 2 via the imaging unit 2041 acquires the image data Ga that includes the image of the alignment mark MM1a provided on the mold M and the image of the alignment mark MM2a provided on the substrate WT. The resin shaping device 2 then, on the basis of the image data Ga, recognizes the positions of the set of marks MM1a and MM2a provided on the mold M and the substrate WT, and calculates the positional displacement amounts Δxa and Δya between this set of marks MM1a and MM2a. Moreover, the resin shaping device 2 in a similar manner acquires the image data Gb that includes the image of the alignment mark MM1b provided on the mold M and the image of the alignment mark MM2b provided on the substrate WT. Then the resin shaping device 2 in a manner similar to that described above, on the basis of the image data Gb, recognizes the positions of the set of marks MM1a and MM2a provided on the mold M and the substrate WT, and calculates the positional displacement amounts Δxb and Δyb between this set and the marks MM1b and MM2b. Then on the basis of the positional displacement amounts Δxa, Δya, Δxb, and Δyb of these two sets of alignment marks MM1a, MM2a, MM1b, and MM2b, the resin shaping device 2 calculates relative positional displacement amounts Δx, Δy, and Δθ between the chip CP and the substrate WT occurring in the X direction, Y direction, and around the axis BX. This Δx, Δy, and Δθ have the same meanings as in the case of Embodiment 1. Thereafter, the resin shaping device 2, in order to decrease the calculated relative positional displacement amounts, drives the stage 2031 in the X direction and Y direction and also causes rotation of the bonding unit 2033 around the axis BX. The resin shaping device 2 in this manner executes the alignment operation to correct the relative positional displacement between the mold M and the substrate WT.

Figure 21B:
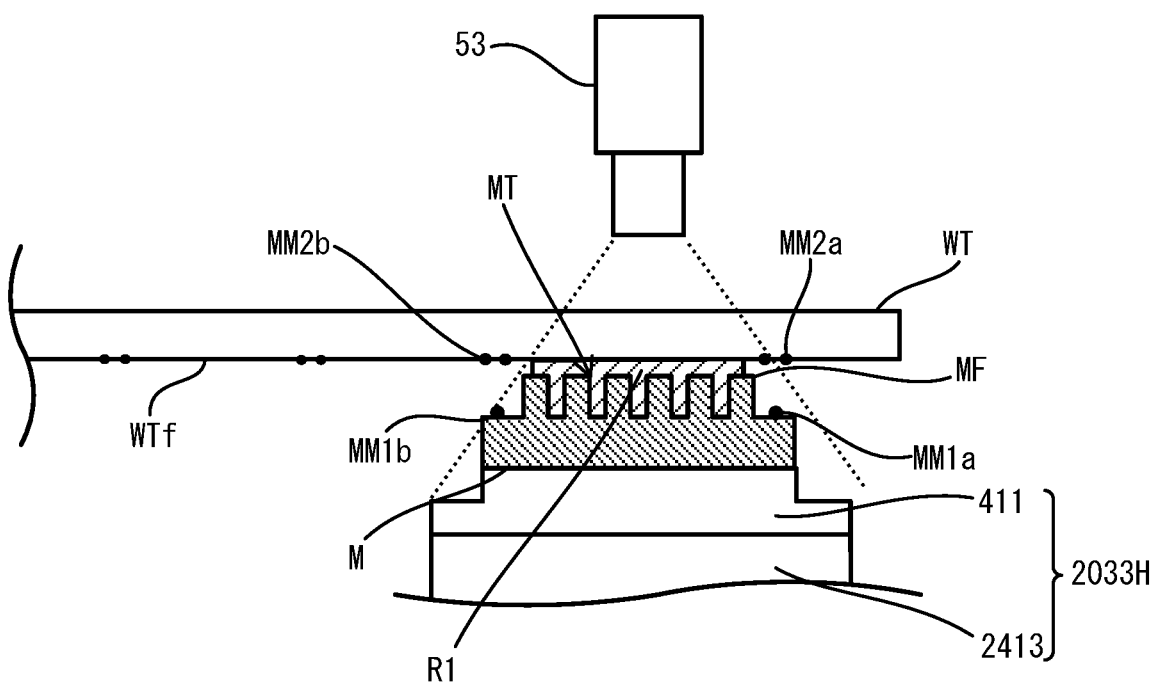
FIG. 21B is a drawing illustrated conditions under which the resin part is irradiated with ultraviolet light by an ultraviolet irradiating unit according to Embodiment 2.

Thereafter, as illustrated in FIG. 21B, the resin shaping device 2 irradiates the resin R1 with ultraviolet light emitted from the ultraviolet irradiating unit 53 (step S207). Here, the ultraviolet irradiating unit 53 cures the resin R present within the concavity MT by irradiating with ultraviolet light in the state in which the mold M is pressed against the resin R1 (resin curing step).

Figure 21C:
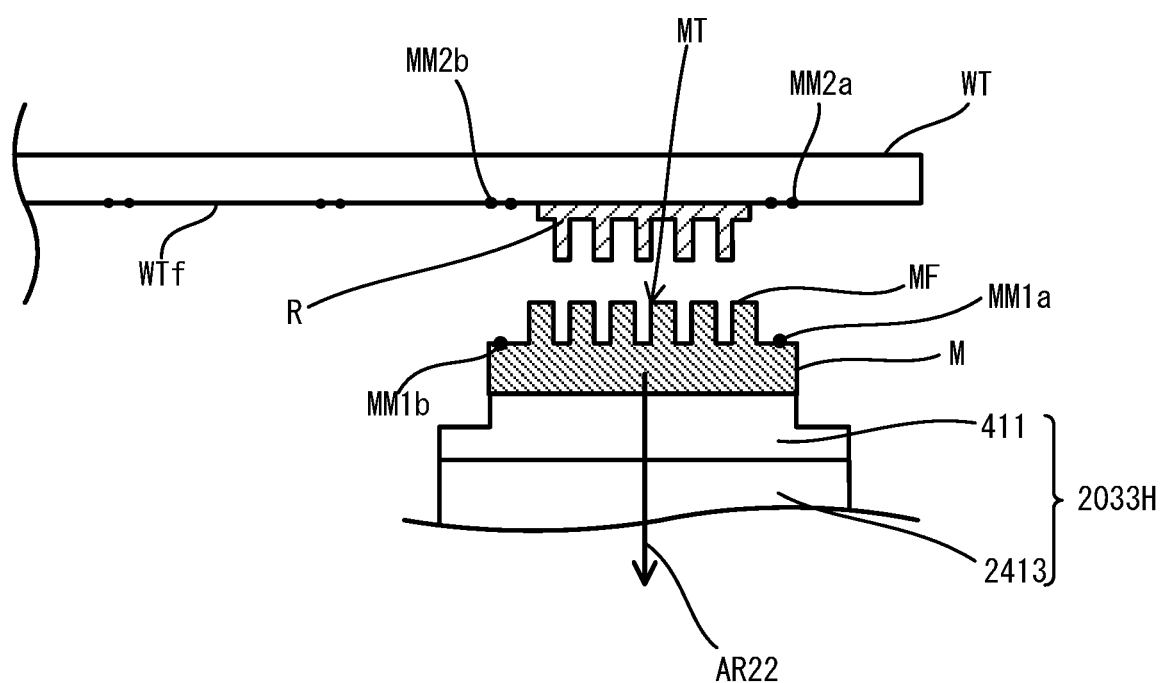
FIG. 21C is a drawing illustrating conditions under which the head according to Embodiment 2 is moved vertically downward.

As indicated by arrow AR22 in FIG. 21C, the resin shaping device 2 causes the head 2033H to lower, thereby moving the head 2033H to the standby position (step S208). The resin part R is formed on the substrate WT in this manner.

As illustrated in FIG. 18, the resin shaping device 2 thereafter determines whether the imprint processing is completed (step S209). In cases such as when a command is input to end the imprint processing or when the program sequence of predetermined imprint processing is entirely completed, for example, the resin shaping device 2 decides to finish the imprint processing. Upon determination to continue the imprint processing (NO in step S209), the resin shaping device 2 causes movement of the stage 2031 so that the head 2033H faces the part of the substrate WT for forming the next resin part R (step S210). Then the processing of step S201 is executed again. Then by repeated execution of the processing of the series of steps S201 to S209, the multiple resin parts R are formed on the substrate WT by the so-called step and repeat method. However, upon determination by the resin shaping device 2 that the imprint processing is completed (YES in step S209), the imprint processing ends.

According to the resin shaping device 2 according to the present embodiment in the aforementioned manner, the stage 31 holds the substrate WT in an orientation such that the face for forming the resin part R on the substrate WT faces vertically downward. Moreover, by causing movement of the head 2033H in the vertically upward direction at the position for pressing against the position for formation of the resin part R on the substrate WT, the head drive unit 36 causes the head 2033H to approach the stage 31 so that the mold M presses from vertically below the resin part R. Then in the state in which the mold M is pressed against the resin part R, the ultraviolet irradiating unit 53 cures the resin part R by irradiating the resin part with ultraviolet light. Due to such operation, the attachment of particles to the surfaces for forming the resin part R of the substrate WT can be decreased, and thus particle contamination of the interface between the resin part R and the substrate WT can be suppressed. Therefore, such operation enables suppression of the occurrence of malfunctioning products caused by particle contamination of the interface between the resin part R and the substrate WT of products for which the resin part R is formed on the substrate WT. Specifically, as described in the present embodiment, when a sub-micron order pattern (such as about 10 nm) is formed by nano-imprinting on the substrate WT, defects may occur in the formed pattern when particles such as trash and grease are on the substrate WT. In such a case, functionality of the substrate WT may be affected.

Moreover, according to the resin shaping device 2 according to the present embodiment, by the head drive unit 36 causing vertically upward movement of the head 2033H at the position for pressing and facing the position of formation of the resin part R on the substrate WT, the head 2033H approaches the stage 31 so that the mold M is pressed from vertically below the resin part R. Due to filling of the mold M from vertically above with resin from the dispenser 52, incorporation of air in the resin part R can be prevented. Due to such operation, intermixing of air at the interface between the resin part R and the inner surface of the concavity MT of the mold M hardly occurs, and thus the occurrence of formation failures in the resin part R due to intermixing of air at the interface between the resin part R and the inner surface of the concavity MT is suppressed.

The resin shaping device 2 according to the present embodiment is further equipped with the dispenser 52 for dispensing the resin in the concavity MT of the mold M held by the head 2033H. Due to such configuration, the series of processing after forming the resin part R on the forming face WTf of the substrate WT until the curing of the resin part R can be repeatedly executed by the resin shaping device 2, and thus the steps to manufacture the product in which the resin parts R are formed on the substrate WT can be simplified.

Moreover, according to the resin shaping device 2 according to the present embodiment, the imaging unit 2041 images the alignment marks MM1a and MM1b of the mold M and the alignment marks MC2a and MC2b of the substrate WT from vertically above (+Z direction) the mold M in the state in which the head 2033H is made to face the position of formation of the resin part R on the substrate WT. Due to the ability to recognize with good accuracy the alignment marks MM1a and MM1b of the mold M and the alignment marks MM2a and MM2b of the substrate WT due to such configuration, the resin shaping device 2 thus has the advantage of improving accuracy of alignment of the mold M relative to the substrate WT.

Furthermore, the control unit 2090 according to the present embodiment calculates the relative positional error between the substrate WT and the mold M on the basis of the imaging of the alignment marks MM1a, MM1b, MM2a, and MM2b in the state in which the mold M is pressed against the resin part R. Also, in response to the calculated relative positional error, the control unit 2090 causes the Z direction drive unit 34 and the θ direction drive unit 37 of the head drive unit 36 and the X direction drive unit 321 and the Y direction drive unit 323 of the stage 2031 to correct the position and orientation of the mold M relative to the substrate WT. Due to such operation, the resin shaping device 2 can execute alignment of the mold M relative to the substrate WT with good accuracy.

Moreover, the resin shaping device 2 according to the present embodiment is equipped with the distance measuring unit 511 for measuring the distance between the flat surface MF of the mold M and the forming face WTf of the substrate WT by use of laser light. The distance measuring unit 511 measures the distance between the forming face WTf of the substrate WT and the flat surface MF of the mold M by irradiating with laser light from above the substrate WT and the mold M. Then the head drive unit 36 causes the head 2033H holding the mold M to approach the stage 2031 holding the substrate WF on the basis of the distance measured by the distance measuring unit 511. Due to such operation, within the resin part R, thickness of the bulging part at the outer peripheral part of the concavity MT can be controlled in the state in which the mold M is pressed against the resin part R, thereby enabling the resin shaping device 2 to adjust the shape of the resin part R with high accuracy.

Furthermore, the resin shaping device 2 according to the present embodiment is equipped with the piezo actuator 333 that changes the orientation of the mold M on the basis of the distance measured by the distance measuring unit 511. Moreover, the distance measuring unit 511 measures the distance between the forming face WTf of the substrate WT and the flat surface MF of the mold M for at least three locations on the flat surface MF of the mold M. Such operation enables holding of the mold M by the head 2033H such that the flat surface MF of the mold M and the forming face WTf of the substrate WT become parallel, for example. Such operation thus enables an increase in degree of accuracy of the shape of the resin part R.

Modified Examples

Although various embodiments of the present disclosure are described above, the present disclosure is not limited to the configurations of the aforementioned embodiments. For example, the chip mounting system 1 according to Embodiment 1 may be configured such that the light source for irradiating the substrate WT and the chip CP with light is disposed above the stage 31. In this case, by use of transmitted light transmitted through the substrate WT and the chip CP irradiated from the light source disposed above the stage 31, the first imaging units 35a and 35b may acquire the images that included the alignment marks MC1a, MC1b, MC2a, and MC2b. Moreover, the resin shaping device 2 according to Embodiment 2 may also be configured with the light source for irradiation with light transmitted through the substrate WT and the mold M disposed below the stage 2031. In this case, by use of the transmitted light transmitted through the substrate WT and the mold M irradiated from the light source disposed below the stage 31, the first imaging units 35a and 35b may acquire the images that include the alignment marks MM1a, MM1b, MM2a, and MM2b.

Figure 22:
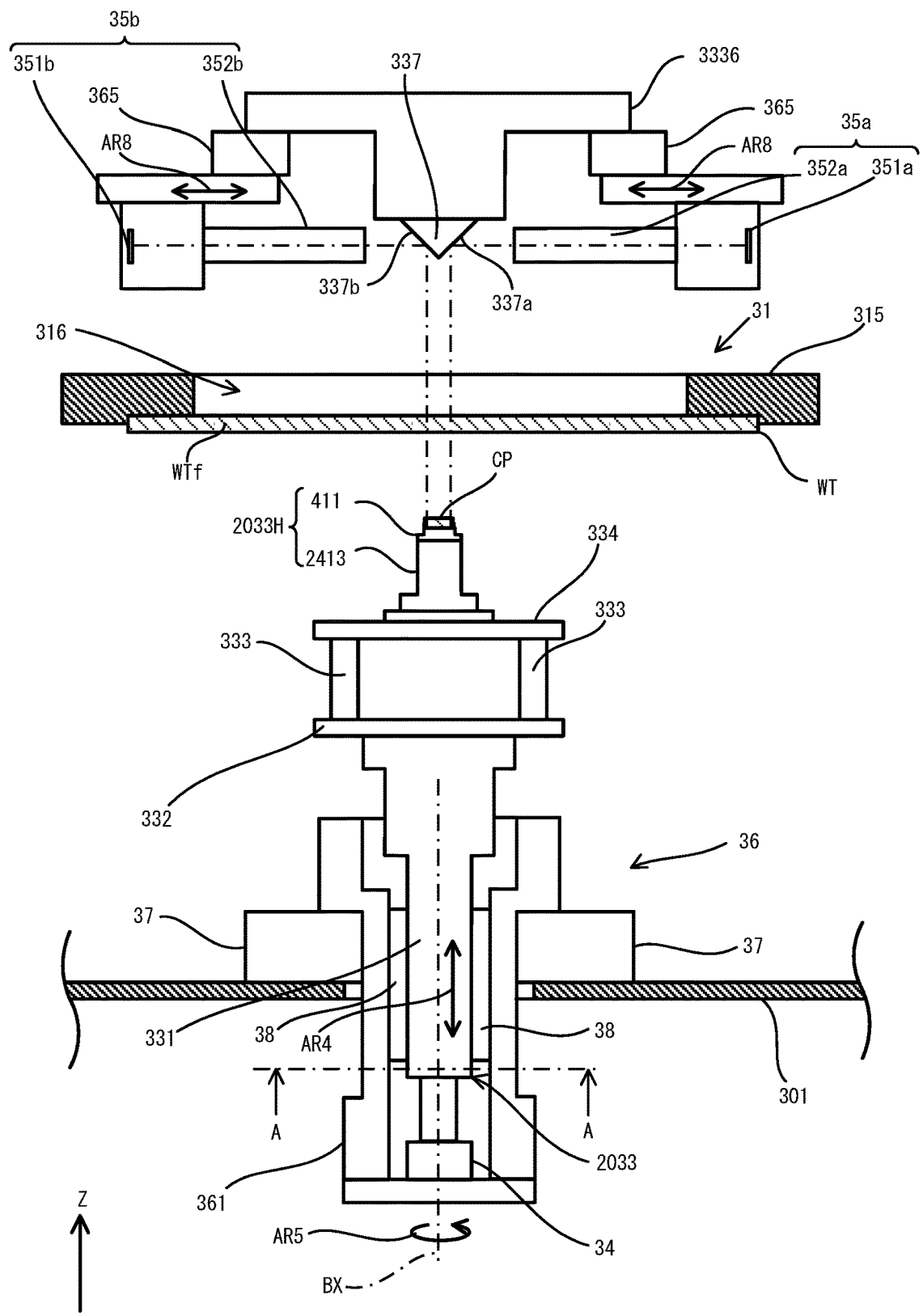
FIG. 22 is a schematic configuration view of a component mounting system according to a modified example.

In Embodiment 1, a configuration is described in which the two first imaging units 35a and 35b acquire from below the chip CP the images that include the alignment marks MC1a, MC1b, MC2a, and MC2b of the substrate WT and the chip CP. However, this configuration is not limiting. For example, as illustrated in FIG. 22, a configuration may be used in which the first imaging units 35a and 35b take the images that include the alignment marks MC1a, MC1b, MC2a, and MC2b of the substrate WT and the chip CP from above the stage 31. Furthermore, structures in FIG. 22 that are the same as those of Embodiment 1 are assigned the same reference signs as those of FIG. 3. In this case, the camera F direction drive unit 365 and the mirror 337 are fixed in common to a base member 3336.

Figure 23A:
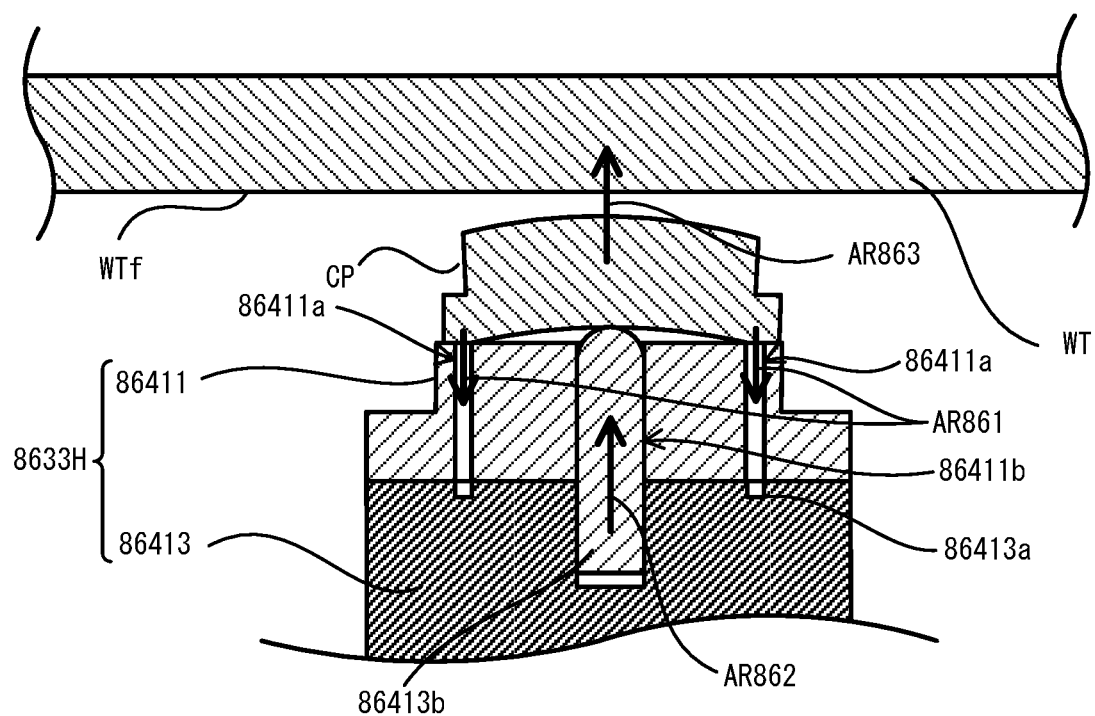
FIG. 23A is a schematic configuration view of a component mounting system according to another modified example.

The Embodiment 1 may be configured, for example, as illustrated in FIG. 23A, by providing a bonding device that has a head 8633H provided with a pressing part 86413b for pressing a central part of the chip CP in the vertically upward direction in the state in which the peripheral part of the chip CP is held. The head 8633H has a chip tool 86411 and a head main unit 86413. The head main unit 86413 has a suction part 86413a for vacuum suction attachment of the chip CP to the chip tool 86411, has at the central part thereof the pressing part 86413b that is capable of moving in the vertical direction, and has a non-illustrated pressing drive unit that drives the pressing part 86413b. Moreover, the head main unit 86413 has a non-illustrated suction part for fixing the chip tool 86411 to the head main unit 86413 by vacuum suction attachment. Such configuration is advantageous in that replacement of the chip tool 86411 is easy. When the pressing part 86413b is moved vertically upward in the state in which the chip CP is held by the chip tool 86411, the central part of the chip CP is pressed while facing vertically upward. The chip tool 86411 has a through hole 86411a formed at a position corresponding to the suction part 86413a of the head main unit 86413 and a through hole 86411b in which the pressing part 86413b is inserted. Furthermore, a non-illustrated hollow part is provided in the head main unit 86413 similarly to the head main unit 413 according to Embodiment 1. The suction part 86413a and the through hole 86411a function as a peripheral part holding unit that holds the peripheral part of the chip CP.

The bonding device having the head 8633H illustrated in FIG. 23A drives (see arrow AR862 in FIG. 23A) the pressing part 86413b in the vertical direction in the state (see arrow AR861 in FIG. 23A) in which the peripheral part of the chip CP is attached by suction to the chip tool 86411. Due to such configuration, the chip CP is in a bent state in which the central part thereof protrudes toward the substrate WT more than the peripheral part thereof (arrow AR863 of FIG. 23A). Then by causing the head 8633H to approach the substrate WT in the state in which the chip CP is bent, the head drive unit of the bonding device causes the central part of the chip CP to contact the mounting face WTf of the substrate WT. That is to say, in a bend state in which the central part of the chip CP protrudes toward the substrate WT more in comparison to the peripheral part due to the suction part 86413a and the through hole 86411a holding the peripheral part of the chip CP and the pressing part 86413b pressing the central part of the chip CP, the head drive unit causes the head 8633H to move in the vertical direction so as to approach the non-illustrated stage holding the substrate WT and cause the central part of the chip CP to contact the mounting face WTf of the substrate WT. The bonding device may cause the central part of the chip CP to contact the mounting face WTf of the substrate WT by bending the chip CP after movement of the head 8633H in the vertical direction to approach to the substrate WT by the predetermined distance. Thereafter, by causing the head 8633H to further approach the substrate WT while inserting the pressing part 86413b in the vertically downward direction, the bonding device mounts the chip CP on the substrate WT.

Figure 23B:
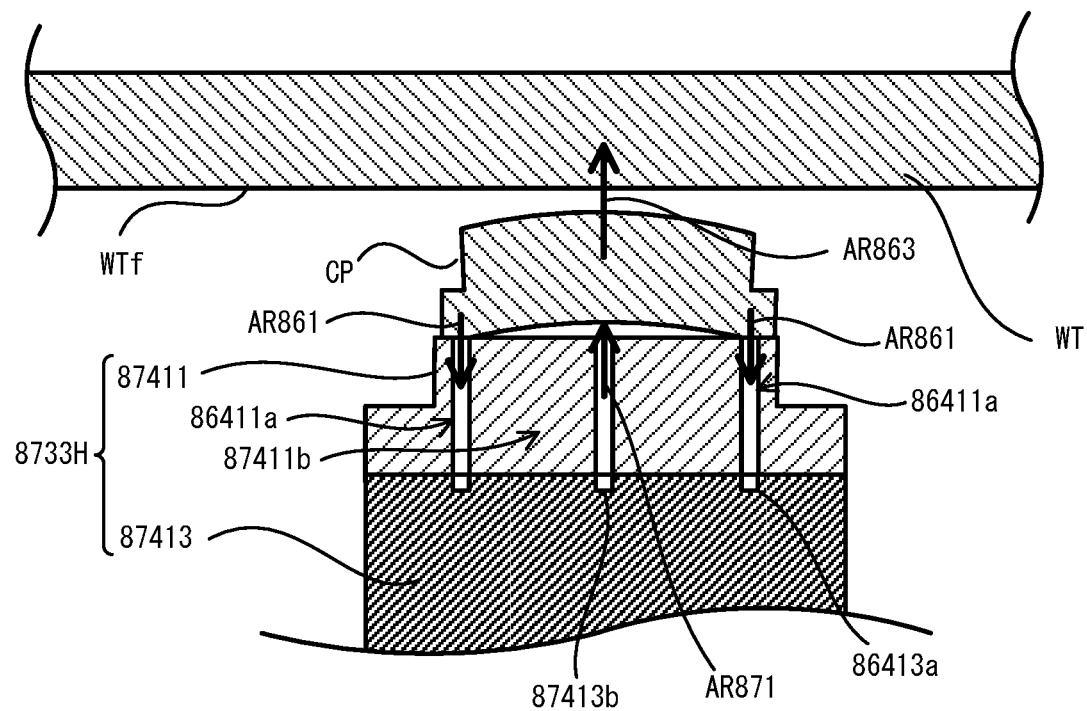
FIG. 23B is a schematic configuration view of a component mounting system according to yet another modified example.

Embodiment 1 may be configured to have a head 8733H such as that illustrated in FIG. 23B, for example. Furthermore, structures in FIG. 23B that are the same as those illustrated in FIG. 23A are assigned the same reference signs as those of FIG. 23A. The head 8733H has the chip tool 87411 and the head main unit 87413. The head main unit 87413 has a suction part 86413a, and a dispensing port 87413b for dispensing air that is positioned further than the suction part 86413a toward the central part. The head main unit 87413 has a non-illustrated suction part for fixing the chip tool 87411 by vacuum suction attachment to the head main unit 87413. The chip tool 87411 has a through hole 86411a formed at a position corresponding to the suction part 86413a of the head main unit 87413 and a through hole 87411b formed at a position corresponding to the dispensing port 87413b.

The bonding device that has the head 8733H illustrated in FIG. 23B dispenses air (see arrow AR871 in FIG. 23B) in a region between the chip tool 87411 and the central part of the chip CP in a state (see arrow AR861 in FIG. 23B) in which the peripheral part of the chip CP is attached by suction to the chip tool 87411. Due to such configuration, the chip CP is in a bent state in which the central part thereof protrudes toward the substrate WT more than the peripheral part thereof (arrow AR863 of FIG. 23B). Then by causing the head 8733H to move in the vertical direction in the state in which the chip CP is bent so as to approach the non-illustrated stage holding the substrate WT, the bonding device causes the central part of the chip CP to contact the mounting face WTf of the substrate WT. The bonding device may cause the central part of the chip CP to contact the mounting face WTf of the substrate WT by bending the chip CP after movement of the head 8733H in the vertical direction to approach to the substrate WT by the predetermined distance. Thereafter, by causing the head 8733H to further approach the substrate WT while decreasing the dispensed air from the dispensing port 87413, the bonding device causes the head 8733 to further approach the substrate WT, and thus mounts the chip CP on the substrate WT.

Figure 24A:
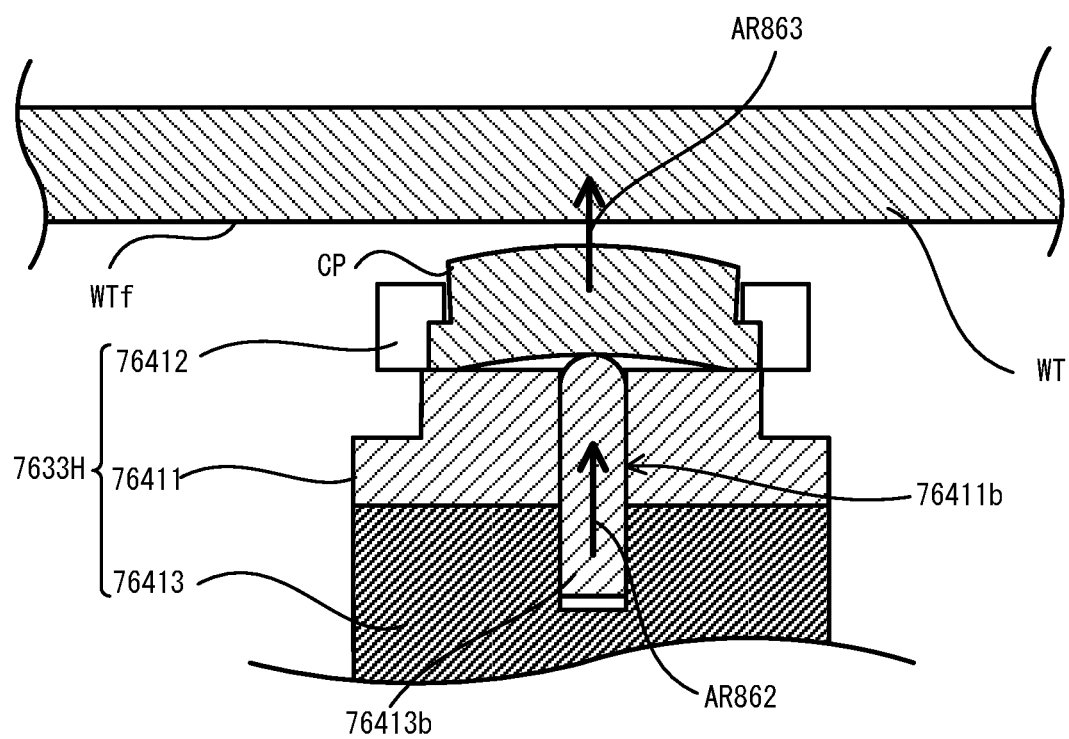
FIG. 24A is a schematic configuration view of a component mounting system according to yet another modified example.
Figure 24B:
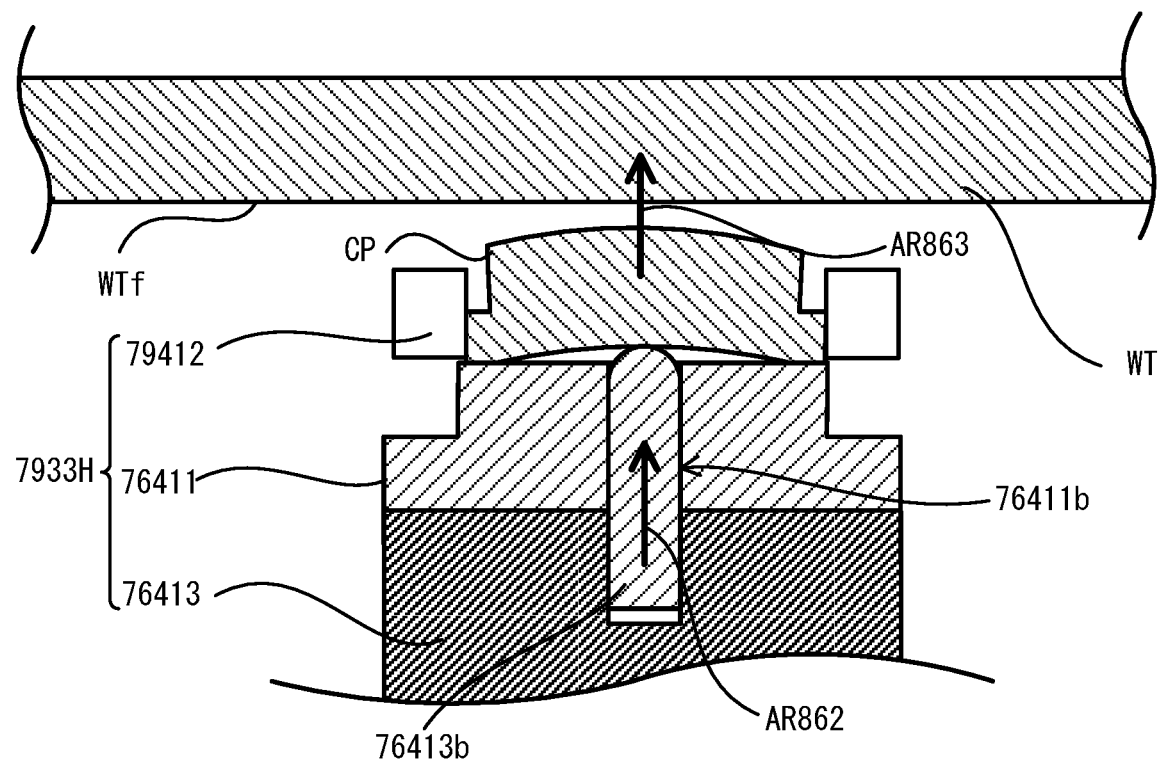
FIG. 24B is a schematic configuration view of a component mounting system according to yet another modified example.

Alternatively, Embodiment 1 may be configured to have a head 7633H such as that illustrated in FIG. 24A, for example. Furthermore, structures in FIG. 24A that are the same as those illustrated in FIG. 23A are assigned the same reference signs as those of FIG. 23A. The head 7633H has a chip tool 76411, a head main unit 76413, and a clamp 76412 for holding the peripheral part of the chip CP. The head main unit 76413 at the central part thereof has a pressing part 76413b capable of movement in the vertical direction and a non-illustrated pressing drive unit that drives a pressing part 76413a. The bonding device that has the head 7633H illustrated in FIG. 24 drives the pressing part 76413b in the vertical direction (see arrow AR862 in FIG. 24A) in a state in which the peripheral part of the chip CP is held by the clamp 76412. Due to such operation, the chip CP is in a bent state in which the central part thereof protrudes more than the peripheral part thereof toward the substrate WT (arrow AR863 in FIG. 24A). Moreover, Embodiment 1 may be configured to have a head 7933H such as that illustrated in FIG. 24B, for example. The head 7933H has the chip tool 76411, the head main unit 76413, and a chuck 79412 that hold and press the chip CP from the peripheral part thereof. According to the present configuration, the chip CP can be held even without the formation of a step at the peripheral part of the chip CP sufficient for insertion of a claw. In the case in which a step is formed in the peripheral part of the chip CP, from the standpoint of secure holding of the chip CP, the configuration illustrated in FIG. 24A is preferred in comparison to the configuration illustrated in FIG. 24B.

Due to such configurations, the incorporation of air between the substrate WT and the chip CP during mounting of the chip CP on the substrate WT is suppressed, thereby enabling good void-free mounting of the chip CP on the substrate WT.

Figure 25A:
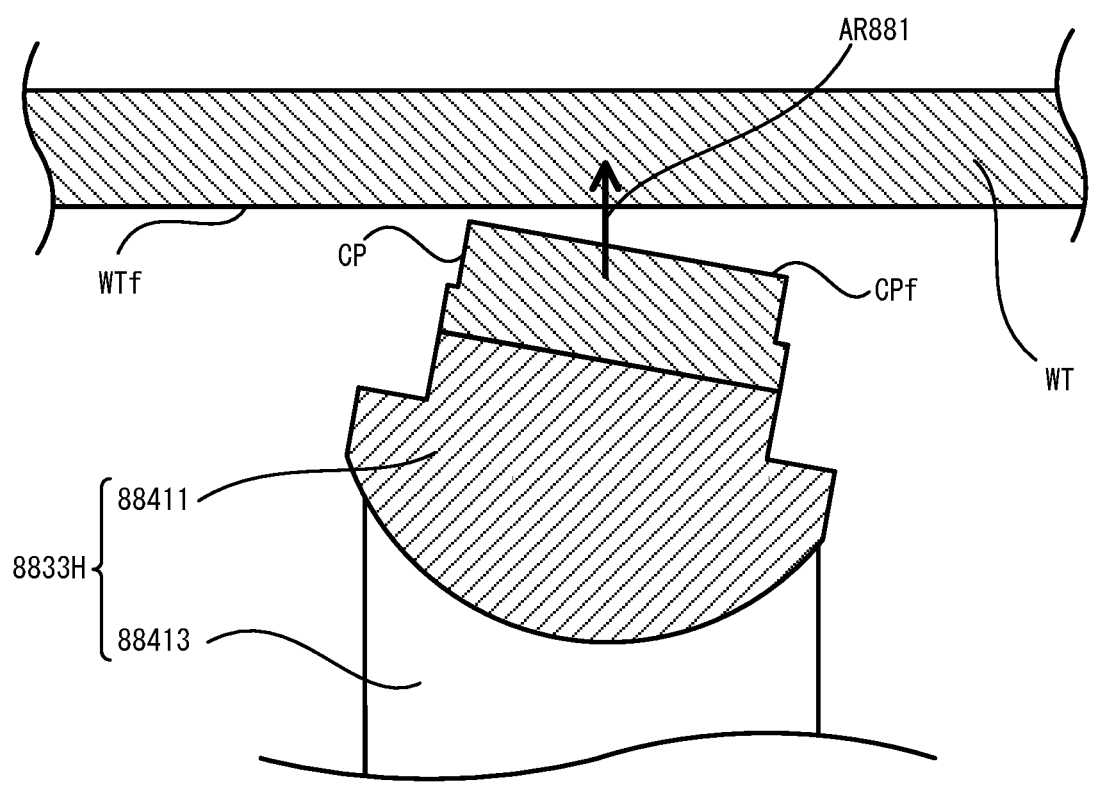
FIG. 25A is a schematic configuration view of a component mounting system according to yet another modified example.

Embodiment 1 may be configured by providing of a bonding device that has a head 8833H capable of changing tilt of the chip tool 88411 holding the chip CP relative to the head main unit 88413 as illustrated in FIG. 25A, for example. The head main unit 88413 has a non-illustrated shaft part for axial support of the chip tool 88411 and a non-illustrated chip tool drive unit that drives the chip tool 88411 in rotation around the shaft part. The chip tool 88411 is a variably-tiltable holding unit that holds the chip CP and is capable of changing the tilt of the connecting face CPf of the chip CP relative to the mounting face WTf of the substrate WT.

Figure 25B:
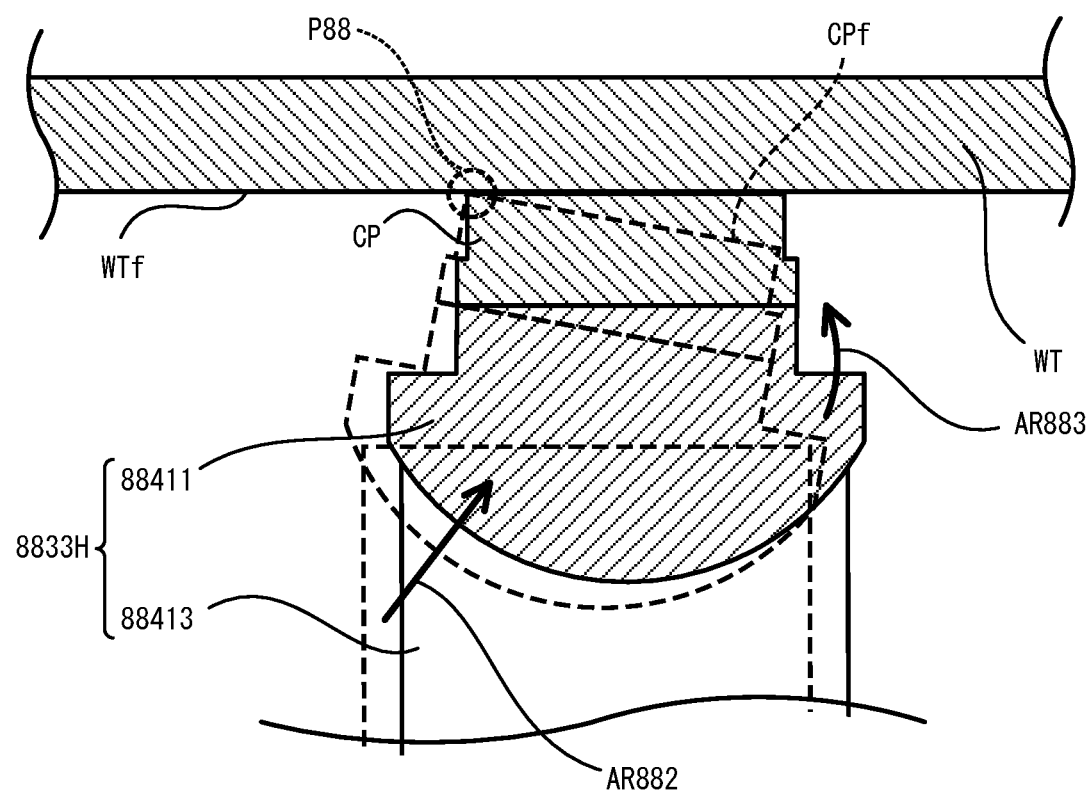
FIG. 25B is a drawing for description of operation of a head according to the modified example.

As illustrated in FIG. 25A, the bonding device according to the present modified example drives (see arrow AR881 in FIG. 25A) the head 8833H in the vertical direction in a state in which the connecting face CPf of the chip CP is tilted relative to the mounting face WTf of the substrate WT. In the state in which the chip tool 88411 holds the chip CP forward while tilting the connecting face CPf of the chip CP relative to the mounting face WTf of the substrate WT, the head drive unit of the bonding device moves the head 8833H in the vertical direction so as to approach the non-illustrated stage holding the substrate WT, and thus the edge of the connecting face CPf of the chip CP contacts the mounting face WTf of the substrate WT. Thereafter, upon the edge part of the chip CP abutting against the mounting face WTf of the substrate WT as indicated by the dashed lines in FIG. 25B, the head drive unit of the bonding device moves the head 8833H in an upward tilted direction (see arrow AR882 in FIG. 25B). At this time, the chip tool 88411 rotates in a direction centered on an abutment part P88 of abutment between the mounting face WTf of the substrate WT and the chip CP (arrow AR883 of FIG. 25B). Due to such operation, the chip CP contacts the mounting face WTf of the substrate WT sequentially from the abutment part P88.

Figure 26:
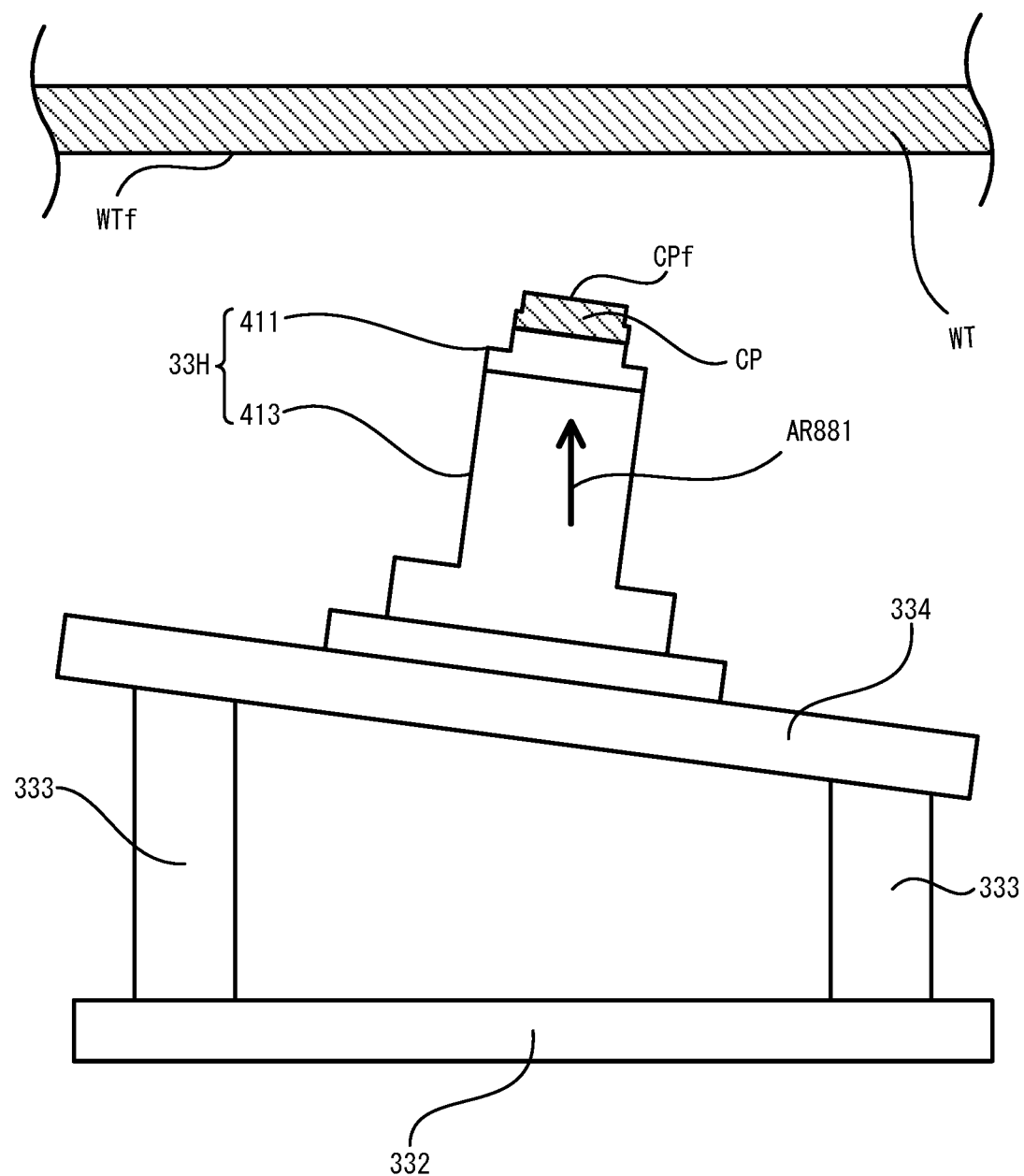
FIG. 26 is a drawing for description of operation of a head according to another modified example.

Moreover, as mentioned above and illustrated in FIG. 5A, the bonding device 30 according to Embodiment 1 is provided with three piezo actuators 333 that are capable of separately extending and contracting in the Z direction between the first disc member 332 and the second disc member 334. By controlling the degree of extension and contraction of each of these three piezo actuators 333, the bonding device 30 can tilt the connecting face CPf of the chip CP relative to the mounting face WTf of the substrate WT as illustrated in FIG. 26. Then the bonding device 30 drives the head 33H in the vertically upward direction in the state in which the connecting face CPf of the chip CP is tilted relative to the mounting face WTf of the substrate WT (see arrow AR881 in FIG. 26).

Incorporation of air between the substrate WT and the chip CP during mounting of the chip CP on the substrate WT according to the present configuration is suppressed, thereby enabling good void-free mounting of the chip CP on the substrate WT.

Figure 27A:
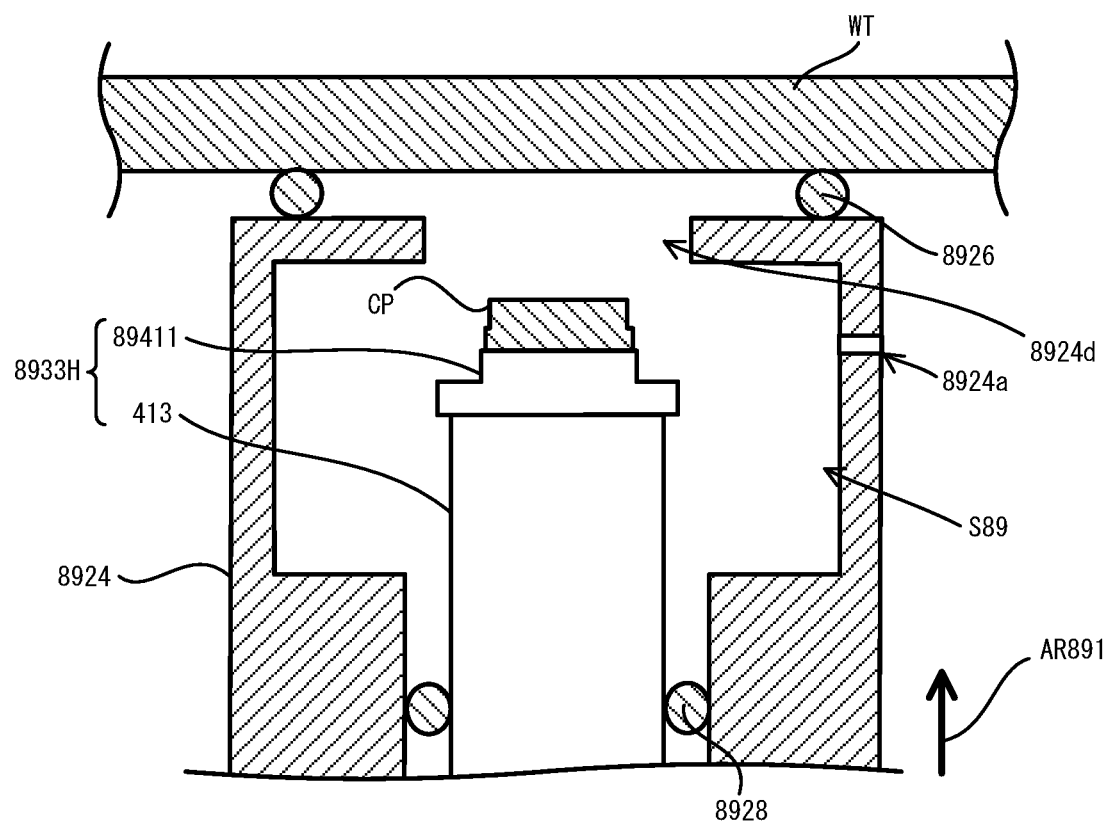
FIG. 27A is a schematic configuration view of a component mounting system according to the modified example.

The embodiments may be equipped with a bonding device that has a cap 8924 that contacts the head 33H via an O-ring 8928 and has a box-like shape with one open face as illustrated in FIG. 27A. Here, the cap 8924 is provided with an opening part 8924d that faces the exterior of the cap 8924 to allow insertion of part of the head 8933H. Moreover, at an outer peripheral part of the opening part 8924d on an outer wall of the cap 8924, an O-ring 8926 is attached. Further, the bonding device has a non-illustrated vacuum pump (vacuum source) for increasing a degree of vacuum in a space S89 by evacuating air present in the space S89 within the cap 8924 through an exhaust port 8924a of the cap 8924.

Figure 27B:
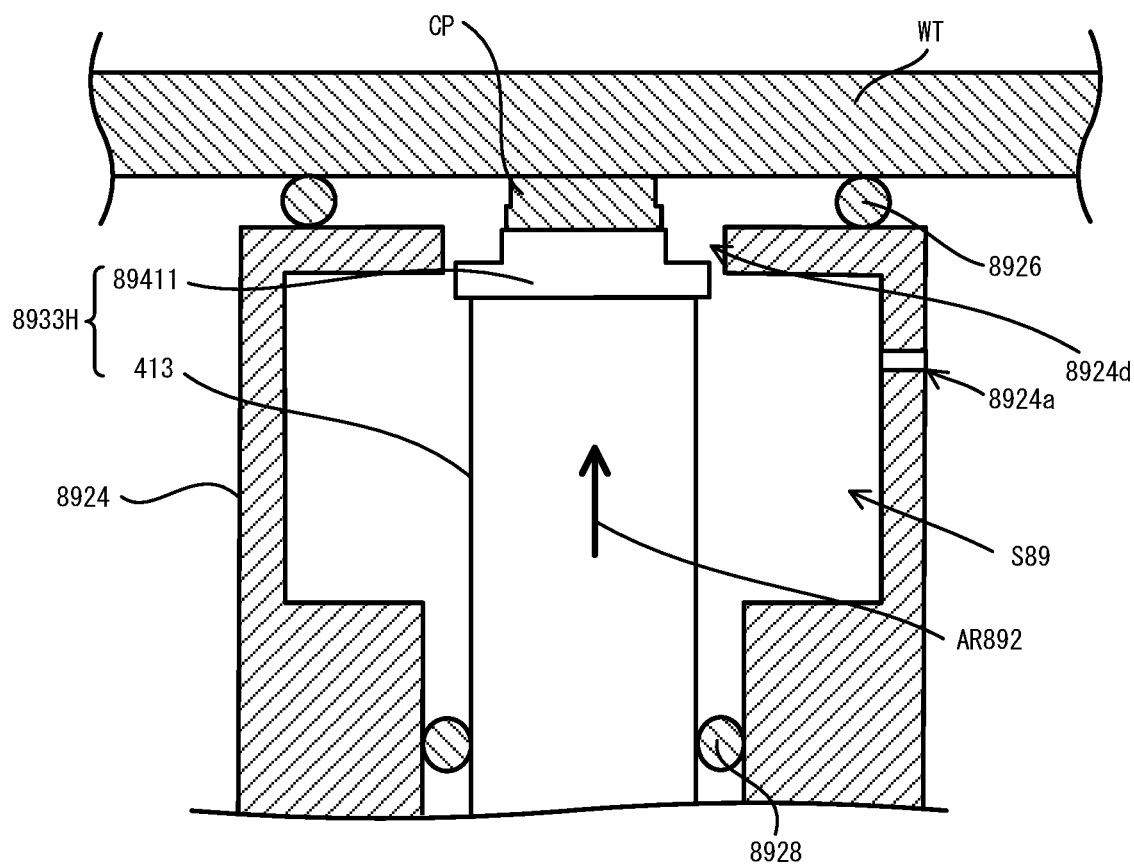
FIG. 27B is a drawing for description of operation of the component mounting system according to the modified example.

The bonding device according to the present modified example firstly causes the cap 8924 to move and approach the substrate WT (see arrow AR891 in FIG. 27A), and then presses the O-ring 8926 against the mounting face WTf of the substrate WT. Thereafter, in the state in which the chip CP is disposed in the space S89 within the cap 8924, the bonding device increases the degree of vacuum on the space S89 by evacuating the gas present in the space S89 through the exhaust port 8924a. Then in the state in which the degree of vacuum of the space S89 is increased as illustrated in FIG. 27B, the bonding device causes the head 8933H to move vertically upward such that the chip CP held by the chip tool 89411 is pressed against the substrate WT (see arrow AR892 in FIG. 27B). Thereafter, after returning the space S89 within the cap 8924 to atmospheric pressure, the bonding device lowers the head 8933H and the cap 8924.

By performing mounting of the chip CP on the substrate WT in the space S89 within the cap 8924 for which the degree of vacuum is increased, the present configuration suppresses the generation of voids due to incorporation of gas bubbles between the mounting face WTf of the substrate WT and the connecting face CPf of the chip CP.

The chip supplying unit 11 according to Embodiment 1 is described as an example in which the chip CP is delivered to the chip transferring unit 13 by the needle 111a thrusting downward a single chip CP from among the multiple chips CP affixed to the dicing tape TE. However, this example is not limiting, and in the case in which the multiple chips CP are affixed to the dicing tape by the faces for mounting on the substrate WT, a mechanism may be provided that uses a vacuum chuck to attach to a surface opposite to the surface of mounting one among the multiple chips CP on the substrate WT and to deliver the chip CP to the chip transferring unit 13.

Although an example is described in Embodiment 1 in which the chip CP is surface bonded to the substrate WT, this example is not limiting, and for example, the chip CP may be bonded to the substrate WT via metal bumps, for example. In this case, the hydrophilization treating device 60 included in the chip mounting system is unnecessary.

Figure 28:
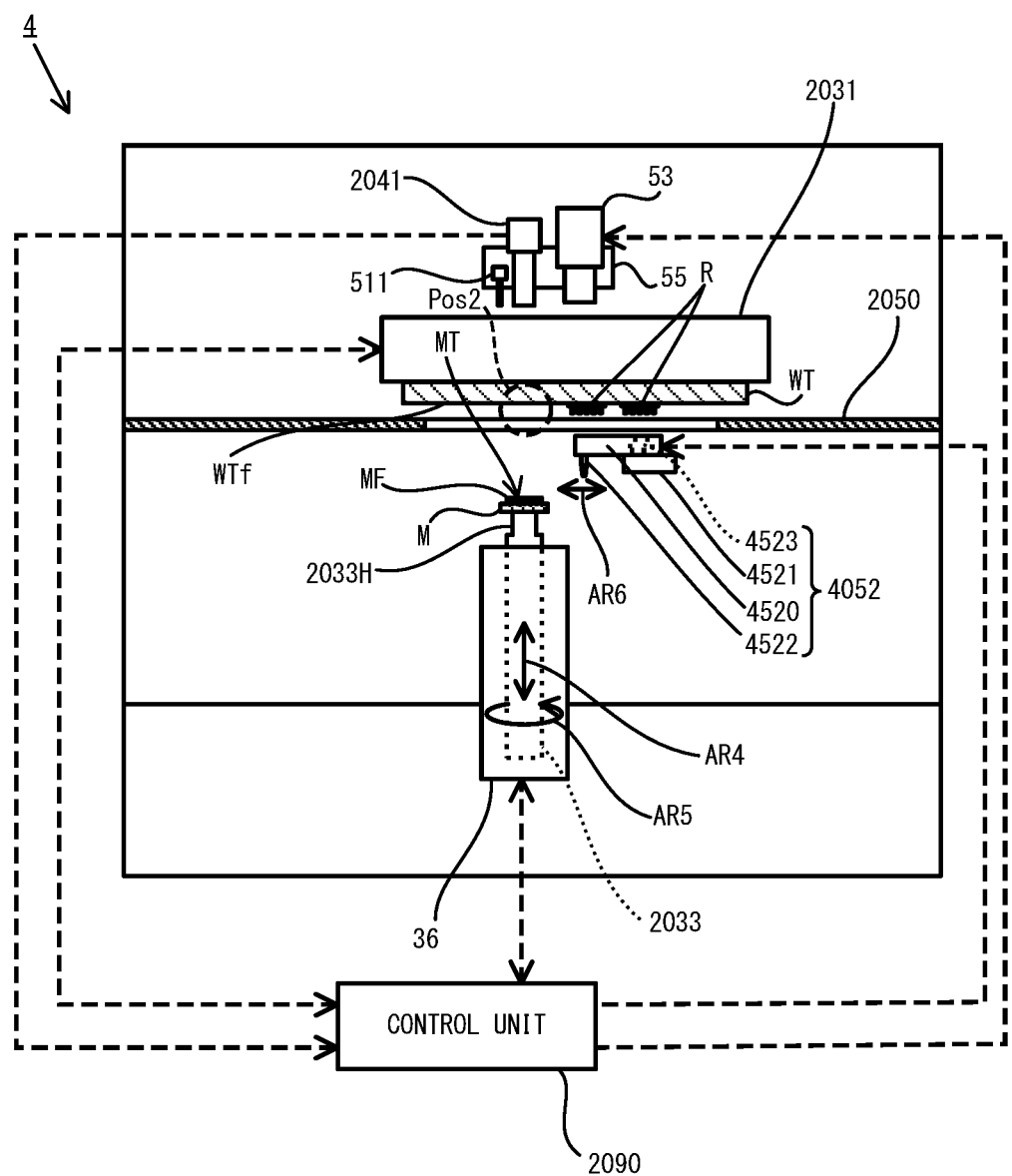
FIG. 28 is a schematic configuration view of a resin shaping device according to another modified example.

The resin shaping device 2 according to Embodiment 2 is described in an example in which the dispenser 52 is disposed above the stage 2031. However, the location of the dispenser 52 is not limited to this configuration, and for example, as illustrated in FIG. 28, a resin shaping device 4 may have a dispenser 4052 disposed below the substrate WT held by the stage 31. Furthermore, structures in FIG. 28 that are the same as those in Embodiment 2 are assigned the same reference signs as those of FIG. 15.

The dispenser 4052 has a main unit 4520, a dispenser drive unit 4521, a nozzle 4522, and a dispensing control unit 4523. The main unit 4520 is capable of moving in the direction perpendicular to the Z axis. The resin shaping device 4, via the dispenser drive unit 4521, moves the main unit 4520 to a position where the nozzle 4522 overlaps the head 2033H in the Z direction. Due to such operation, the dispenser 4052 enters the dispensing preparation completed state in which the preparation is completed for the dispensing of the resin into the concavity MT of the mold M. Thereafter, the resin shaping device 4 pours the resin into the concavity MT of the mold M. The resin shaping device 4 uses the dispensing control unit 4523 to pour the resin into the concavity MT of the mold M. Thereafter, the resin shaping device 4 uses the dispenser drive unit 4521 to move the main unit 4520 to a position such that the nozzle 4522 overlaps the head 2033H in the Z direction so that the dispenser 4052 enters the standby state. According to the present configuration, there is no necessity for moving the stage 2031 such that the dispenser 52 is positioned vertically above the through hole 2031a as described in Embodiment 2. Such configuration thus is preferred as a countermeasure to further decrease particles, and such configuration also improves throughput. However, the nozzle 4522 of the dispenser 4052 is to be configured such that the height direction (Z direction) length is short.

Figure 29:
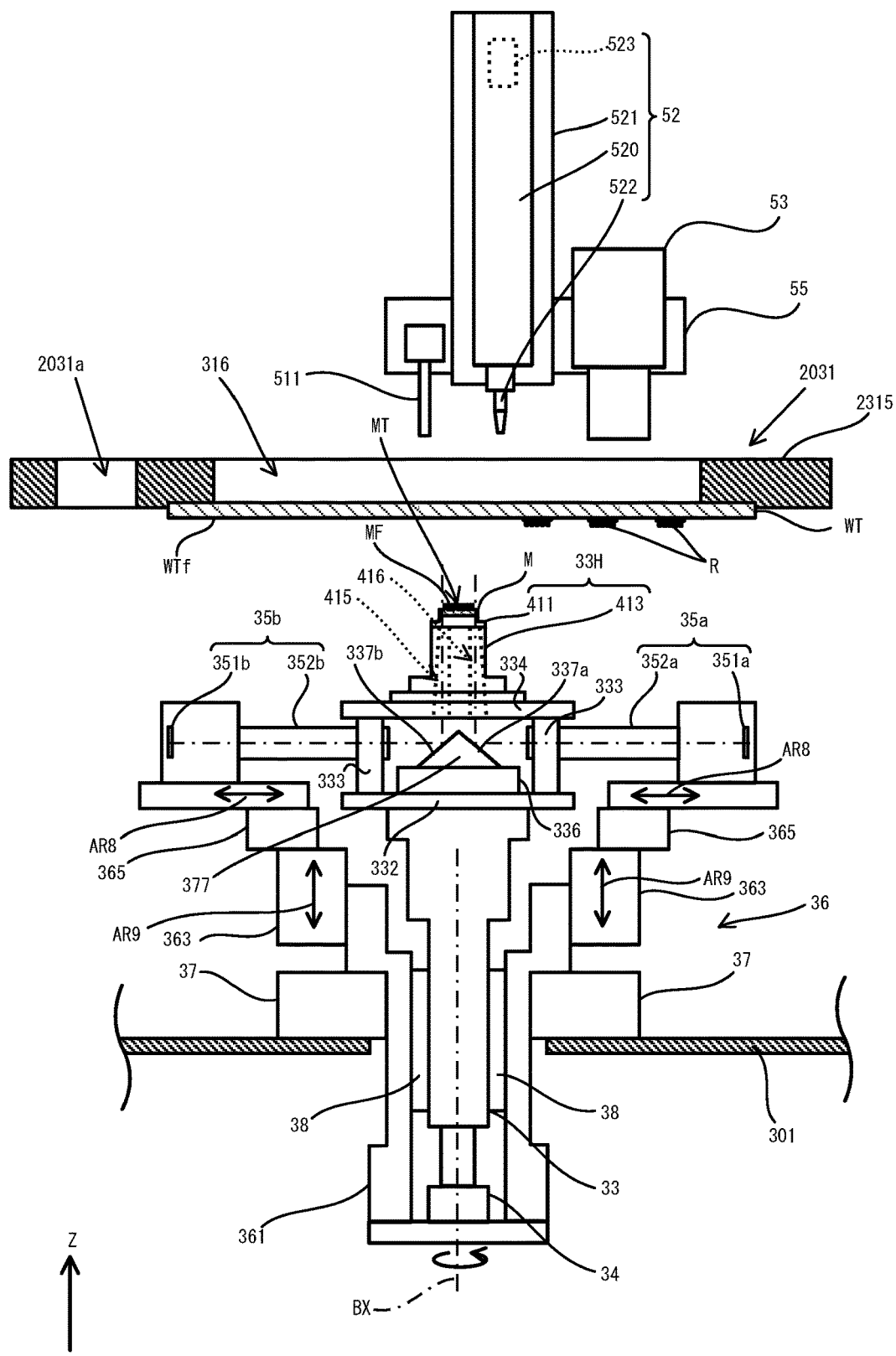
FIG. 29 is a schematic configuration view of a resin shaping device according to the modified example.

For the resin shaping device 2 according to Embodiment 2, an example is described above in which the imaging unit 2041 is disposed above the stage 2031. However, the disposal of the imaging unit 41 is not limited to that of this example, and for example, a configuration may be used in which the imaging units 35a and 35b are disposed below the substrate WT held by the stage 2031 as illustrated in FIG. 29. Furthermore, structures in FIG. 29 that are the same as those of Embodiment 2 are assigned the same reference signs as those of FIG. 16. The imaging units 35a and 35b are configured as two cameras and the mirror 377 capable of simultaneously acquiring the alignment marks MM1a, MM1b, MM2a, and MM2b to the right and left. In the present modified example, the resin shaping device is equipped with the bonding unit 33 that has the stage 2031 and the head 33H, the head drive unit 36 that drives the head 33H, the imaging units 35a and 35b, the camera F direction drive unit 365, and the camera Z direction drive unit 363. The imaging units 35a and 35b, the camera F direction drive unit 365, and the camera Z direction drive unit 363 are configured similarly to the imaging units 35a and 35b, the camera F direction drive unit 365, and the camera Z direction drive unit 363 of Embodiment 1.

Figure 30:
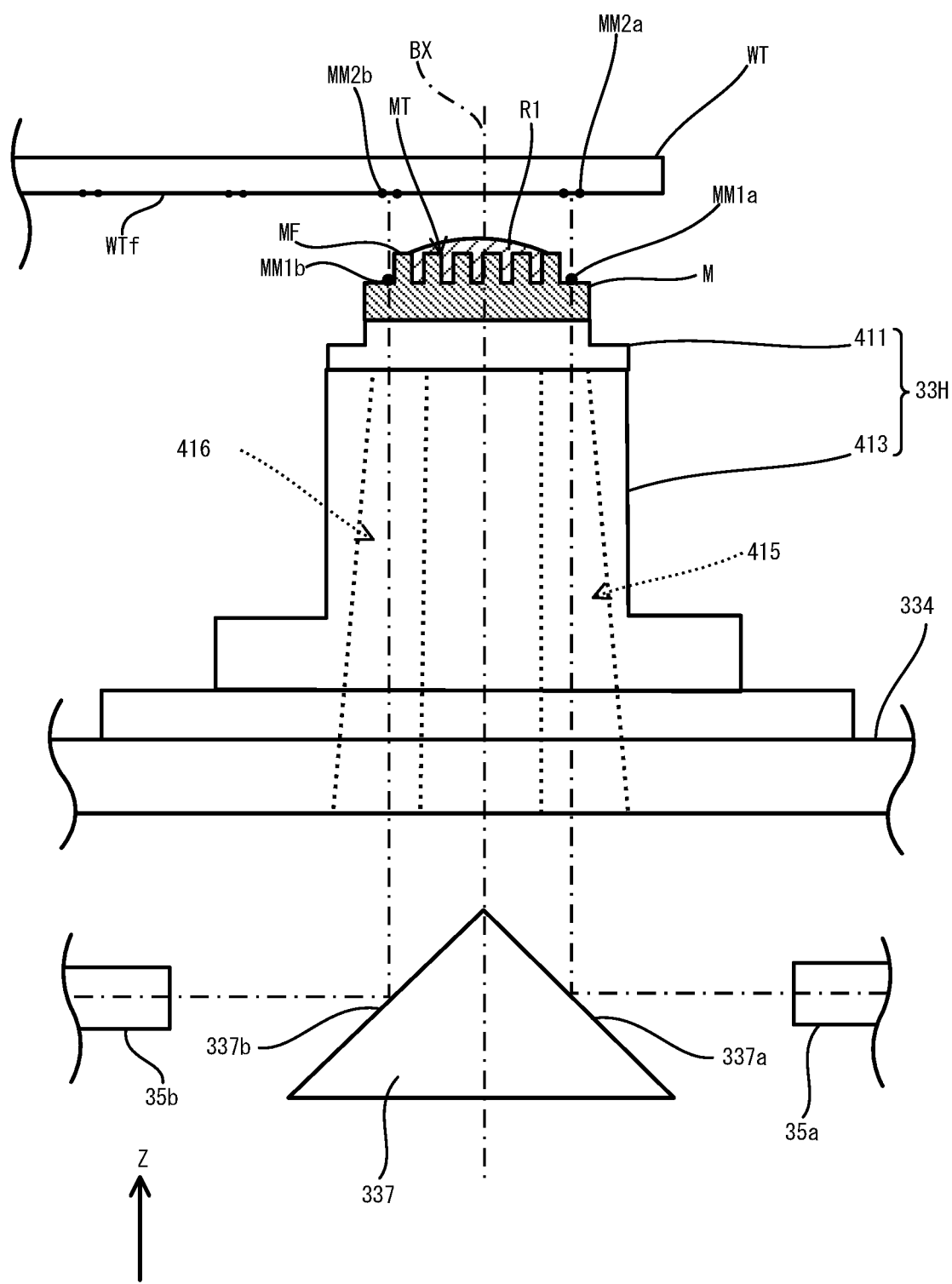
FIG. 30 is a drawing illustrating details of a head according to the modified example.

As illustrated in FIG. 30, the resin shaping device according to the present modified example executes the alignment operation to align the mold M and the substrate WT using the alignment marks MM1a and MM1b provided on the mold M and the alignment marks MM2a and MM2b provided at positions where the resin part R is formed on the substrate WT. Here, similarly to the chip mounting system 1 according to Embodiment 1, the resin shaping device acquires the image data Ga that includes the image of the alignment mark MM1*a* provided on the mold M and the image of the alignment mark MM2*a* provided on the substrate WT. Then on the basis of the image data Ga, the resin shaping device recognizes the positions of the set of marks MM1*a* and MM2*a* provided on the mold M and the substrate WT, and calculates the positional displacement amounts Δxa and Δya of this set of marks MM1*a* and MM2*a*. Moreover, in the same manner, the resin shaping device acquires the image data Gb including the image of the alignment mark MM1*b* provided on the mold M and the alignment mark MM2*b* provided on the substrate WT. Then on the basis of the image data Gb as described previously, the resin shaping device recognizes the positions of the set of marks MM1*a* and MM2*a* provided on the mold M and the substrate WT, and calculates the positional displacement amounts Δxb and Δyb of this set of marks MM1*b* and MM2*b*.

Due to this configuration, the imaging of the image data Ga and Gb can be simultaneously performed, and thus the period for alignment can be shortened.

Moreover, although an example is described in Embodiment 2 in which the imaging unit 2041 that is a so-called single-field camera is disposed above the substrate WT in the resin shaping device 2, this configuration is not limiting, and as illustrated in FIG. 29, for example, a two-camera structure formed by the imaging units 35*a* and 35*b* and the mirror 377 may be disposed above the substrate WT. In this case, the imaging units 35*a* and 35*b* can simultaneously image the set of the alignment marks MM1*a* and MM2*a* and the set of alignment marks MM1*b* and MM2*b*, thereby shortening the period for alignment.

Figure 31:
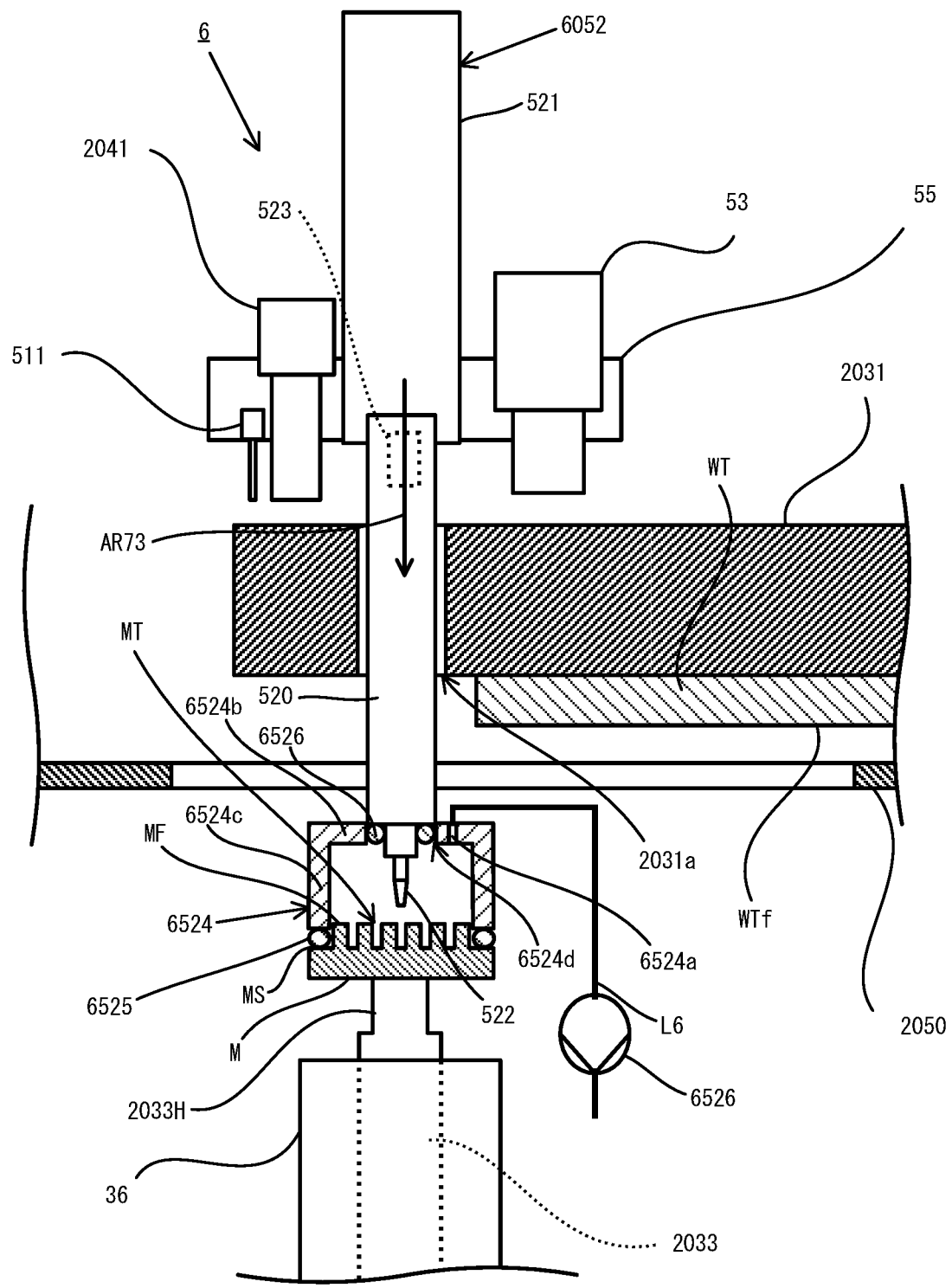
FIG. 31 is a drawing illustrating conditions under which, for the resin shaping device according to another modified example, the resin is poured into a mold from a dispenser.

As illustrated in FIG. 31, for example, Embodiment 2 may be configured by being provided with the resin shaping device 6 that is provided with the cap 6524 and the O-ring 6525 that is a sealing member at the lower end part of the dispenser 6052 of the main unit 520. Here, the cap 6524 has a box-like shape with one surface open, and has a bottom wall 6524*b*, which has roughly the same shape as the shape in plan view of the mold M, and a side wall 6524*c* disposed upright at a peripheral part of the bottom wall 6524*b*. Moreover, an exhaust port 6524*a* is provided in part of the cap 6524. The cap 6524 is formed from metal, for example. The O-ring 6525 is formed from an elastomer. A through hole 6524*d* is penetratingly arranged at a central part of the bottom wall 6524*b*, and the nozzle 522 is inserted therein. A gap between this through hole 6524*d* and the nozzle 522 is sealed by an O-ring 6526. Moreover, the resin shaping device 6 is equipped with a vacuum pump (vacuum source) 6526 connected via an exhaust pipe L6 to the exhaust port 6524*a* of the cap 6524.

This resin shaping device 6 executes processing similar to the imprint processing described for Embodiment 2, for example. In this case in the processing of the step S201 of the imprint processing illustrated in FIG. 18, the resin shaping device 6 firstly lowers the main unit 520 (see arrow AR73 in FIG. 31) to cause the distal part of the side wall 6524*c* of the cap 6524 to abut against the peripheral part MS of the mold M via the O-ring 6525. In the state in which the dispenser 6052 approaches the mold M at the predetermined distance, the cap 6524 abuts against the opening end side of the concavity MT of the mold M via the O-ring 6525 and forms a hermetically sealed space S6 against the mold M. Thereafter, as illustrated by arrow AR601 in FIG. 32A, the resin shaping device 6 uses the vacuum pump 6526 to increase the degree of vacuum of the space S6 by exhausting the gas pressing in the space S6 surrounded by the cap 6524 and the mold M via the exhaust port 6524*a*. In this manner, the resin shaping device 6 sets the dispenser 6052 in the dispensing preparation completed state. Thereafter, the resin shaping device 6 in the processing of the step S202 imprint processing illustrated in FIG. 18 injects the resin R1 into the concavity MT of the mold M by dispensing the resin R1 from the nozzle 522 of the dispenser 6052. Here, in the case in which an aspect ratio (LMT1/LMT2) of the concavity MT and a viscosity of the resin R1 are higher than predetermined standard values, the resin R1 does not penetrate as far as the inner part of the concavity MT, and this results in the generation of voids CA.

Thereafter, after opening of the space S6 within the cap 6524 to the atmosphere, the resin shaping device 6 raises the main unit 520 (see arrow AR602 illustrated in FIG. 32B), and causes the cap 6524 to separate from the mold M. At this time, as indicated by arrow AR603 in FIG. 32B, the resin R1 poured into the mold M is pressed by atmospheric pressure into the inner part of the concavity MT. Such operation causes the void CA generated in the inner part of the concavity MT to vanish.

Figure 33:
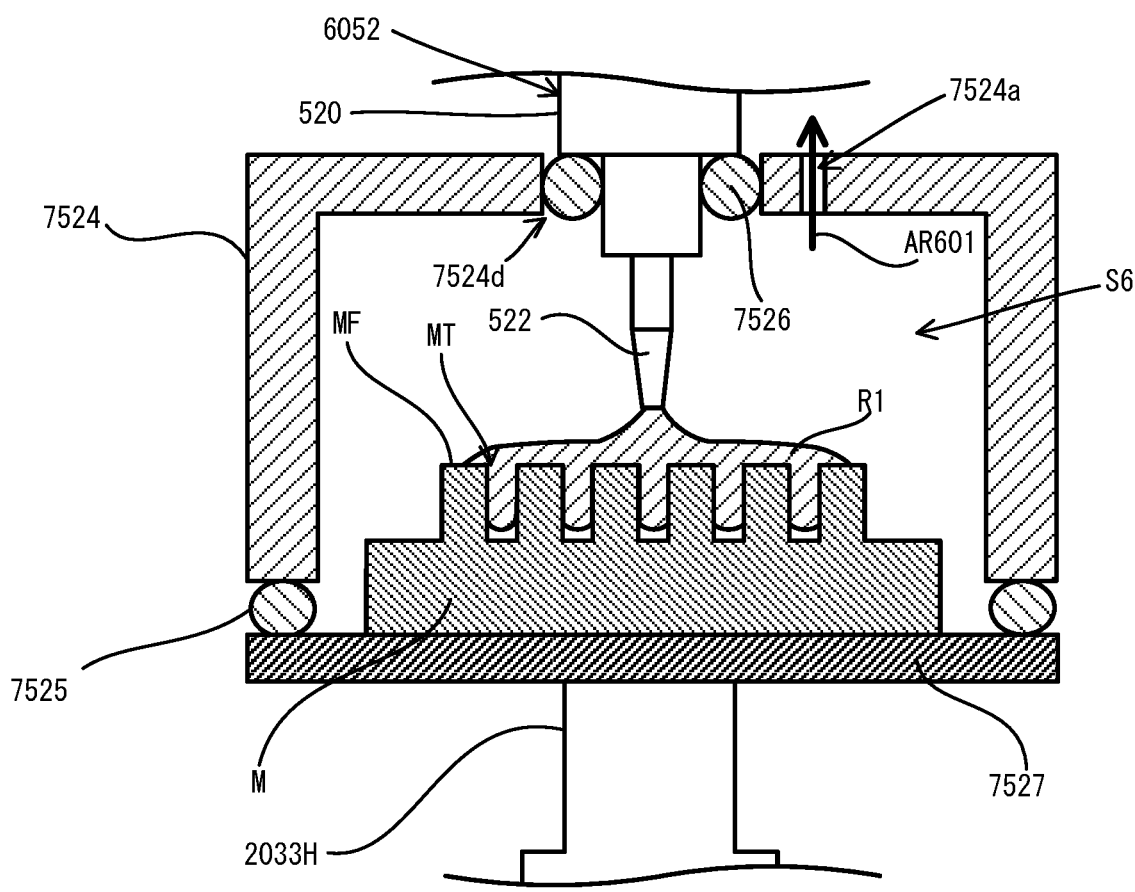
FIG. 33 is another drawing illustrating conditions under which, for the resin shaping device according to the modified example, the resin is poured into the mold from the dispenser.

Furthermore, in the aforementioned manner, although the forming device 6 illustrated in FIG. 31 causes the distal part of the side wall 6524*c* of the cap 6524 to abut against the peripheral part MS of the mold M via the O-ring 6525, a configuration may be used by which the cap 6524 does not directly abut against the mold M. For example, a configuration may be used as in the resin shaping device illustrated in FIG. 33 in which a flange member 7527 bulging at the periphery of the mold M is provided, and the cap 7524 provided with the exhaust port 7524*a* at a part thereof is made to abut against the flange member 7527 via the O-ring 7525. Here, the through hole 7524*d* through which the nozzle 522 is inserted is provided penetrating the cap 7524, and the O-ring 7526 seals the gap between the through hole 7524*d* and the nozzle 522.

Figure 34A:
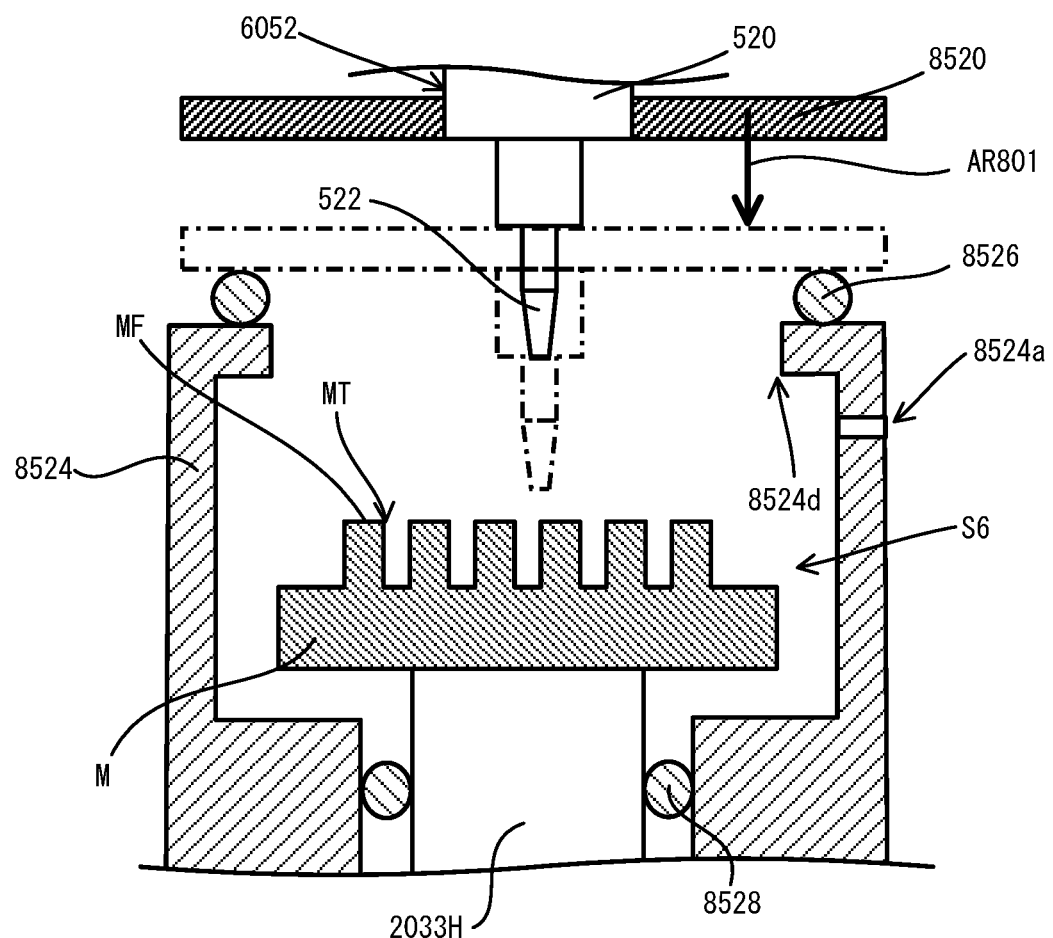
FIG. 34A is a drawing illustrating conditions under which, for the resin shaping device according to another modified example, the resin is poured into a mold form a dispenser.
Figure 34B:
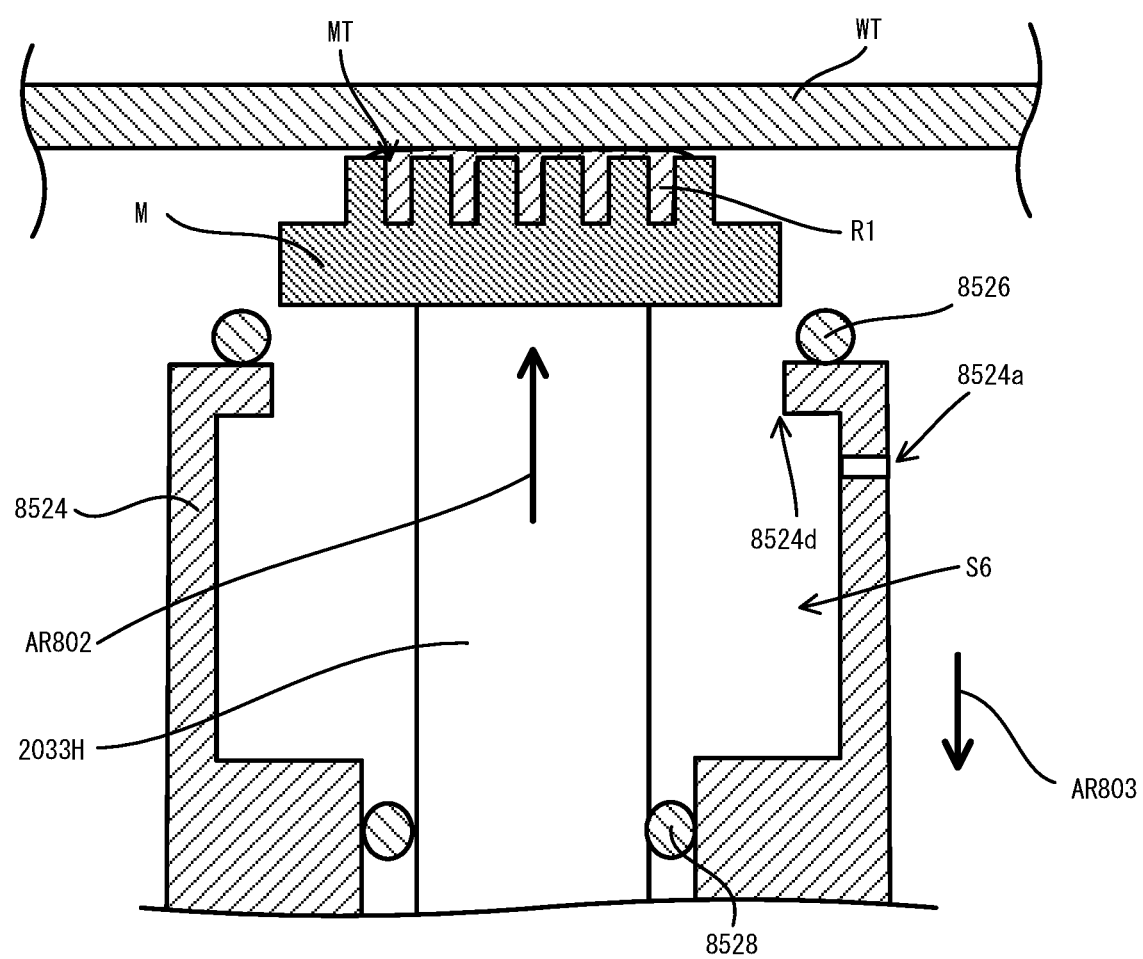
FIG. 34B is a drawing illustrating conditions under which, for a resin shaping device according to a modified example, a mold is pressed against the substrate.

Alternatively, as in the resin shaping device illustrated in FIG. 34A, a cap 8524 that contacts the head 2033H via the O-ring 8528 and is a box-shaped member opened at one end may be provided. Here, an opening part 8524*d* is provided in the cap 8524 for insertion of the nozzle 522 of the dispenser 6052. Moreover, an O-ring 8526 is attached to an outer peripheral part of the opening part 8524*d* in the outer wall of the cap 8524. Then the resin shaping device lowers the main unit 520 of the dispenser 6052 downward (see arrow AR801 in FIG. 34A), and the nozzle 522 is inserted into the cap 8524. Due to such operation, a state results in which the O-ring 8526 abuts against the lower surface of the flange part 8520 provided for the main unit 520 (see dot-dashed line illustrated in FIG. 34A), and the interior of the cap 8524 is closed. Then the resin shaping device exhausts the gas present within the cap 8524 through an exhaust port 8524*a* to raise the degree of vacuum within the cap 8524, and thereafter the resin R1 is dispensed into the concavity MT of the mold M from the nozzle 522 of the dispenser 6052. Moreover, as illustrated in FIG. 34A, the resin shaping device is equipped with a non-illustrated cap drive unit, which is capable of sliding the cap 8524 in the Z direction relative to the mold M, for moving the cap 8524 in the Z direction (see arrow AR803 illustrated in FIG. 34B). Furthermore, the resin shaping device may be equipped with an elastic member linked to the cap 8524 and biased in the direction (+Z direction) to press the cap 8524 against the mold M. Then when pressing the mold M against the substrate WT, the resin shaping device, in addition to moving the head 2033H in the direction of approach to the substrate WT (see arrow AR802 illustrated in FIG. 34B), causes the cap 8524 to move in the −Z direction relative to the mold M. Due to such operation, when the resin shaping device presses the mold M against the substrate WT, the cap 8524 is prevented for contacting the substrate WT.

Figure 35A:
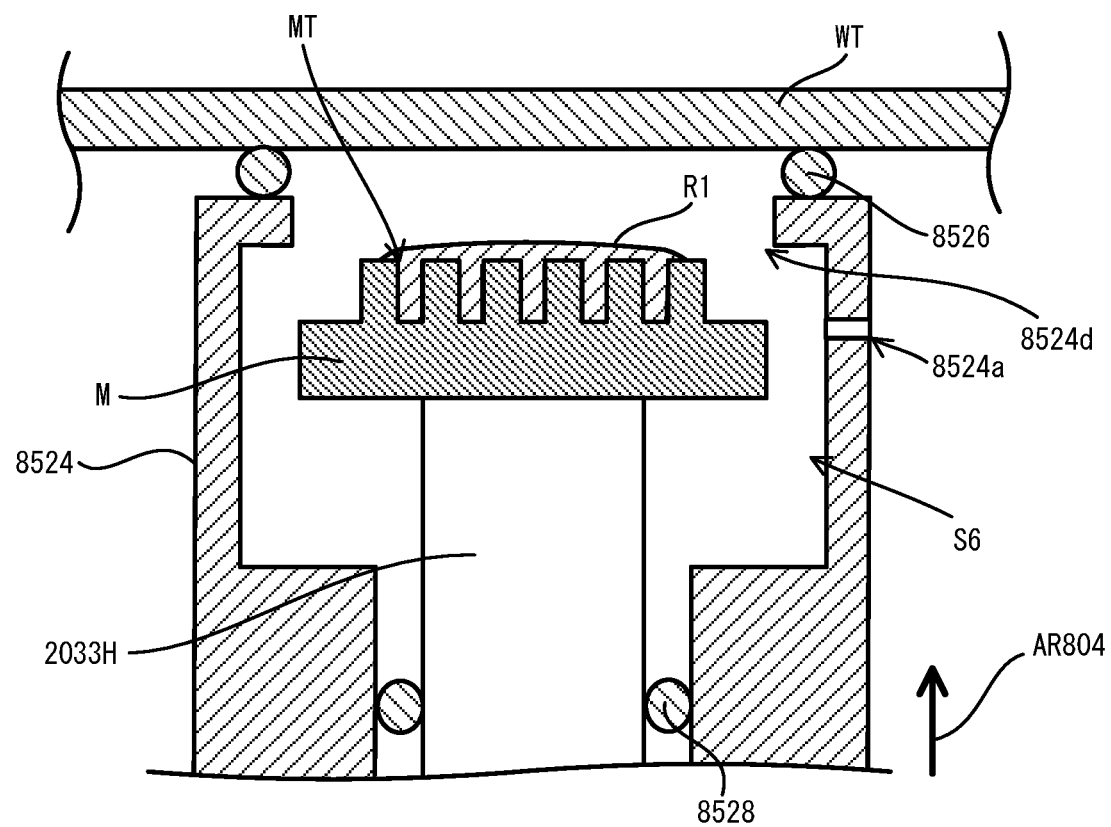
FIG. 35A is another drawing illustrating conditions under which, for the resin shaping device according to the modified example, the mold is pressed against the substrate.
Figure 35B:
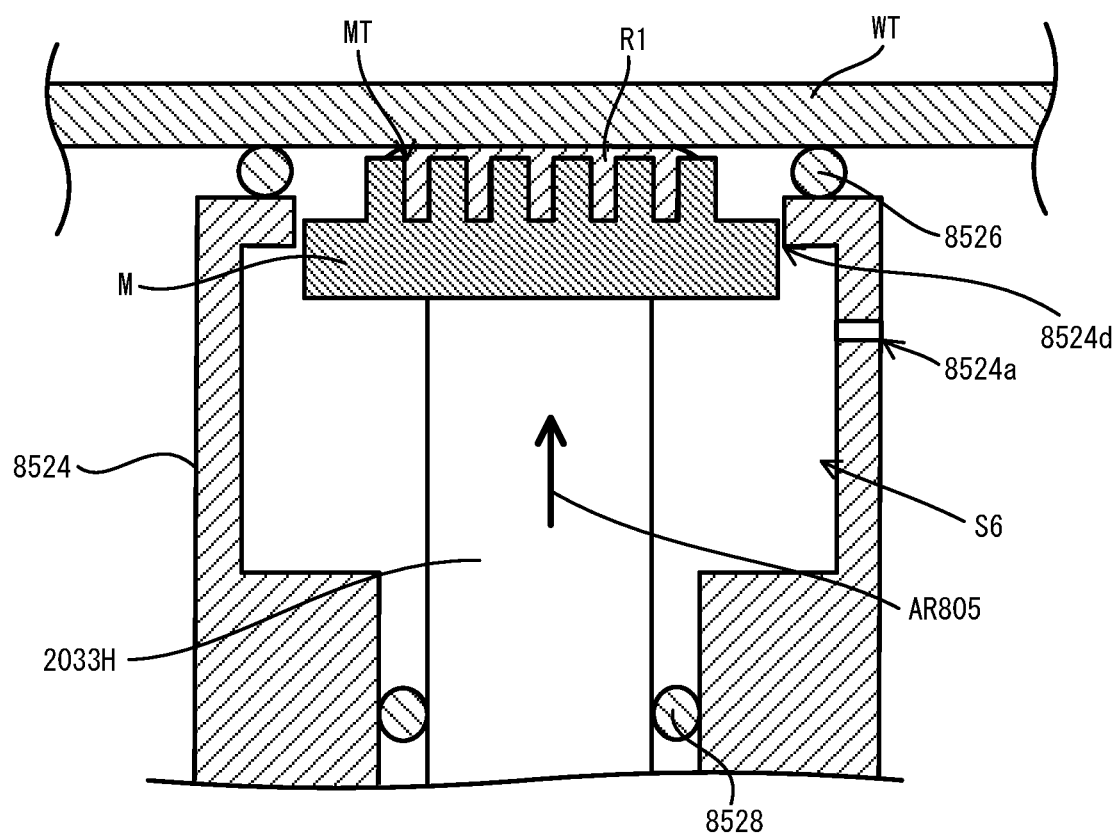
FIG. 35B is yet another drawing illustrating conditions under which, for the resin shaping device according to the modified example, the mold is pressed against the substrate.

Moreover, as illustrated in FIGS. 35A and 35B for example, the aforementioned resin shaping device may operate so as to press the cap 8524 against the substrate WT via the O-ring 8526. In this case, the resin forming is performed in the space S6 within the cap 8524 with the heightened degree of vacuum, and thus the incorporation of air bubbles into the resin R1 can be prevented. In this case as illustrated in FIG. 35A, in a state in which the mold M in which the resin R1 is poured into the concavity MT is disposed in the space S6 within the cap 8524, the resin shaping device exhausts the gas present in the space S6 through the exhaust port 8524a and increases the degree of vacuum of the space S6. Then in the state in which the degree of vacuum of the space S6 is increased, the resin shaping device as illustrated in FIG. 35B raises the mold M that has the resin R1 poured into the concavity MT and thus presses against the substrate WT. Thereafter, in the state in which the mold M is pressed against the substrate WT, the resin shaping device cures the resin R1 by irradiating the resin R1 with ultraviolet light. Thereafter, the resin shaping device returns the space S6 within the cap 8524 to atmospheric pressure, and lowers the mold M to cause the mold M to separate from the substrate WT.

According to the present configuration, processing can be performed that increases the degree of vacuum locally at the periphery of the mold M, and such operation is advantageous in that the providing of an elaborate chamber may be avoided. Moreover, the gap between the cap 8524 and the mold M is made as small as possible, and thus the distance between adjacent resin parts on the substrate WT can be reduced. Further, the resin shaping device may execute both the pulling of vacuum within the cap 8524 during pouring of the resin R1 into the concavity MT of the mold M and the pulling of vacuum within the cap 8524 during pressing of the mold M against the substrate WT.

In the aforementioned modified examples described with reference to FIGS. 31 to 35B, the resin shaping device may be configured such that, after returning the space S6 to atmospheric pressure after pouring the resin R1 into the mold M in the state in which the degree of vacuum of the space S6 is high, the resin R1 may be again poured into the mold M. After the resin R1 is poured into the concavity MT of the mold M in the state of increased degree of vacuum of the space S6, when the space returns to atmospheric pressure, the resin R1 poured into the concavity MT is pressed toward the inner part of the concavity MT, and a state results in which the resin R1 is insufficient at the edge part of the concavity MT. In contrast, after the space S6 returns to atmospheric pressure according to the present configuration, the resin R1 is poured into the mold M, thereby enabling compensation for the insufficiency of the resin R1, and enabling the surface of the resin R1 placed in the mold M to be smoothly formed without irregularities. Moreover, the resin shaping device may be configured such that, in the state of heightened degree of vacuum in the space S6 after pouring of the resin R1 into the mold M under atmospheric pressure conditions in the space S6, the space S6 may then be returned again to atmospheric pressure, and then the resin R1 may be poured into the mold M again. Also in this case, after pouring of the resin R1 into the concavity MT of the mold M, when the degree of vacuum of the space S6 is increased, bubbles included in the resin R1 poured into the concavity MT are eliminated so that the resin R1 becomes insufficient at the edge part of the concavity MT. Moreover, when the degree of vacuum of the space S6 is increased in the state in which the resin R1 is poured into the concavity MT of the mold M, the resin R1 may become aerated, and the resin R1 may become insufficient at the edge part of the concavity MT. In contrast, according to the present configuration, after the space S6 returns to atmospheric pressure, the resin R1 is poured again into the mold M, and thus compensation is possible for the insufficiency of the resin R1, and the surface of the resin R1 placed in the mold M can be made smooth and free of irregularities.

However, when resin remains in the nozzle, after placement of the resin in the mold M in the state of increased degree of vacuum of the space S6, once the interior of the space S6 is returned to atmospheric pressure, when the degree of vacuum of the space S6 is again increased, bubbles are generated within the resin remaining within the nozzle so that an amount flowing from the nozzle may decrease. Moreover, in the state of increased degree of vacuum of the space S6, the characteristics of the resin dispensed from the nozzle may be affected. Thus a configuration may be used in which a resin coating device such as a plunger is provided, and the plunger is used to withdraw and then push out just the amount of resin to be placed in the mold M. Such operation suppresses the occurrence of failures due to remnant resin within the nozzle as described above.

Moreover, the viscosity of the resin R1 is preferably lowered in order to allow filling of the resin R1 as much as possible into the concavity MT of the mold M. Heating of the mold M into which the resin R1 is poured to raise temperature of the resin R1 to a temperature at which resin R1 viscosity declines can be used as a method to lower the viscosity of the resin R1. Thus the resin shaping device 2 described in Embodiment 2 may be configured by equipment with a non-illustrated mold heating unit that heats the mold M in a state in which the ultraviolet light-curing resin is poured into the concavity of the mold. The mold heating unit may heat the mold M and the resin poured into the concavity MT during pouring of the ultraviolet light-curing resin R1 into the concavity MT of the mold M, or after pouring of the ultraviolet light-curing resin R1 into the concavity MT of the mold M. That is to say, in the processing of step S202 of the imprint processing illustrated in FIG. 18, for example, the resin shaping device may heat the mold by the mold heating unit to a temperature greater than or equal to a predetermined temperature, and then the resin R1 may be poured into the concavity MT of the mold M. Alternatively, after pouring of the resin R1 into the concavity MT of the mold M, the resin shaping device may use the mold heating unit to heat the mold M. Furthermore, the resin shaping device may use the mold heating unit to heat the mold M, and while the temperature of the mold M is rising, may pour the resin R1 into the concavity MT of the mold M. Further, in the present modified example, the utilized resin is not limited to the ultraviolet light-curing type resin, and a thermosetting resin or a thermoplastic resin may be used.

Moreover, after pouring of the resin R1 into the concavity MT of the mold M, during pressing of the mold M against the substrate WT, viscosity of the resin R1 is preferably high in order to avoid introduction of air into the resin R1 poured into the concavity MT of the mold M. After the resin R1 is poured into the concavity MT of the mold M, by stopping the heating by the mold heating unit during pressing of the mold M against the substrate, the resin shaping device may lower the temperature of the mold M. Then when the resin R1 is poured into the concavity MT of the mold M, and the mold M is heated, the resin shaping device may repeatedly perform lowering of the temperature of the mold M when pressing against the substrate WT the mold M having the resin R1 is poured into the concavity MT. In particular, when the resin R1 is the ultraviolet light-curing resin, the resin R1 softens upon raising of the temperature and hardens upon lowering of the temperature of the resin R1, and thus the resin shaping method of the present modified example is suitable. Further, the present modified example is not limited to using the ultraviolet light-curing resin as the utilized resin, a resin of another types may be used for which viscosity increases upon lowering of the temperature, and for example, a thermosetting resin or a thermoplastic resin may be used.

In this manner, due to heating of the resin R1 poured into the concavity MT of the mold M, the viscosity of the resin R may be lowered, and thus the resin R1 becomes easy to introduce into the inner part of the concavity MT. Moreover, the resin R1 flows due to heating of the resin R1 poured into the concavity MT of the mold M, thereby preventing movement toward the opening part of the concavity MT of the air accumulated within the concavity MT during the flow of the resin R1. Thus after the pouring of the resin R1 into the concavity MT of the mold M, the accumulation of air at the inner part of the concavity MT can be suppressed. Moreover, after the resin R1 is poured into the concavity MT of the mold M, when the mold M is pressed against the substrate, the resin shaping device lowers the temperature of the mold M by stopping the heating by the mold heating unit. Moreover, the cooling may be performed by forced air cooling or water cooling. Due to such operation, the introduction of air into the resin R1 poured into the concavity MT of the mold M can be suppressed.

However, when the resin R1 is applied to the mold M after increasing the degree of vacuum of the space S6 in the state in which the mold M is disposed in the space S6 within the cap 6524, due to the high degree of vacuum of the space S6, the boiling point of the resin R1 declines such that volatilization readily occurs. Thus in this case, the temperature of the resin R1 is preferably lowered so as not be greater than or equal to the boiling point of the resin R1 in the state in which there is a high degree of vacuum in the space S6, and the resin R1 is preferably applied to the mold M in a state that prevents volatilization of the resin R1. Thus in the resin shaping device according to the present modified example is provided at the distal part of the head 2033H with non-illustrated cooling means that cools the mold M when the resin R1 is applied to the mold M in the state in which the degree of vacuum of the space S6 is high. This cooling means may be a non-illustrated Peltier element provided at the distal part of the head 2033H, for example, and a flow pathway may be provided for the distal part of the head 2033H that allows flow of a low temperature gas or a liquid such as liquid nitrogen. Due to this cooling means, the mold M held at the distal part of the head 2033H can be forcefully cooled.

Figure 32A:
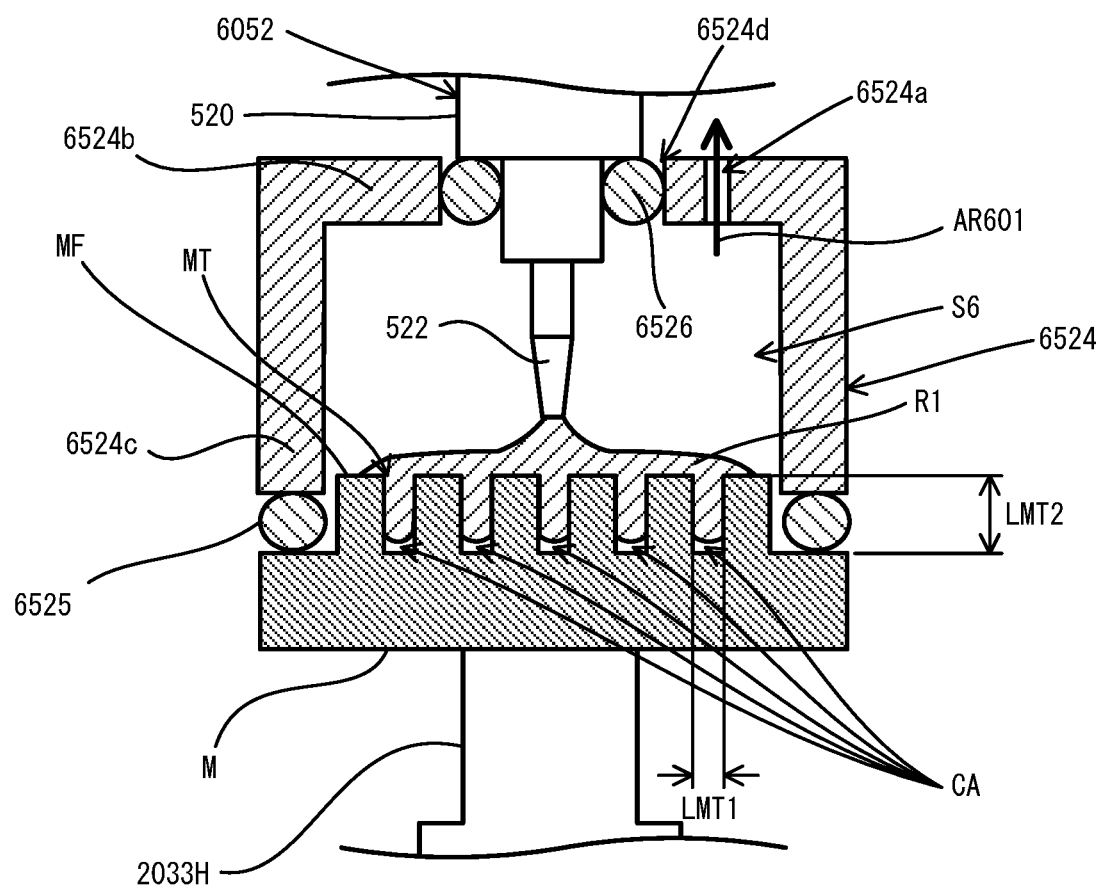
FIG. 32A is another drawing illustrating conditions under which, for the resin shaping device according to the modified example, the resin is poured into the mold from the dispenser.
Figure 32B:
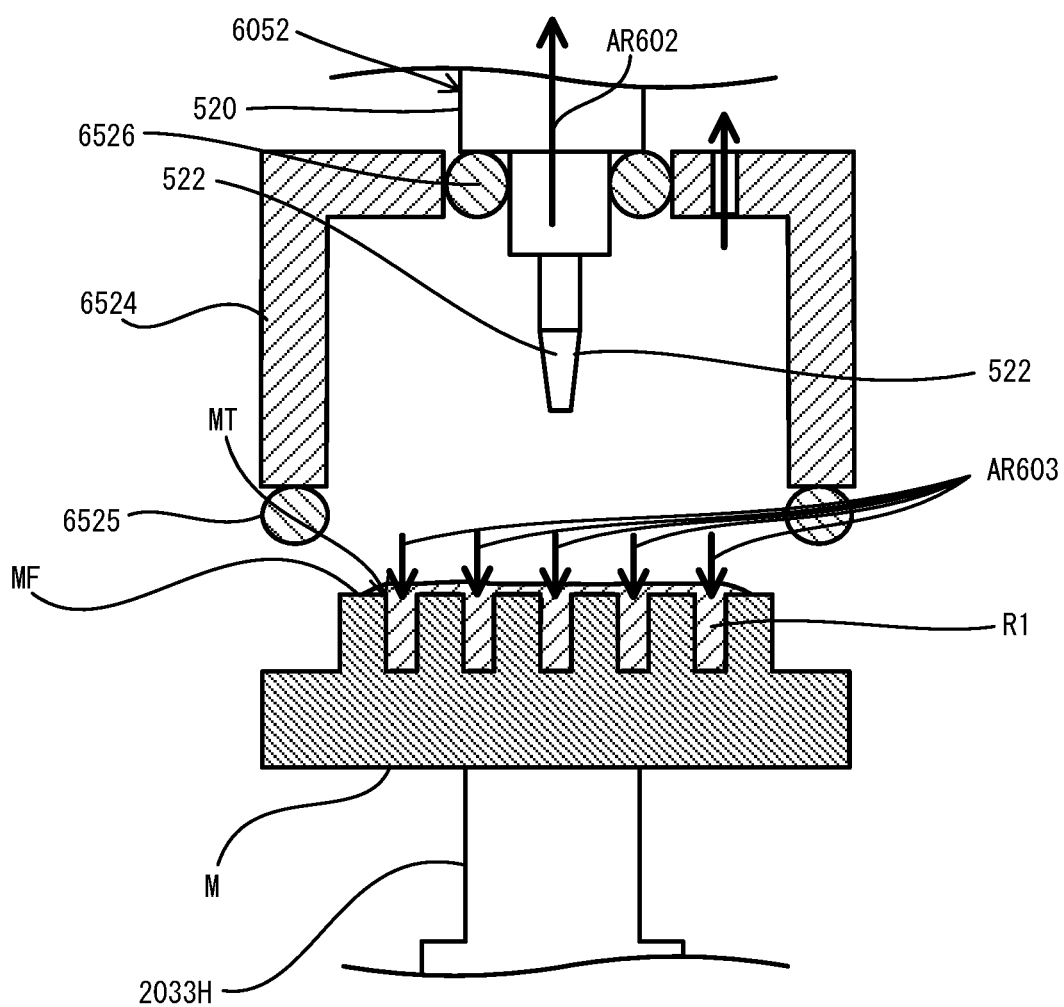
FIG. 32B is a yet another drawing illustrating conditions under which, for the resin shaping device according to the modified example, the resin is poured into the mold from the dispenser.

However, in the state in which the temperature of the resin R1 is lowered, the viscosity of the resin R1 is not lowered, and thus as illustrated in FIG. 32A, the voids CA are generated within the concavity MT. Due to the high degree of vacuum within the voids CA, as illustrated in FIG. 32B, by opening of the space S6 to atmospheric pressure, although differential pressure on the resin R1 within the concavity MT causes the voids CA to disappear, the viscosity of the resin R1 at that time is preferably lowered by heating the resin R1. Thus the head 2033H of the resin shaping device according to the present modified example is provided with a non-illustrated heater for heating the resin R1. Then when the space S6 is opened to atmospheric pressure, this resin shaping device lowers the viscosity of the resin R1 by using the heater to heat the mold M. That is to say, in the case in which the resin R1 is applied to the mold M in the state in which the degree of vacuum of the space S6 is high, the resin shaping device according to the present modified example has a function for cooling the mold M by the aforementioned cooling means, and when the space S6 is opened to atmospheric pressure, uses the aforementioned heater to heat the mold M.

Furthermore, although FIG. 32B illustrates a configuration by which the periphery of the mold M is an atmospheric pressure environment due to the atmosphere due to separation of cap 6524 from the mold M, this configuration is not limiting. For example, a configuration may be used by which the space S6 reaches atmospheric pressure due to injection of a gas into the space S6 within the cap 6524. Although a configuration is described above in which the mold M is heated by the heater, no particular limitation is placed on the heating method. Moreover, a structure is preferred in which the cooling means and the heater are provided at the distal part of the head 2033H, and the mold M can use both the cooling function and the heating function.

The resin shaping device 2 according to Embodiment 2 may be equipped with a non-illustrated vibrating member that vibrates the mold M in the state in which the mold M is held by the head 2033H. In this case, the resin shaping device may use the vibrating member to vibrate the mold M during the processing of step S202 of the imprint processing illustrated in FIG. 18, for example. Here, the resin shaping device may pour the resin R1 into the concavity MT of the mold M while using the vibrating member to vibrate the mold M. Alternatively, the resin shaping device may use the vibrating member to vibrate the mold M after pouring of the resin R1 into the concavity MT of the mold M.

According to the present configuration, flow of the resin R1 occurs due to vibration of the resin R1 poured into the concavity MT of the mold M, and thus the air present in the inner part of the concavity MT can be removed by movement toward the opening part of the concavity MT with the flow of the resin R1. Thus after pouring of the resin R1 into the concavity MT of the mold M, the presence of air at the inner part of the concavity MT can be suppressed.

Furthermore, the resin shaping device 2 according to Embodiment 2 may be equipped with both the aforementioned mold heating unit and the vibrating member. In this case, for example, the resin shaping device in the processing of step S202 of the imprint processing illustrated in FIG. 18, together with heating of the mold M by the mold heating unit, may cause vibration of the mold M by the vibrating member.

Moreover, the resin shaping device 6 according to the aforementioned modified example may be equipped with at least one of the mold heating unit or the vibrating member. In this case, in the state of increased degree of vacuum of the space S6 surrounded by the cap 6524 and the mold M during pouring of the resin R1 into the concavity MT of the mold M, the resin shaping device pours the resin R1 into the concavity MT of the mold M while the mold heating unit heats the mold M.

Alternatively, in the state of increased degree of vacuum of the space S6 surrounded by the cap 6524 and the mold M when pouring the resin R1 into the concavity MT of the mold M, the resin shaping device pours the resin R1 into the concavity MT of the mold M while the vibrating member vibrates the mold M. Moreover, in the state of increased degree of vacuum of the space S6 surrounded by the cap 6524 and the mold M, the resin shaping device may pour the resin R1 into the concavity MT of the mold M while the mold heating unit heats the mold M and the vibrating member vibrates the mold M.

Moreover, in addition to when pouring of the resin R1 into the mold M1 in an environment of relatively high degree of vacuum, the heating of the mold M is effective when the resin R1 is poured into the mold M in the atmosphere. Moreover, in addition to when pouring of the resin R1 into the mold M1 in an environment of relatively high degree of vacuum, the vibrating of the mold M is effective when the resin R1 is poured into the mold M in the atmosphere.

Moreover, the method of vibrating the mold is effective in order to avoid incorporation of gas bubbles when pressing the resin R1 against the substrate WT. By vibration even when gas bubbles are incorporated in the pressed resin R1, the resin R1 can be made to flow so that the gas bubbles are released. Furthermore, pre-application of resin to the substrate WT and contacting of the resin R1 on the mold M and the resin on the substrate WT are further effective due to easy incorporation of gas bubbles in the atmosphere. The pre-application of resin to the substrate WT may be performed for lowering the resin amount for differential pressure filling of the concavity MT of the mold M and improving adhesion to the substrate WT.

Figure 36A:
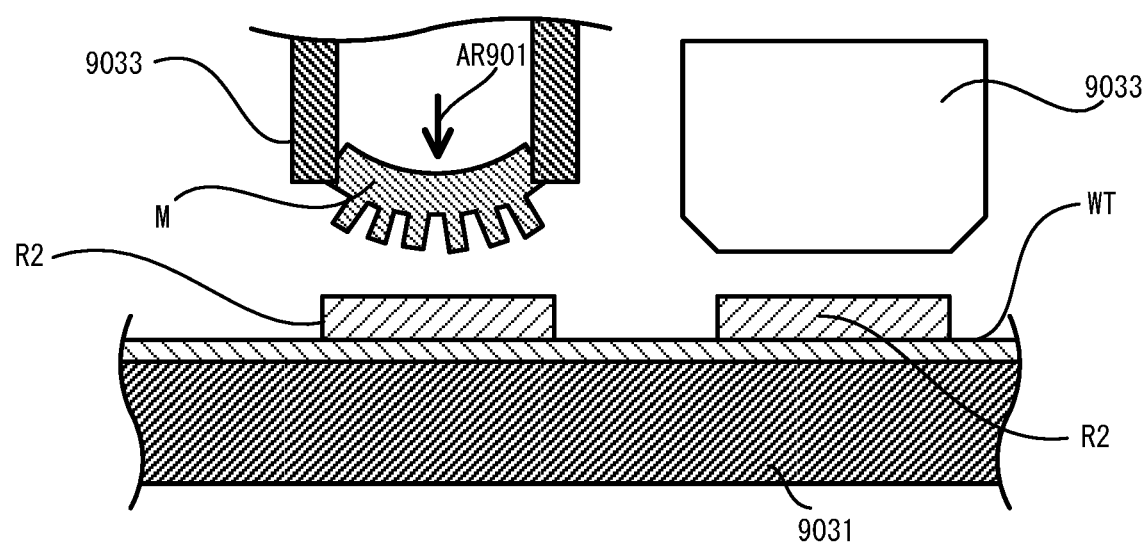
FIG. 36A is a drawing illustrating conditions under which, for a resin shaping device according to a comparative example, a mold is pressed against a resin layer.
Figure 36B:
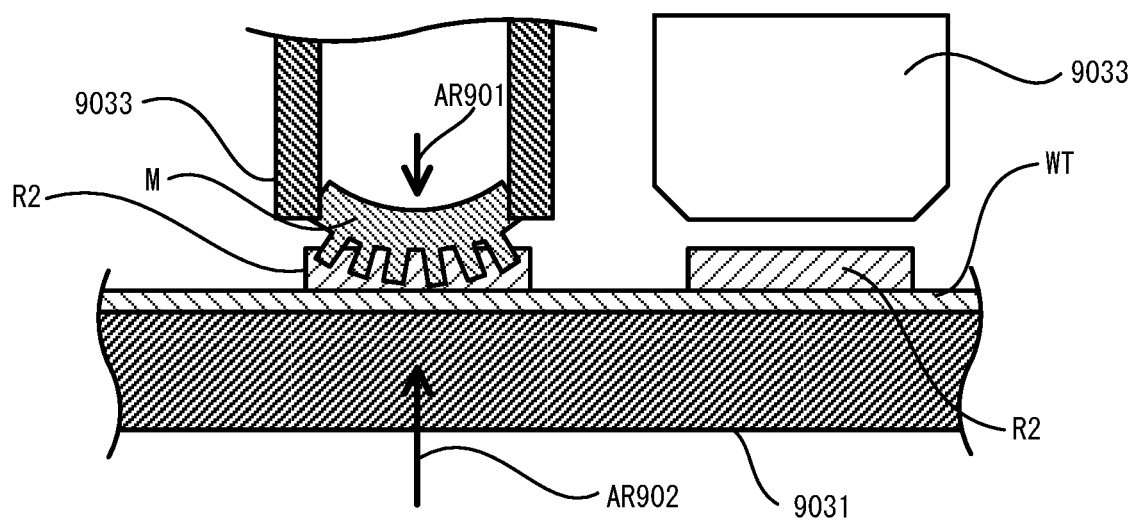
FIG. 36B is another drawing illustrating conditions under which, for the resin shaping device according to the comparative example, the mold is pressed against a resin layer.
Figure 36C:
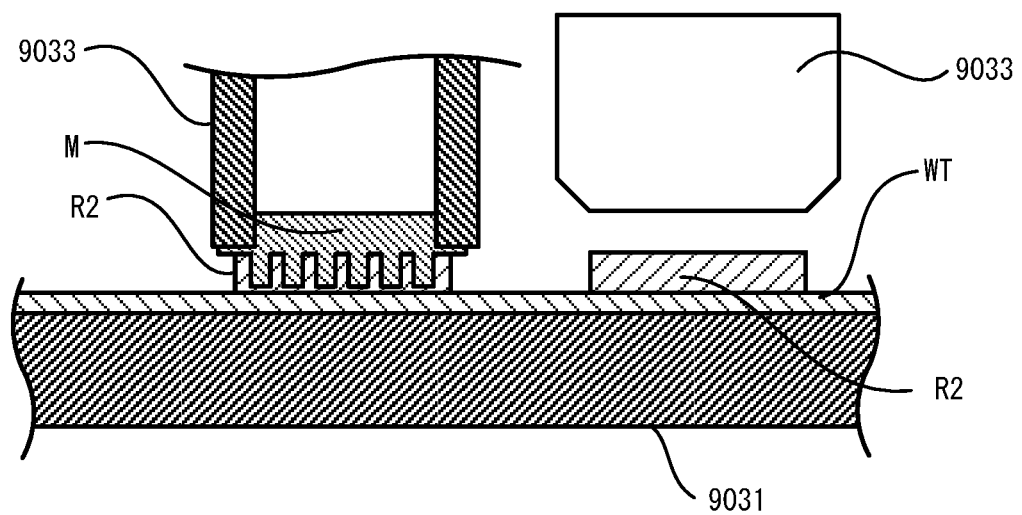
FIG. 36C is yet another drawing illustrating conditions under which, for the resin shaping device according to the comparative example, the mold is pressed against a resin layer.

However, a resin shaping device of a comparative example is proposed that is equipped, for example as illustrated in FIG. 36A, with a holding unit 9033 for holding a peripheral part of the mold M, a dispenser 9033 for applying a resin R2 to the substrate WT, and a stage 9031 for supporting the substrate WT. Due to application of air pressure to the central part of the mold M, the holding unit 9033 causes the central part of the mold M to bend (see arrow AR901 in FIG. 36A). The resin shaping device moves the stage 9031 such that the pre-molding resin R2 pre-applied to the substrate WT by the dispenser 9033 is moved so as to be disposed below the mold M. Then as illustrated in FIG. 36B for example, in the state in which the mold M in the atmosphere is bent, the resin shaping device causes the stage 9031 to approach the mold M (see arrow AR902 in FIG. 36B) so that the mold M is pressed against the resin R2. Thereafter, by pressing of the mold M against the resin, as illustrated in FIG. 36C, the resin is molded. At this time, contact of the resin starts with the mold central part, and contact spreads sequentially to the outer peripheral part, so that the gas bubbles are spread by contact and become expelled from the molded resin.

However, in the case of this resin shaping device, with increase in the aspect ratio of the concavity MT, air may be introduced without the resin R2 entering the inner part of the concavity MT. Moreover, warping may occur due to contact with the resin R2 in the state in which the mold M is bent. Moreover, even when the mold is pressed from the upper side under vacuum, without the resin applied to the lower side substrate maintaining a certain viscosity, the resin cannot fill all the way to the upwardly disposed mold concavity bottom. Moreover, even if the resin is applied beforehand to the upwardly disposed mold, the resin is unable to flow down. Moreover, particles falling on the substrate become introduced so that defects easily occur.

The resin shaping device 6 according to the present modified example, in contrast, pours the resin R1 into the concavity MT of the mold M in a state in which the cap 6524 contacts the mold M via the O-ring 6525 so that the degree of vacuum of the space S6 between the cap 6524 and the mold M is increased. Thereafter, the resin shaping device 6 opens the periphery of the mold M to the atmosphere. Due to such operation, even in a state in which the resin R1 is not introduced as far as the inner part of the concavity MT after pouring of the resin R into the mold M, for example, when the periphery of the mold M is opened to the atmosphere, the resin R1 is pushed into the inner part of the concavity MT by atmospheric pressure. Due to such operation, even when the aspect ratio of the concavity MT of the mold M is high, the resin part can be formed satisfactorily on the substrate WT. Moreover, the mold M is held in an orientation such that the concavity MT of the mold M faces upward, and thus even in a state in which the viscosity of the resin R1 is low, the resin shaping device 6 is capable of imprinting on the substrate MT after pouring of the resin R1 into the mold M. Therefore, providing the mold with a heating function for lowering viscosity of the resin is effective. In comparison to the conventional method, the mold is disposed downward, viscosity of the resin is lowered, and resin is applied under vacuum, and therefore resin can be formed at a high aspect ratio.

Furthermore, although an example is described in the above modified example in which the resin R1 is poured into the concavity MT of the mold M after the degree of vacuum of the space S6 between the cap 6524 and the mold M is increased, this operation is not limiting, and for example, the resin R1 may be poured into the concavity MT of the mold M, followed by increasing the degree of vacuum of the space S6. Alternatively, the degree of vacuum of the space S6 may be increased during the pouring of the resin R into the concavity MT of the mold M. In this case, gas bubbles included in the resin R1 poured into the concavity MT of the mold M are pushed out to the exterior of the resin R1, and thus gas bubbles included in the resin R1 poured into the concavity MT of the mold M are removed.

For Embodiment 2, an example is described above in which the pouring of the resin R1 into the mold M by the dispenser 52 and the forming of the resin part R are executed by the same resin shaping device 2. However, this configuration is not limiting, and the placement of the resin in the mold may be performed by a resin placing device separate from the resin shaping device. In this case, after pouring of the resin into the mold, the resin placing device conveys the mold to the resin shaping device. Then in the state in which the mold conveyed from the resin placing device is pressed against the substrate, the resin shaping device forms the resin part on the substrate by irradiation of the resin with ultraviolet light.

Figure 37A:
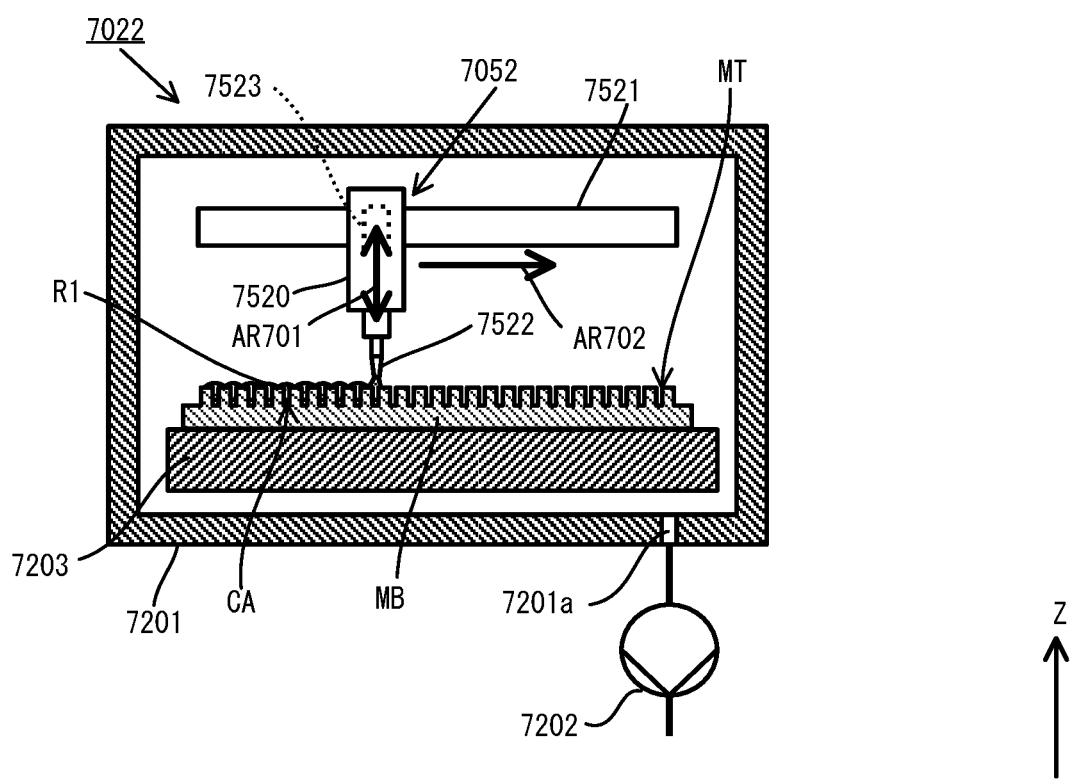
FIG. 37A is a drawing illustrating conditions under which, for a resin forming system according to a modified example, the resin is poured into a mold from a dispenser.

As illustrated in FIG. 37A, a resin placing device 7022 is equipped with a chamber 7201, a dispenser 7052, and a vacuum pump (vacuum source) 7202. The dispenser 7052 has a main unit 7520, a dispenser drive unit 7521, a nozzle 7522, and a dispensing control unit 7523. The main unit 7520 is capable of movement in both the Z direction and a direction perpendicular to the Z direction. Part of the chamber 7201 is provided with an exhaust port 7201a. The chamber 7201, for example, is made of metal. A head 7203 supporting the mold MB is capable of movement by a non-illustrated head drive unit between the resin placing device 7022 and a below-described resin shaping device. Moreover, in plan view, the mold MB has a size comparable to that of the substrate WT.

Figure 37B:
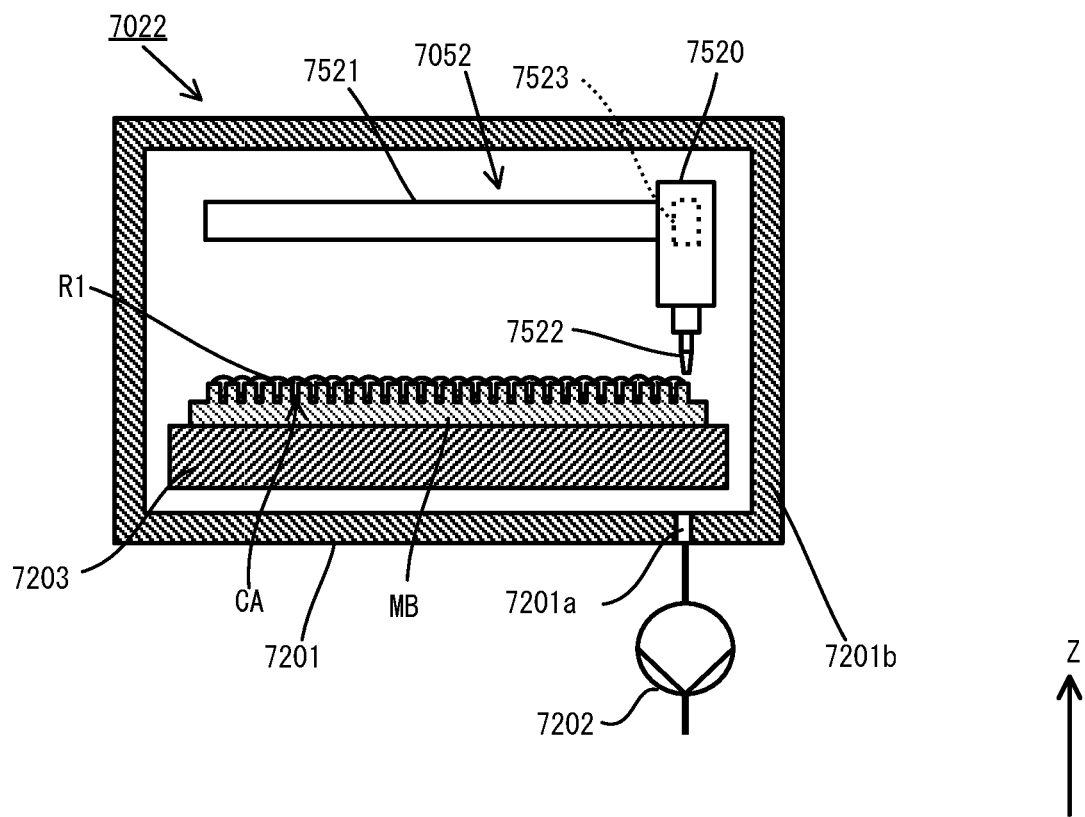
FIG. 37B is another drawing illustrating conditions under which, for the resin forming system according to the modified example, the resin is poured into the mold from the dispenser.
Figure 38A:
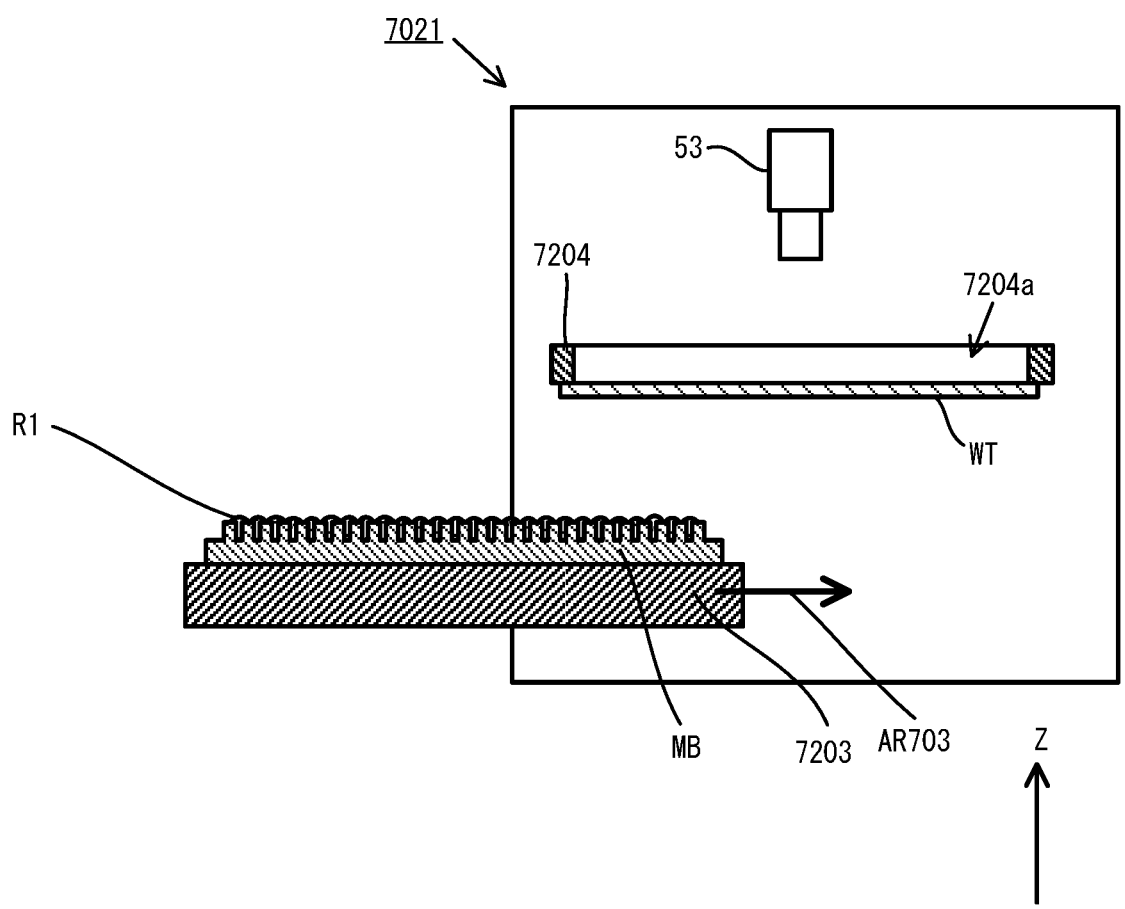
FIG. 38A is a drawing illustrating conditions under which, for the resin forming system according to the modified example, the mold is conveyed.

As illustrated in FIG. 38A, the resin shaping device 7021 is equipped with a stage 7204 for supporting the substrate WT and the ultraviolet irradiating unit 53 disposed above an opening part 7204a provided in the stage 7204. Structures in FIGS. 37A to 39B that are the same as those of Embodiment 2 are assigned the same reference signs as those of FIG. 15. The resin shaping device 7021 forms the resin part on the substrate WT by using the ultraviolet irradiating unit 53 to irradiate with ultraviolet light the resin R1 in a state in which the mold MB into which resin R1 is poured is pressed against the substrate WT. Moreover, a substrate WT or mold MB alignment function is included in this resin shaping device 7021 to enable correction of positional displacement in a state in which the resin R2 is inserted between the substrate WT and the mold MB. The resin shaping device 7021 is equipped with a non-illustrated mold orientation adjusting unit for adjusting orientation of the mold MB and a non-illustrated distance measuring unit for measurement of distance between the forming face WTf of the substrate WT and the flat surface of the mold MB by use of a laser, for example, at three or more locations on the mold MB. Then on the basis of the measurement results of the distance measuring unit, the mold orientation adjusting unit adjusts parallelism of the mold MB relative to the substrate WT and distance between the flat surface of the mold MB and the forming face WTf of the substrate WT.

Operation of the resin forming system according to the present modified example is described below with reference to FIGS. 37A to 39B. Firstly, as illustrated in FIG. 37A, the resin placing device 7022 increases the degree of vacuum within the chamber 7201 by using the vacuum pump 7202 connected to the exhaust port 7201a of the chamber 7201 to exhaust to the exterior of the chamber 7201 the gas present within the chamber 7201. Next, in the state in which the degree of vacuum within the chamber 7201 is greater than or equal to a predetermined degree of vacuum, the resin placing device 7022 dispenses the resin into the concavity MT of the mold M from the dispenser 7052 disposed within the chamber 7201. By repeated moving of the main unit 7520 of the dispenser 7052 in the direction perpendicular to the Z direction (see arrow AR702 in FIG. 37A) and in the Z direction (see arrow AR701 in FIG. 37A), the resin placing device 7022 pours the resin R1 into multiple concavities MT of the mold MB. At this time, voids CA can be generated inside the concavities MT of the mold MB.

Figure 38B:
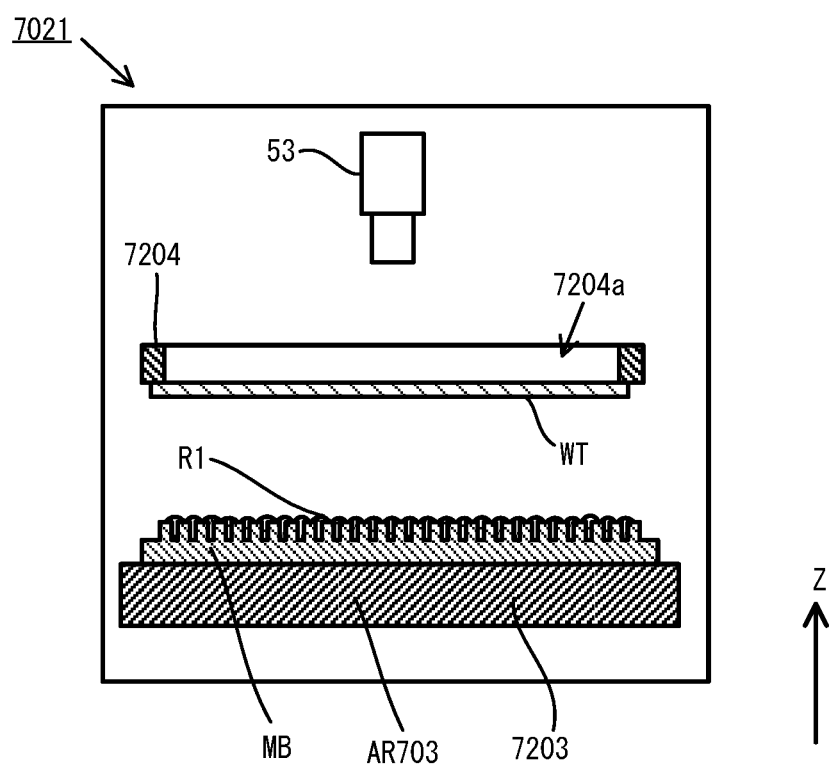
FIG. 38B is a drawing illustrating conditions of placement, for the resin forming system according to the modified example, of the mold within a resin shaping device.
Figure 39A:
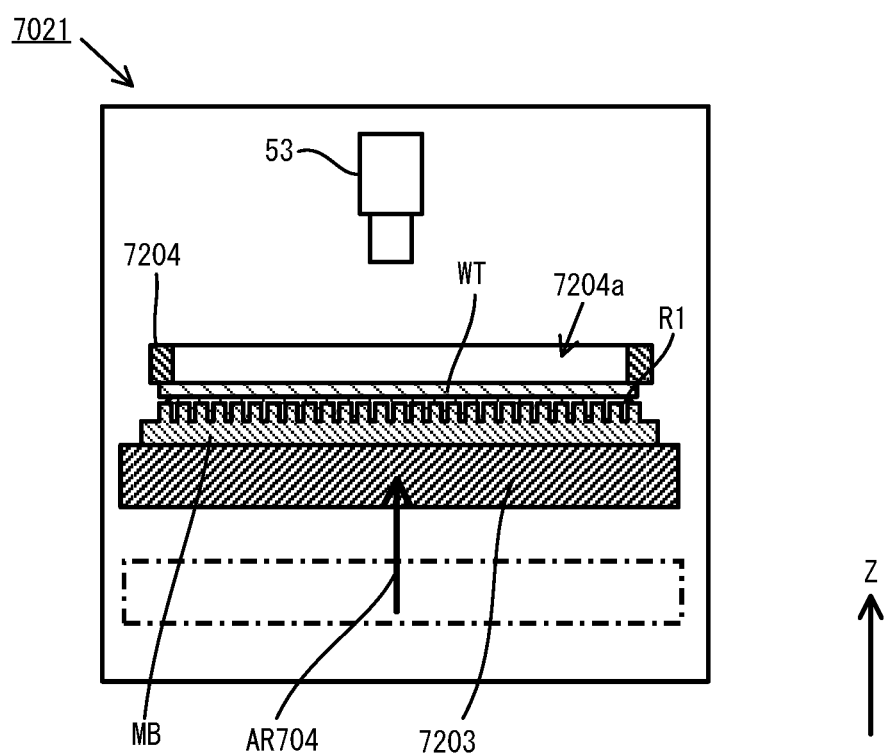
FIG. 39A is a drawing illustrating conditions under which, for the resin forming system according to the modified example, the mold is pressed against the substrate.
Figure 39B:
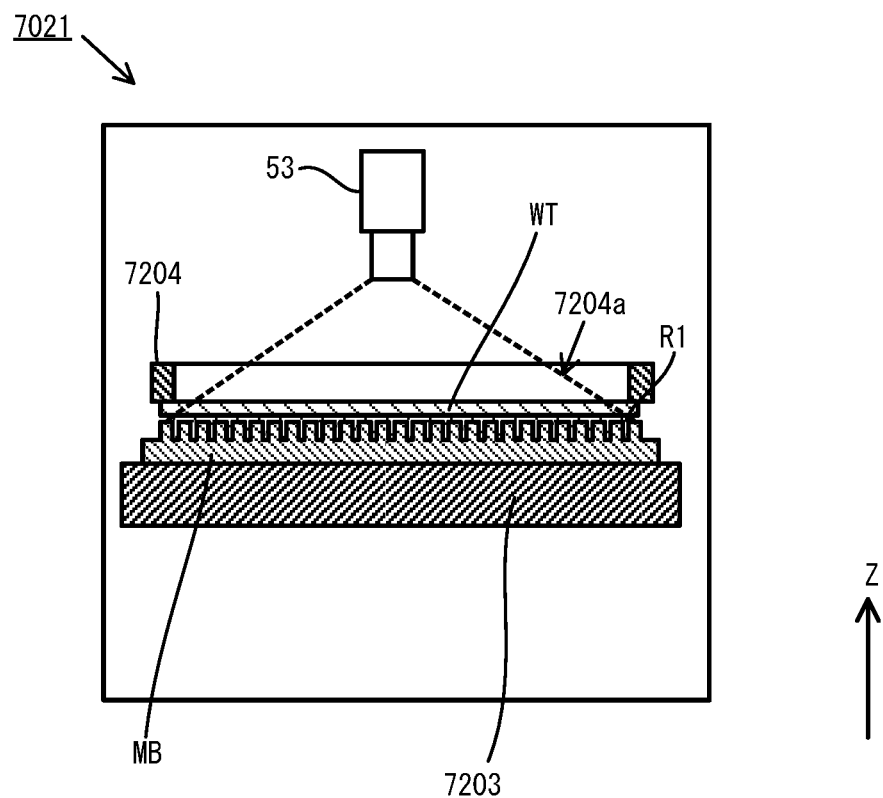
FIG. 39B is a drawing illustrating conditions under which, for the resin forming system according to the modified example, the resin is irradiated with ultraviolet light.

Thereafter, upon pouring of the resin R1 in all of the concavities MT of the mold MB as illustrated in FIG. 37B, the resin placing device 7022 opens the interior of the chamber 7201 to the atmosphere. Due to such operation, the resin R1 poured into the concavities MT of the mold MB is pressed by atmospheric pressure to the inner part of the concavities MT of the resin R1, and the voids CA generated in the inner parts of the concavities MT are eliminated. Then as illustrated in FIG. 38A, the mold MB is conveyed to the resin shaping device 7021, and as illustrated in FIG. 38B, the mold MB is disposed below the substrate WT. Thereafter, as illustrated in FIG. 39A, in a step prior to conveyance to the resin shaping device 7021, the resin shaping device 7021 pressed the mold MB having the resin R2 poured into the concavities MT against the substrate WT. Thereafter, as illustrated in FIG. 39B, the resin shaping device 7021 executes batch forming by using the ultraviolet irradiating unit 52 to irradiate the resin R2 with ultraviolet light. Here, even though the resin shaping device 7021 has a function for performing batch forming in a vacuum, in the case in which the aspect ratio of the concavities MT of the mold MB is high, the resin R2 does not enter as far as the inner parts of the concavities MT. Thus as in the resin forming system according to the present modified example, in a step prior to conveying of the mold MB to the resin shaping device 7021, the resin R2 is preferably poured into the concavities MT of the mold MB in a state in which the mold MB is disposed below the dispenser 7052 within the chamber 7201 of the resin placing device 7022 under a high degree of vacuum.

Further, the above-described resin forming system may be equipped with a non-illustrated mold heating unit for heating the mold MB in a state in which the mold MB is supported by the head 7203. Alternatively, the aforementioned resin forming system may be equipped with a non-illustrated vibrating member for vibrating the mold MB in a state in which the mold MB is supported by the head 7203.

Moreover, although the resin placing device 7022 according to the aforementioned modified example is configured to pour the resin into the multiple concavities MT of the mold MB using the dispenser 7052, the resin placing device is not limited to a configuration using the dispenser. For example, the resin placing device may be configured to apply the resin R to the mold MB by a printing method using a squeegee blade within the chamber 7201. Furthermore, although the aforementioned resin shaping device 7021 is configured to form the resin part with the mold MB pressed against the substrate WT in the atmosphere, this configuration is not limiting, a non-illustrated chamber may be provided, and the resin part may be formed with the mold MB pressed against the substrate WT within the chamber in a state with an increased degree of vacuum within the chamber.

Furthermore, the method of heating the mold M in the case of opening the space S6 to the atmosphere and cooling the mold M in the case of application of the resin R1 to the mold M in the state of a high degree of vacuum in the space S6 is not limited to application to the aforementioned resin shaping device equipped with the cap 6524. For example, this method may be applied to the resin placing device 7022 or the resin shaping device 7021 described above in FIGS. 37A to 39B.

The series of operations from the placement of the mold MB in the state of a high degree of vacuum and application of the resin R2 to the mold MB until the forming of the resin part on the substrate WT is described below. Firstly, the mold MB is cooled in a state in which the mold MB is in an environment with a high degree of vacuum. Next, the resin R2 is applied to the cooled mold MB in the environment of the high degree of vacuum. Thereafter, the periphery of the mold MB is returned to an atmospheric pressure environment, the mold MB is heated, and the resin R2 applied to the mold MB is softened. Due to such operation, the resin R2 smoothly fills the inner part of the concavity MT of the mold MB. Thereafter, the resin R2 is pressed against the substrate WT. At this time, in order to suppress the incorporation of air between the substrate WT and the resin R2, the mold MB is again cooled so that the resin R2 is pressed against the substrate WT in a state in which the viscosity of the resin R2 is raised. Further, due to surface area of the part facing the substrate WT being large in comparison to the mold MB, high pressure is to be used when pressing the mold MB against the substrate WT. Therefore, during pressing of the mold MB against the substrate WT, the mold MB may be heated to cause a lowering of viscosity of the resin R2, thereby lowering the pressure when pressing the mold MB against the substrate WT. Multiple resin parts can be formed on the substrate WT by repetition of the above-described series of operations.

Furthermore, in the case of application of the resin R2 to the mold MB in the atmosphere, during the application of the resin R2 to the mold MB, the viscosity of the resin R2 may be lowered by heating the mold MB. Then during the pressing of the mold MB against the substrate WT, by cooling the mold MB so as to lower the viscosity of the resin R2, the incorporation of air between the substrate WT and the resin R2 may be suppressed. Moreover, if lowering of the pressure of pressing the mold MB against the substrate WT is desired, the mold MB may be heated to lower the viscosity of the resin R2. The resin R2 may be an ultraviolet light curing type resin, a thermosetting type resin, or a thermoplastic type resin.

In Embodiment 2 an example of the resin shaping device 2 is described in which the resin R1 is placed in the mold M, that is, the resin R1 is poured into the concavity MT of the mold M, and thereafter in a state in which the mold M is pressed against the substrate WT from below the substrate WT, the resin R is irradiated with ultraviolet light, thereby forming the resin part. However, this configuration is not limiting, and for example, a configuration may be used that applies the resin beforehand to the surface of the substrate WT for forming the resin part, and the resin shaping device irradiates with ultraviolet light in a state in which the mold M is pressed against the substrate WT from below the substrate WT disposed in an orientation at which the side where the resin is applied is downward facing. Alternatively, the resin shaping device may be configured to irradiate the resin with ultraviolet light in a state in which, after pouring of the resin into the mold M, the mold M is pressed against the resin from below the substrate WT to which resin is applied.

The present configuration is advantageous in that the flow of gas into the concavity MT of the mold M is suppressed so that the amount of resin entering the interior of the concavity MT of the mold M is relatively stable, thereby making the shapes of the resin parts formed on the substrate WT stable. Further, a configuration may be used that equips the resin shaping device with a non-illustrated chamber, and in a state in which the interior of the chamber has a high degree of vacuum within the chamber, presses the mold MB against the substrate WT having the resin layer formed thereon. In this case, hardly any gas is present within the concavity MT of the mold M, thereby suppressing the generation of molding failures caused by gas present within the concavity MT of the mold M.

Figure 40A:
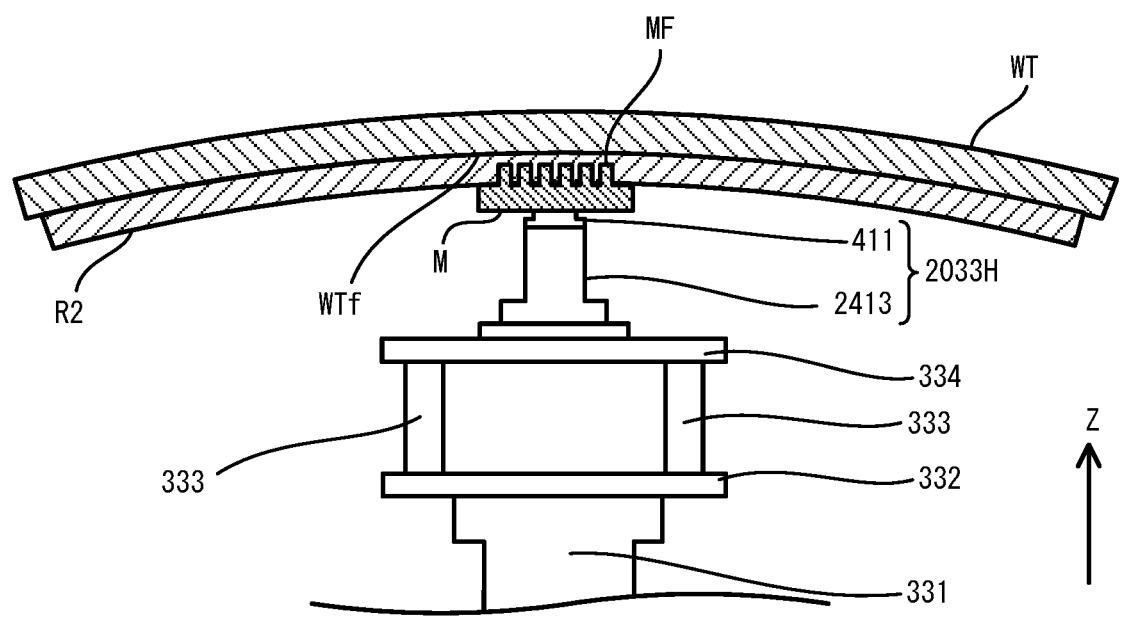
FIG. 40A is a drawing illustrating conditions under which, for a resin shaping device according to the modified example, the mold is pressed against a resin layer.
Figure 40B:
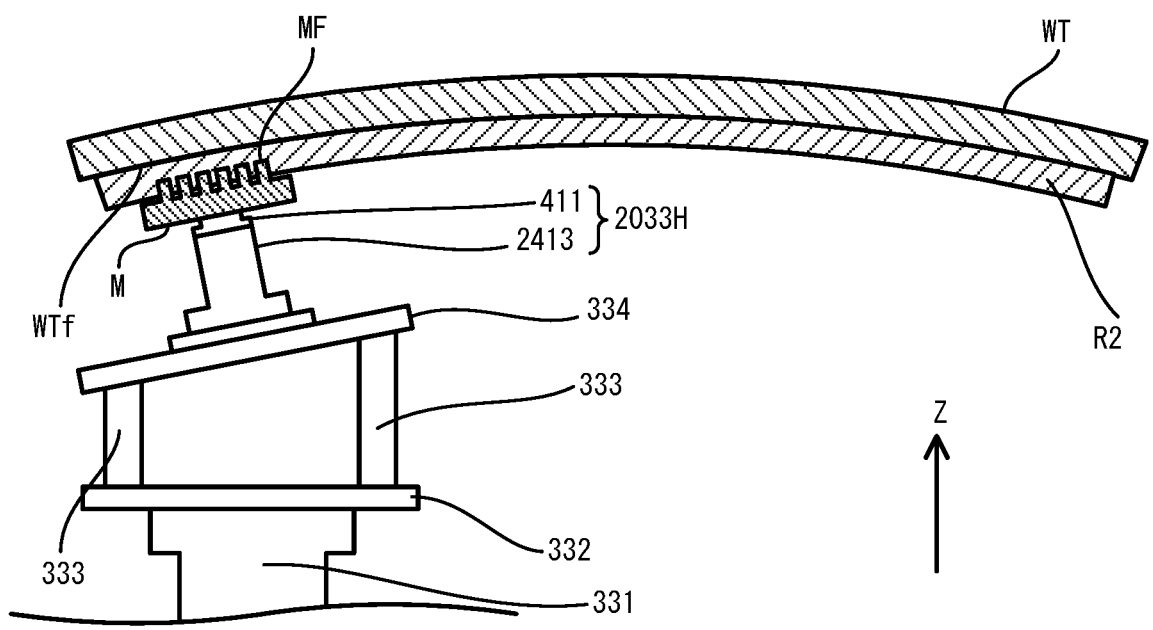
FIG. 40B is another drawing illustrating conditions under which, for a resin shaping device according to the modified example, the mold is pressed against a resin layer.

In the resin shaping device 2 according to Embodiment 2, as illustrated in FIGS. 40A and 40B for example, the tilt of the mold M may be adjusted such that, for each position of the substrate WT at which the mold M is pressing, the flat surface MF of the mold M and the forming face WTf of the substrate WT are made parallel. The resin shaping device 2 adjusts the tilt of the mold M by adjusting a tilt angle of the second disc member 334 relative to a horizontal plane and a tilt angle of the head 2033H fixed thereto. Here, the resin shaping device 2 adjusts the tilt angle of the head 2033H by Z direction extension and contraction of three piezo actuators 333 interposed between the first disc member 332 and the second disc member 334. Among the resin forming processing described in Embodiment 2, the resin shaping device 2 may perform the adjustment of tilt of the mold M, for example, during the processing to execute pre-alignment of the mold M of step S204, or alternatively, during the processing to execute immersion alignment in the state in which the resin R1 placed on the mold M is contacted with the forming face WTf of the substrate WT in step S206. As illustrated in FIGS. 40A to 40B for example, the three piezo actuators 333 change the orientation (tilt) of the mold M in the case of pressing of the mold M against the central part of the substrate WT, and also in the case of pressing of the mold M against the peripheral part of the substrate WT. Moreover, the resin shaping device may correct the position and the orientation of the mold M against the substrate WT in the state in which the mold M is made to contact the substrate WT through the resin placed of the mold M. Moreover, on the basis of the distance between the forming face WTf of the substrate WT and the flat surface MF of the mold M, the resin shaping device may adjust at least one of the distance between the forming face WTf and the flat surface MF or the tile of the flat surface MF relative to the forming face WTf.

Further, although an example is described in Embodiment 2 in which the resin shaping device 2 interposes the three piezo actuators 333 between the first disc member 332 and the second disc member 334, the number of the piezo actuators interposed between the first disc member 332 and the second disc member 334 is not limited to three. For example, the resin shaping device may be configured to interpose two piezo actuators, or at least four piezo actuators, between the first disc member 332 and the second disc member 334.

However, when the mold M is pressed against the substrate WT to which the resin R2 is applied at the vicinity of the outer peripheral part of the substrate WT, the mold M becomes tilted relative to the forming face WTf of the substrate WT due to displacement of the pressure center relative to the mold M. In this case, the mold M cannot be pressed against the resin R2 in a state of application of uniform pressure to the entire mold M, and satisfactory forming of the resin part can be difficult.

In contrast, in the case of the present modified example, the resin shaping device 2 adjusts the tilt of the mold M such that the flat surface MF of the mold M and the forming face WTf of the substrate WT become parallel at each position for pressing the mold M on the substrate WT. Due to such operation, the mold M can be pressed against the resin R2 in a state in which pressure is imparted uniformly to the entire mold M, and thus the resin part can be satisfactorily formed. Moreover, due to structure of the head holding the substrate WT, cases may occur in which curvature differs between the central part and the outer peripheral part of the substrate WT as illustrated in FIGS. 40A and 40B. Also in such cases, according to the present modified example, by adjusting the tilt of the mold M at the central part and at the outer peripheral part of the substrate WT, the resin shaping device 2 can press the mold M against the resin R2 in a state in which pressure is imparted uniformly to the entire mold M at both the central part and the outer peripheral part.

For the resin shaping device 2 according to Embodiment 2, an example is described in which the ultraviolet irradiating unit 53 is disposed above the stage 2031. However, the disposal of the ultraviolet irradiating unit 53 is not limited to this configuration, a configuration may be used that disposes the unit below the stage 31 in the case where the substrate WT is non-transparent with respect to ultraviolet light. In this case, the ultraviolet irradiating unit 53 irradiates the resin part R with ultraviolet light from below the substrate WT. Furthermore, a Si substrate is cited as a substrate that is non-transparent to ultraviolet light. Moreover, irradiation with ultraviolet light from below the mold M may be performed by using a transparent mold M formed from a transparent glass. The degree of freedom of placement of the ultraviolet irradiating unit 53 can be increased according to the present configuration, and thus the present configuration has the advantage of a large degree of freedom in the design of the resin shaping device 2.

In each of the embodiments, examples are described in which the head drive unit 36 is capable only of moving the bonding unit 33 (2033) in the Z direction and causing rotation of such around the axis BX. However, this configuration is not limiting, and a configuration may be used in which the head drive unit 36 is capable of moving the bonding unit 33 (2033) in the X axis direction or the Y axis direction. In this case, after reception of the chip CP from the chip conveying unit 39, for example, the head drive unit 36 may move the bonding unit 33 (2033) in the X axis direction or the Y axis direction to a position facing the head 33H (2033H) and the location of mounting the chip CP on the substrate WT.

In Embodiment 1, an example is described in which two first imaging units 35*a* and 35*b* are provided, and simultaneously the images Ga and Gb are taken that include the alignment marks MC1*a* and MC1*b*. However, this configuration is not limiting, and a configuration may be used in which a single first imaging unit 35*a* is capable of moving in a plane perpendicular to the Z direction, and the first imaging unit 35*a* is configured to sequentially take the images Ga and Gb, which include the alignment marks MC1*a* and MC1*b*, during movement within the plane perpendicular to the Z direction.

In Embodiment 1, a configuration is described in which the two first imaging units 35*a* and 35*b* take images that include the alignment marks MC1*a*, MC1*b*, MC2*a*, and MC2*b* provided on the substrate WT and the chip CP. However, this configuration is not limiting, and a configuration may be used that disposes, above the stage 31, two non-illustrated imaging units other than the first imaging units 35*a* and 35*b*, for example. In this case, images that include the alignment marks MC1*a* and MC1*b* of the chip CP may be taken by the two first imaging units 35*a* and 35*b*, and images that include the alignment marks MC2*a* and MC2*b* of the substrate WT may be taken by the other two imaging units.

In Embodiment 1, an example is described of the chip supplying unit 11 in which the picking mechanism 111 pushes the needle 111*a* out vertically downward (−Z direction) from the vertically overhead direction (+Z direction) on the dicing tape TE to push the chip CP vertically downward (−Z direction), thereby supplying the chip. However, the configuration of the chip supplying unit 11 is not limited to this configuration. For example, the chip supplying unit may be configured apply suction from above the dicing tape TE to peel off the chip CP from the dicing tape TE and then to supply the chip CP. Alternatively, by irradiating the dicing tape TE with ultraviolet light to cause a lowering of adhesive force of the dicing tape TE to which the chip CP is attached, the chip supplying unit may peel away the chip CP from the dicing tape TE, and then the chip CP may be supplied.

In Embodiment 1, an example is described in which the first imaging units 35*a* and 35*b* each use reflected illumination light, such as infrared light, emitted from the light source of the coaxial illumination system, and the images are acquired that include the alignment marks MC1*a* and MC1*b* of the chip CP and the alignment marks MC2*a* and MC2*b* of the substrate WT. However, this configuration is not limiting, and a configuration may be used in which, for example, transmitted light transmitted through the chip CP from light sources provided at sides opposite to the first imaging units 35*a* and 35*b* are used to acquire the alignment marks MC1*a* and MC1*b* of the chip CP and the alignment marks MC2*a* and MC2*b* of the substrate WT. For example, a configuration may be used in which a second imaging unit 41 disposed vertically above the substrate WT uses coaxial light of the first imaging units 35*a* and 35*b* irradiated from above the chip CP to acquire images that include the alignment marks MC1*a*, MC1*b*, MC2*a*, and MC2*b*. Alternatively, a configuration may be used in which the first imaging units 35*a* and 35*b* use coaxial light emitted from the second imaging unit 41 disposed vertically above the substrate WT to acquire the images that include the alignment marks MC1*a*, MC1*b*, MC2*a*, and MC2*b*. In the case in which the substrate WT is transparent to visible light, the coaxial light emitted from the first imaging units 35*a* and 35*b* or the second imaging unit 41 may be visible light.

In Embodiment 1, a configuration is described in which the first imaging units 35*a* and 35*b* acquire the images that include the alignment marks MC1*a* and MC1*b* of the chip CP and the alignment marks MC2*a* and MC2*b* of the substrate WT. However, this configuration is not limiting, and for example, a configuration may be used in which the first imaging units 35*a* and 35*b* acquire images that include the alignment marks MC1*a* and MC1*b* of the chip CP, and the second imaging unit 41 acquires the images that includes the alignment marks MC2*a* and MC2*b* of the substrate WT. In this case, the alignment marks MC1*a*, MC1*b*, MC2*a*, and MC2*b* can be acquired even in the case, such as that of a layered chip CP, in which the coaxial light emitted from the first imaging units 35*a* and 35*b* or the coaxial light emitted from the second imaging unit 41 is not transmitted through the layered chip CP. Moreover, the alignment mars MC1*a* and MC1*b* and the alignment marks MC2*a* and MC2*b* can be recognized separately using respective cameras, thereby shortening the period required for recognition of the alignment marks MC1*a*, MC1*b*, MC2*a*, and MC2*b*. Moreover, rather than recognizing the two alignment marks MC2*a* and MC2*b* of the substrate WT side each time, the two alignment marks MC2*a* and MC2*b* of a single measurement may be used each time the substrate WT is replaced, and performance of recognition only for the θ direction displacement of the substrate WT is permissible. Such operation is used for improvement of throughput or when recognition or a single alignment mark is sufficient due to the θ direction displacement amount of the substrate WT being recognized already in the mounting of a single chip CP on the substrate WT by the chip mounting system.

Moreover, a configuration may be used in which the second imaging unit 41 acquires the images that include the alignment marks MC1*a* and MC1*b* of the chip CP and the alignment marks MC2*a* and MC2*b* of the substrate WT. By using a single image capture without moving the focal axis for simultaneous recognition of the set of the alignment marks MC1*a* and MC2*a* and the alignment marks MC1*b* and MC2*b* using the same second imaging element and the alignment marks MC1*a* and MC1*b* of the chip CP and the alignment marks MC2*a* and MC2*b* of the substrate WT imaged by the same second imaging unit 41 using infrared light in a state in which the chip CP is made to contact the forming face WTf of the substrate WT, the positional displacement between the chip CP and the substrate WT can be recognized with high accuracy. Moreover, the same applies also for the configuration that simultaneously recognizes the alignment marks MC1*a* and MC1*b* of the chip CP and the alignment marks MC2*a* and MC2*b* of the substrate WT by using the chip CP side first imaging units 35*a* and 35*b*.

Embodiment 1 may use a configuration in which, in the state in which the chip mounting system 1 causes the chip CP and the substrate WT to contact each other, the positional displacement of the chip CP relative to the substrate WT is calculated, and on the basis of the calculated positional displacement amount, the position of the chip CP is corrected. In this case, after calculation of the positional displacement of the chip CP relative to the substrate WT in the state in which the chip CP and the substrate WT contact each other, the chip mounting system 1, after causing the chip CP to separate from the substrate WT, moves the chip CP in the direction opposite of, and of the same amount as, the positional displacement amount. Thereafter, the chip mounting system 1 causes the chip CP and the substrate WT to again contact each other. The chip CP can be mounted with high accuracy on the substrate WT according to the present configuration.

In Embodiment 1, the bonding device 30 may be equipped with a non-illustrated distance measuring unit for measuring the distance between the mounting face WTf of the substrate WT and the connecting face CPf of the chip CP for at least three locations on the connecting face (flat surface) CPf of the chip CP. The distance measuring unit may have, for example, non-illustrated laser light sources disposed at multiple locations above the head 33H, and a non-illustrated photoreception unit for receiving laser light emitted from each of the multiple laser light sources and reflected from the substrate WT. Then in step S7 (component mounting step) of FIG. 9 of Embodiment 1 as described above, on the basis of the distance measured by the distance measuring unit, the head drive unit 36 may cause the head 33H holding the chip CP to approach the stage 31 holding the substrate WT. Moreover, on the basis of the distance between the mounting face WTf of the substrate WT and the connecting face CPf of the chip CP measured by the distance measuring unit, the three piezo actuators 333 may adjust at least one of the distance between the mounting face WTf of the substrate WT and the chip CP or the tilt of the chip CP relative to the mounting face WTf of the substrate WT.

Figure 41A:
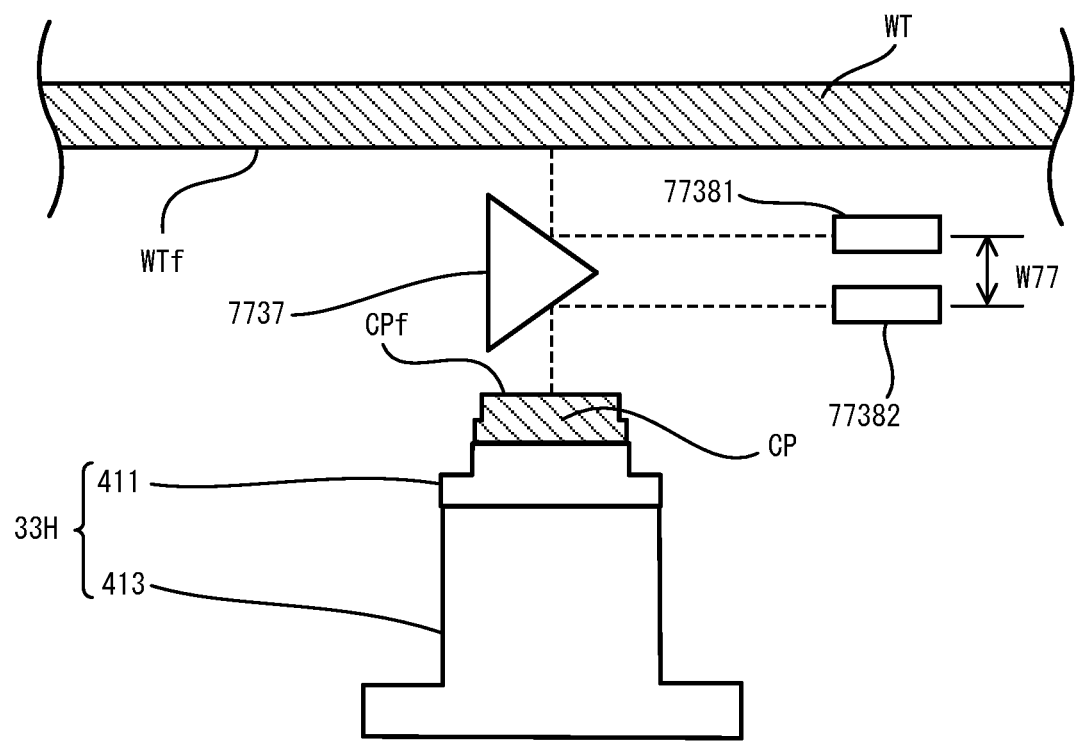
FIG. 41A is a schematic drawing of a bonding device according to a modified example.

In Embodiment 1, the bonding device 30, for example, may be equipped with a prism 7737 capable of disposal between the substrate WT and the chip CP as illustrated in FIG. 41A and two distance measuring units 77381 and 77382 disposed to the side of the prism 7737, and the distance measuring unit 77381 may have a laser light source for directing laser light toward the prism 7737 and a photoreception unit for receiving light reflected from the mounting face WTf of the substrate WT and returned via the prism 7737. Moreover, the distance measuring unit 77382 includes a laser source for directing laser light toward the prism 7737, and a photoreception unit for receiving light reflected from the connecting face CPf of the chip CP via the prism 7737. In this case, the bonding device 30 calculated the distance between the substrate WT and the chip CP from the a distance between the prism 7737 and the mounting face WTf of the substrate WT measured by the distance measuring unit 77381, distance between the prism 7737 and the connecting face CPf of the chip CP measured by the distance measuring unit 77382, and a distance W77 between the two distance measuring units 77381 and 77382. Then on the basis of the calculated distance, the bonding device 30 adjusts at least one of the distance between the mounting face WTf of the substrate WT and the chip CP or the tilt of the chip CP relative to the mounting face WTf of the substrate WT.

Figure 41B:
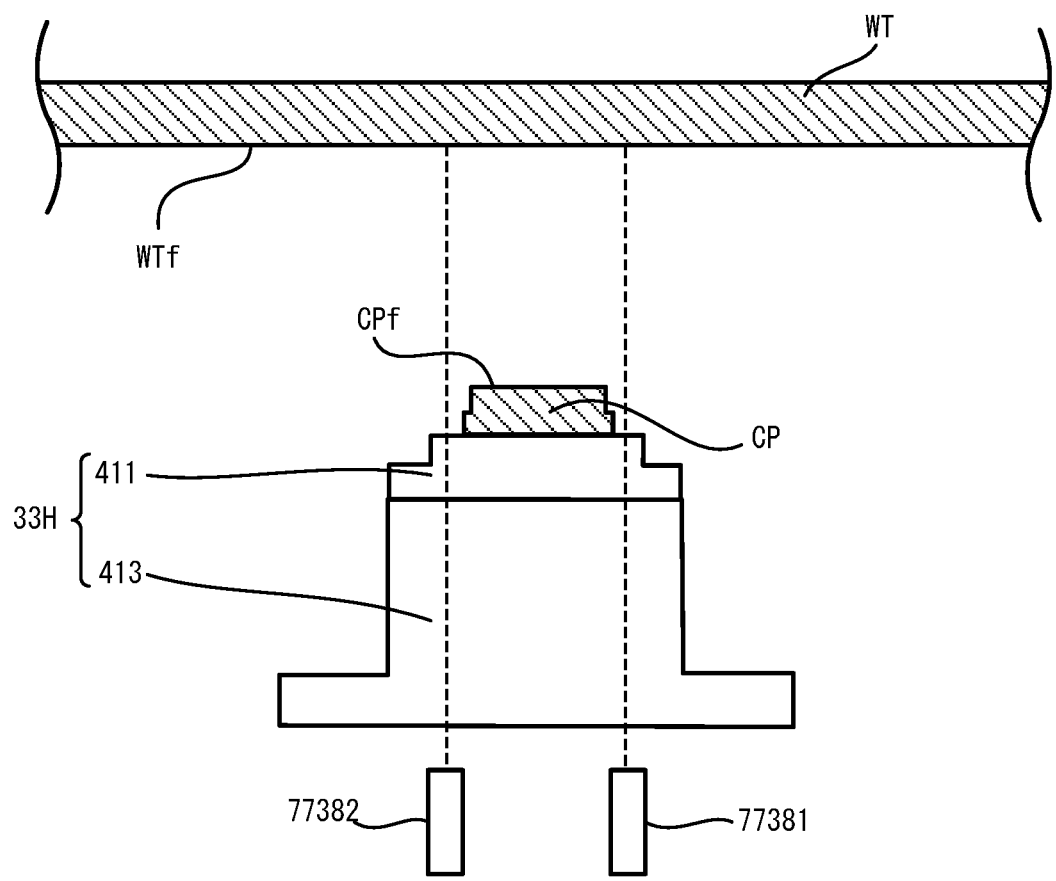
FIG. 41B is a schematic drawing of a bonding device according to another modified example.

Furthermore, in Embodiment 1, the bonding device 30, for example, may be equipped with a distance measuring unit for measuring a distance between the substrate WT and the distal part of the head 33H, as illustrated in FIG. 41B. In this case, the chip mounting system is equipped with a non-illustrated thickness measuring unit for measuring beforehand thickness of the chip CP, and on the basis of a distance obtained by subtracting thickness of the chip CP from the distance between the distal part of the head 33H and the mounting face WTf of the substrate WT measured by the distance measuring unit, the bonding device 30 adjusts at least one of the distance between the mounting face WTf of the substrate WT and the chip CP or the tilt of the chip CP relative to the mounting face WTf of the substrate WT.

Moreover, in the case in which the substrate WT does not reflect laser light, the distance measuring unit may measure the distance between the stage 31 and the distal part of the head 33H in a state in which the substrate WT is not held by the stage 31 and the chip CP is not held by the head 33H. In this case, the chip mounting system is equipped with a non-illustrated thickness measuring unit for measuring beforehand thickness of the substrate WT and thickness of the chip CP, and the bonding device 30, on the basis of the distance found by subtracting the thickness of the substrate WT and the thickness of the chip CP from the distance between the stage 31 and the distal part of the head 33H measured by the distance measuring unit, adjusts at least one of the distance between the mounting face WTf of the substrate WT and the chip CP or the tilt of the chip CP relative to the mounting face WTf of the substrate WT. Moreover, if thickness is known beforehand without measurement within the chip mounting system, the measurement unit may use that value for the measurement of the distance of the chip or the substrate.

In Embodiment 1, a non-illustrated water supplying unit may be provided for attaching water to the connecting face CPf of the chip CP by supplying water to the connecting face CPf of the chip CP by applying water to the connecting face CPf of the chip CP. In this case, after the chip CP is supplied from the supplying unit 11 of the chip supplying device 10, during the period until the chip CP held by the head 33H of the bonding device 30 contacts the mounting face WTf of the substrate WT, the water supplying unit supplies water to the connecting face CPf of the chip CP. The water supplying unit, for example, may have a non-illustrated water dispensing unit that sprays water against the connecting face CPf and faces the connecting face CPf of the chip CP in the state in which the chip CP is held by the chip holding unit 391a of the chip conveying unit 39. Alternatively, the chip supplying device 10 may be provided with the water supplying unit. In this case, the non-illustrated water dispensing unit of the water supplying unit may spray water against the connecting face CPf of the chip CP in a state in which the chip CP is held by the arm 1311 in an orientation so that the connecting face CPf of the chip CP faces vertically upward upon delivery to the arm 1311 of the chip inverting unit 131 from the chip supplying unit 11.

Moreover, in the configuration equipped with the aforementioned water supplying unit, a cleaning unit may also be provided for removing particles attached to the connecting face CPf prior to the supplying of water to the connecting face CPf of the chip CP. The cleaning unit may have configurations such as a configuration that blows a gas such as nitrogen or helium, a configuration that sprays water during application of ultrasound, megasonic treatment, or the like, or a configuration that mechanically wipes off particles attached to the connecting face CPf. By use of a configuration that sprays water during the application of ultrasound, megasonic treatment, or the like, functions can be jointly provided for both the supplying of water to the connecting face CPf and the removal of particles.

Moreover, the water supplying unit may have a non-illustrated water dispensing unit provided for the stage 31 of the bonding device 30. In this case, in the state in which the chip CP is held by the head 33H and immediately prior to the mounting of the chip CP on the substrate WT, after driving of the stage 31 so that the water dispensing unit is positioned above the chip CP, the water may be sprayed against the connecting face CPf of the chip CP from the water dispensing unit.

Figure 42:
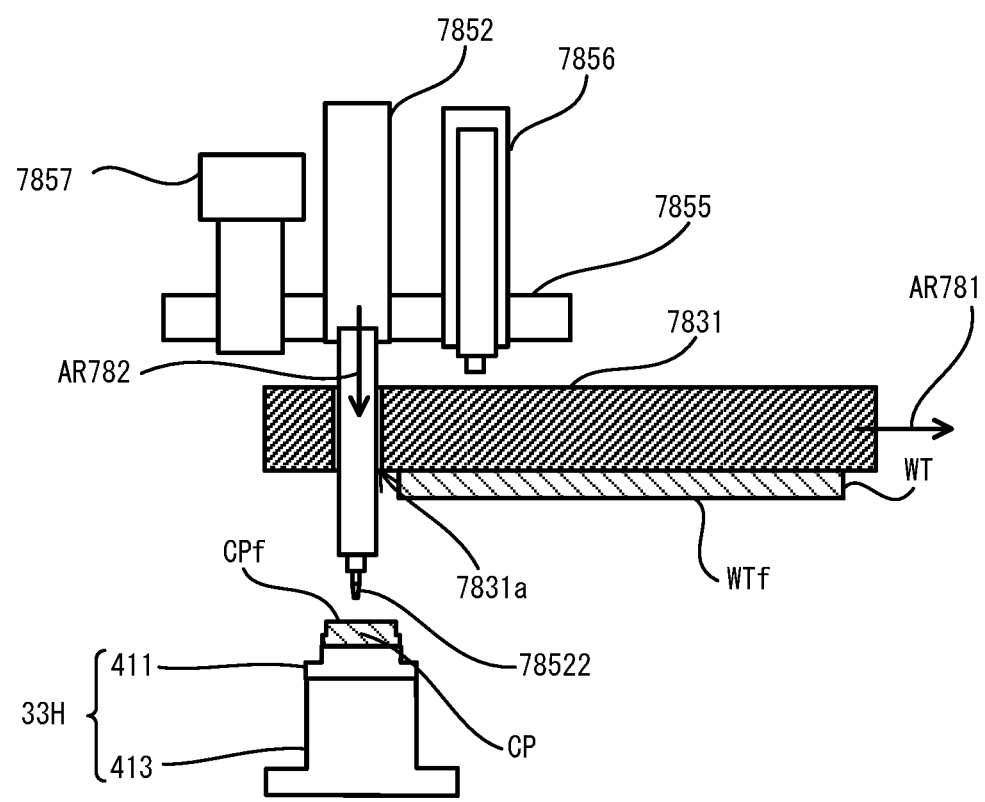
FIG. 42 is a schematic drawing of the bonding device according to the modified example.

Alternatively, as illustrated in FIG. 42, a water supplying unit 7852, a cleaning head 7856, and a camera 7857 may be supported by a supporting unit 7855 disposed above the stage 7831 in the bonding device 30, and a nozzle 78522 may be provided that is capable of vertical movement. This supporting unit 7855 is capable of moving freely in the vertical direction and within a horizontal plane perpendicular to the vertical direction. In this case, in the state in which the chip CP is held by the head 33H, immediately prior to mounting of the chip CP on the substrate WT, the stage 7831 is moved (see arrow AR781 in FIG. 42), thereby retracting the substrate WT from above the chip CP. At this time, the stage 7831 is moved so that a through hole 7831a provided in the stage 7831 is vertically below the water supplying unit 7852. Next, the water supplying unit 7852 inserts the nozzle 78522 into the through hole 7831a by movement vertically downward (see arrow AR782 in FIG. 42), causes the distal end of the nozzle 78522 to approach the connecting face CPf of the chip CP, and sprays water against the connecting face CPf of the chip CP. Moreover, a cleaning head 7856 can remove particles on the connecting face CPf of the chip CP by moving the stage 7831 so as to similarly position the through hole 7831a, then lowering the cleaning head 7856 vertically downward, and causing the distal end to approach the connecting face CPf of the chip CP by insertion through the through hole 7831a.

Figure 43:
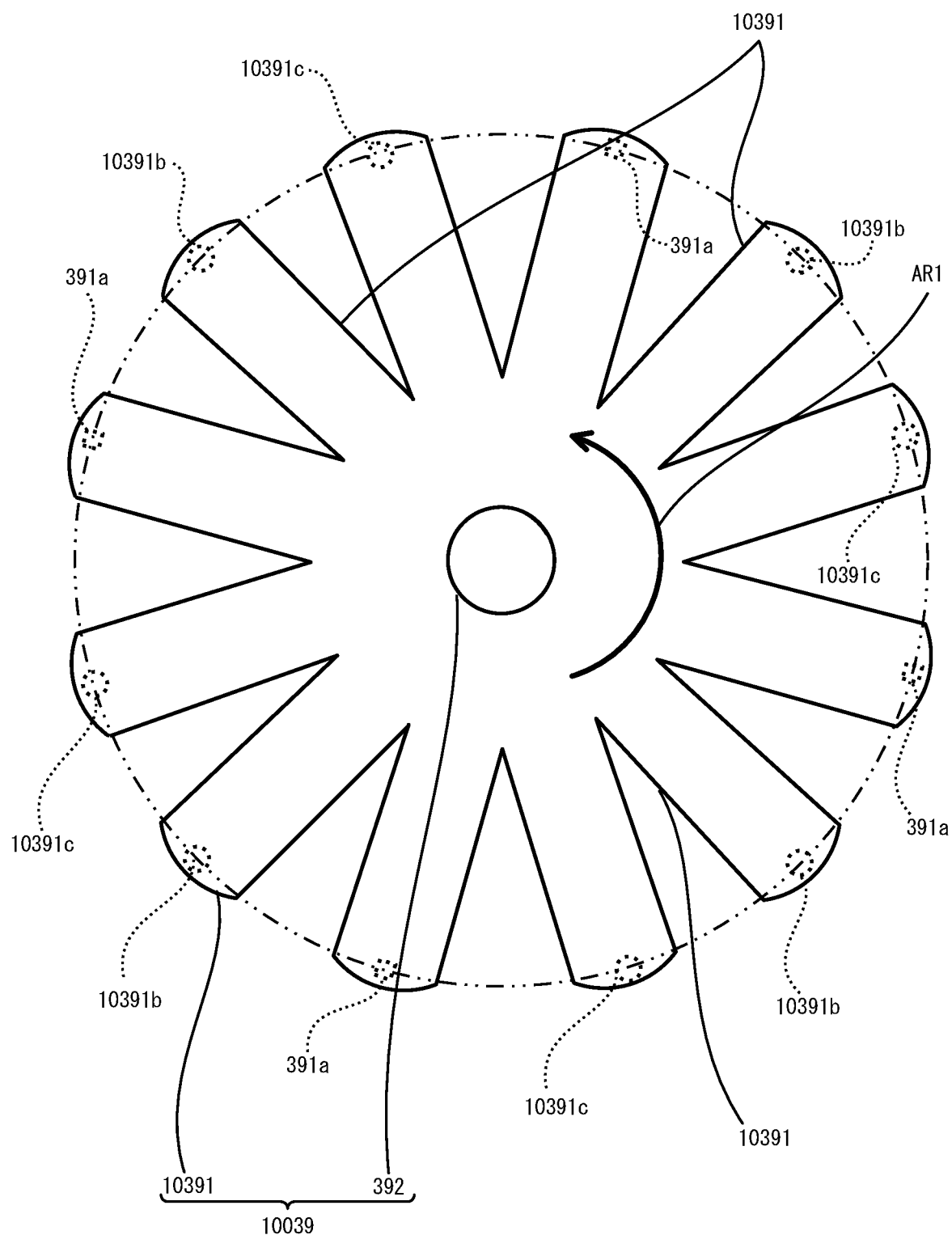
FIG. 43 is a schematic plan view of a chip conveying unit according to the modified example.

Although in the configuration illustrated in FIG. 42 above the cleaning head 7856 and the water supplying unit 7852 for supplying water to the connecting face CPf of the chip CP are provided above the stage 7831, the water supplying unit and the cleaning head are not limited to this configuration. For example, as illustrated in FIG. 43, the chip conveying unit 10039 may have a plate 10391 provided with a chip holding unit 391a, a plate 10391 provided with a water supplying unit 10391c, and a plate 10391 provided with a cleaning unit 10391b. Here, the cleaning unit 10391b, for example, has a nozzle that dispenses a gas such as nitrogen or helium, and the water supplying unit 10391c, for example, has a nozzle for spaying water in a state in which ultrasound or megasonic treatment is applied. Furthermore, in the chip conveying unit 10039 illustrated in FIG. 43, rather than providing the plate 10391 with the cleaning unit 10391b, the chip conveying unit may be have just the plate 10391 provided with the chip holding unit 391a and the plate 10391 provided with the water supplying unit 10391c. Alternatively, at the distal part of the plate 10391 provided with the chip holding unit 391a, a non-illustrated water supplying unit and a non-illustrated cleaning unit may be provided at a position separated from the chip holding unit 391a in the direction of rotation of the plate 10391.

Due to such configuration, an operation such as retraction of the substrate WT to above the chip CP by moving the stage 7831 in a configuration such as that illustrated in FIG. 42, for example, is unnecessary, and thus the removing of particles from the connecting face CPf of the chip CP and supplying water to the connecting face CPf are performed in a short period, which is advantageous for a manufacturing task.

Figure 44:
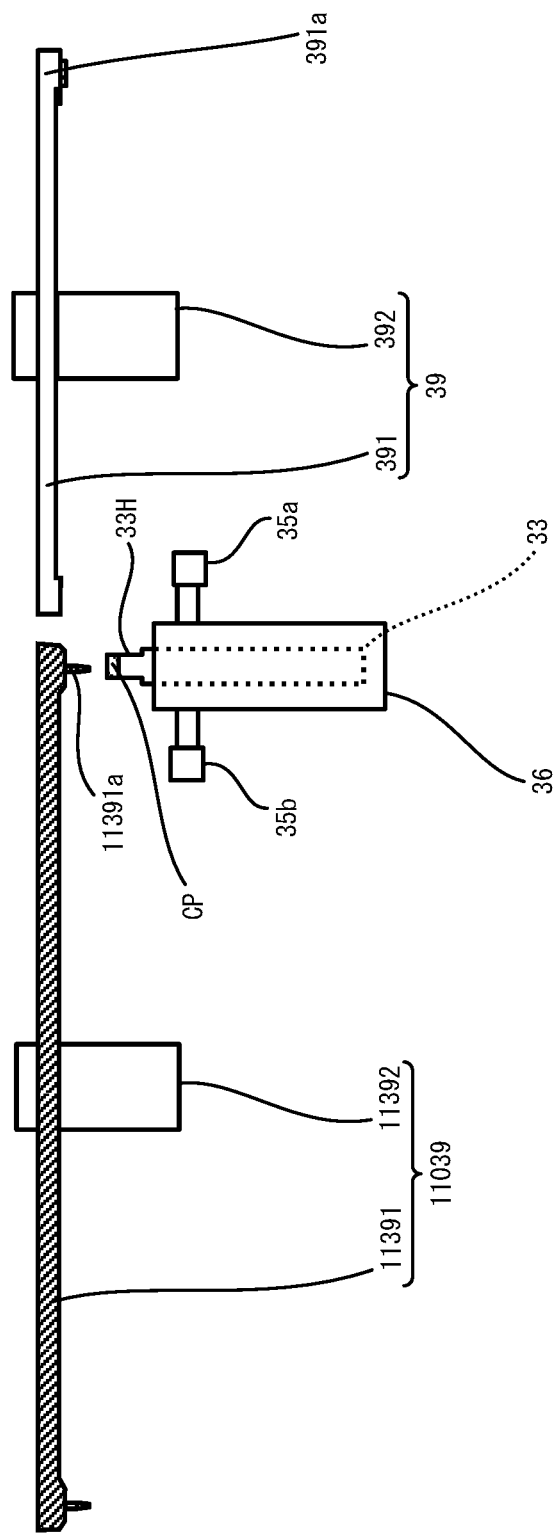
FIG. 44 is a schematic drawing of a part of a chip mounting system according to the modified example.
Figure 45:
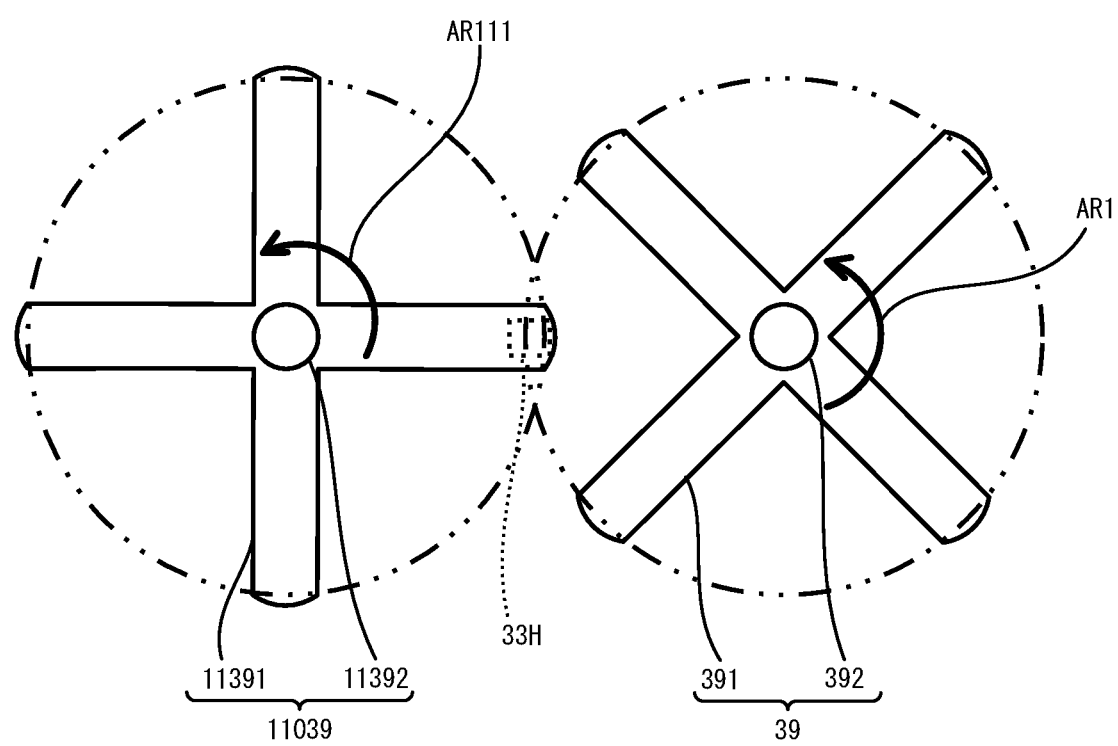
FIG. 45 is a schematic plan view of a part of a chip mounting system according to another modified example.

Moreover, as illustrated in FIG. 44, the chip mounting system may be configured by equipment with, separate from the chip conveying unit 39, a supplying unit 11039 for spraying gas against the connecting face CPf for removing particles attached to the connecting face CPf, for supplying water to the connecting face CPf of the chip CP, or the like arranged centered on the head 33H and opposite thereto. This supplying unit 11039 has multiple plates 11391 provided with nozzles 11391a for jetting water or gas at the distal part and a plate drive unit 11392 for rotational driving of the multiple plates 11391 in unison. Due to the present configuration as illustrated in FIG. 45, the distal part of the plate 391 of the chip conveying unit 39 and the distal part of the plate 11391 of the supplying unit 11039 rotate with mutual synchronization (see arrows AR1 and AR111 in FIG. 45), and are alternatingly moved above the head 33H. Due to such operation, the series of operations including the supply operation of supplying the water to the connecting face CPf of the chip CP held by the head 33H and the operation of delivering the chip CP to the head 33H can be executed with good efficiency, and thus such operation is advantageous for increasing manufacturing efficiency. Moreover, a vacuum pathway for suction attachment of the chip CP and a vacuum-breaking pathway for stopping such suction attachment are provided for the chip conveying unit 39, and thus there is structural difficulty in additionally providing this chip conveying unit 39 with a pathway for introduction of a gas blown against the connecting face CPf during cleaning of the connecting face CPf of the chip CP and a pathway for supply of water to the connecting face CPf. Therefore, as explained above, a supplying unit 11039 is preferably provided, separate from the chip conveying unit 39, for blowing gas or supply water.

Further, the chip mounting system may be configured, for example, to have the supplying unit 11039 perform the supplying of water to the connecting face CPf of the chip CP and the blowing of gas for cleaning the connecting face CPf. Moreover, the chip mounting system may be configured to perform by the chip conveying unit 39 the blowing of gas for cleaning the connecting face of the chip CP, and to perform by the supplying unit 11039 the supplying of water to the connecting face CPf. Furthermore, the chip mounting system may be configured to perform by the chip conveying unit 39 the supplying of water to the connecting face CPf of the chip CP and to perform by the supplying unit 11039 the blowing of gas for cleaning the connecting face CPf. Furthermore, the placement of the chip conveying unit 39 and the supplying unit 11039 are not limited to the aforementioned positions.

However, in the case of the substrate WT, water can be supplied to the mounting face WTf by performing a water washing step by spin coating after activation of the mounting face WTf of the substrate WT by exposure to a nitrogen plasma or the like. In the water washing step, water imparted with vibrations by a means such as ultrasound is sprayed while the substrate WT is rotated, and then the substrate is spin dried. Due to such processing, particles attached to the mounting face WTf of the substrate are removed, and water can be applied to the mounting face WTf. However, after attachment of the dicing tape TE, water is not directly applied to the connecting face CPf of the chip CP. Moreover, if there is a method for surface activation by beam irradiation even in the presence of the dicing tape TE, the hydrophilization treating device 60 can perform activation without impurities generated from the dicing tap TE attaching to the mounting face WTf of the substrate WT. However, performing the water washing step on the connecting face CPf is not possible in the state in which the dicing tape TE is attached to the chip CP. Therefore, the particles might not be removed from the connecting face CPf of the chip CP, and sufficient water might not be able to be applied to the connection between the substrate WT to the connecting face CPf.

In contrast, according to the present configuration, the water supplying unit sprays water against the connecting face CPf of the chip CP supplied from the chip supplying unit 11. Due to such configuration, sufficient water can be applied to the connection between the substrate WT and the connecting face CPf of the chip CP, and thus problems during temporary bonding of the chip CP to the substrate WT can be prevented, thereby preventing the chip CP falling off of the substrate WT after bonding. Moreover, due to interposing of water between the mounting face WTf of the substrate WT and the connecting face CPf of the chip CP, the temporary bonding proceeds smoothly, and as a result, such processing has the advantage of making the introduction of voids between the substrate WT and the chip CP unlikely. Moreover, during performance of positional adjustment of the chip CP relative to the substrate WT after contacting of the chip CP against the substrate WT, in addition to the method of separating the substrate WT from the chip CP and then re-contacting the chip CP against the substrate WT after correcting the orientation of the chip CP, a method can be used that moves the chip CP relative to the substrate WT in a state in which the chip CP is contacted through water against the substrate WT. In this case, after checking the position of the chip CP relative to the substrate WT, the force pressing the chip CP against the substrate WT can be increased and the water interposed between the chip CP and the substrate WT can be pressed out, thereby enabling temporary bonding of the chip CP to the substrate WT.

Further, the bonding device may be equipped with a water supplying unit as well as a blower for dispensing nitrogen. The blower may be provided at a position adjacent to the water dispensing unit in the rotation direction of the chip holding unit 391*a* and at a part facing the connecting face CPf of the chip CP in a state in which the chip CP is held on the chip holding unit 391*a* of the chip conveying unit 39, for example. Alternatively, the bonding device as illustrated in FIG. 42 may be configured such that the cleaning head that has the blower nozzle is supported by the supporting unit 7855 together with the water supplying unit. Here, in a manner similar to that of the water supplying unit, in the state in which the stage 7831 is moved so that the through hole 7831*a* provided in the stage 7831 is positioned vertically below the cleaning head, the cleaning head is moved vertically below the blower nozzle and inserted into the through hole 7831*a*. In this case, prior to the supplying of water to the connecting face CPf of the chip CP from the water supplying unit, nitrogen is dispensed from the blower to the connecting face CPf, thereby enabling the bonding device to remove particles attached to the connecting face CPf.

Furthermore, the present configuration, in addition to supplying water to the connecting face CPf of the chip CP, may supply and apply a liquid such as a weak acid. Particularly in the case in which the chip CP is mounted on a Cu electrode formed on the mounting face WTf of the substrate WT, the substrate WT and the chip CP can be suitably bonded together by applying the liquid such as the weak acid together with water to the connecting face CPf of the chip CP.

Although an example is described in Embodiment 1 in which the chip supplying unit 11 supplies the chips CP in a state in which the dicing tape TE is attached, this configuration is not limiting, and a configuration may be used in which the chip supplying unit supplies the chips CP in a state in which the chips CP are placed in a tray. Alternatively, a configuration may be used in which the chip supplying unit supplies the chips CP one at a time. The chip supplying unit is not necessarily separate from the bonding device, and for example, the bonding device may be equipped with a chip supplying unit that has on the stage 31 a non-illustrated suction attachment holding mechanism that holds by suction at least one chip CP. In this case, the chip CP held by the suction attachment holding mechanism is supplied to the head 33H.

When the chip supplying unit 11 in Embodiment 1 holds from vertically below the dicing tape TE the chip CP in a state in which the connecting face CPf of the chip CP faces vertically upward, the chip supplying unit 11 uses as the dicing tape TE a special sheet that does not cause impurities to attach to the connecting face CPf of the chip CP, and after hydrophilization treatment and selective removal of particles, the dicing substrate WC is attached to the dicing tape TE such that the connecting face CPf side of the dicing substrate WC becomes the dicing tap TE side. The chip mounting system may be configured such that the chip delivering unit 123 receives the chip CP from the chip supplying unit 11 directly without using the chip inverting unit 131.

Although in Embodiment 2 the substrate WT is transparent and the resin on the mold M is cured by irradiating ultraviolet light from vertically above the substrate WT, this configuration is not limiting. For example, in the case in which the substrate WT is not transparent to ultraviolet light, a configuration may be used in which the mold M is formed from a material that transmits ultraviolet light such as a transparent glass, and the irradiation with ultraviolet light is performed from vertically below the mold M. Moreover, in the case in which the mold M is formed from a material such as the transparent glass, the distance measuring unit may be disposed vertically below the mold M to perform measurement. Moreover, in the case in which the substrate WT is formed from a material such as Si that transmits infrared light, the resin shaping device may be configured such that alignment is executed by use of an infrared-transmitting camera as the imaging unit 2041.

An example is described in Embodiment 2 in which the resin part R is formed from the ultraviolet light-curing resin. However, the material of the resin part R is not limited to the material of this example, and for example, formation is possible using a thermosetting resin or a thermoplastic resin. In this case, the resin shaping device may be configured by including, rather than the ultraviolet irradiating unit, a non-illustrating heating unit for heating the resin part R in a state in which the mold M is pressed against the resin part R. A heater embedded in the mold holding unit or an infrared heater that irradiates the substrate WT from above with infrared radiation, for example, may be used as the heating unit. According to the present configuration, the resin part cured on the substrate WT may be formed even in the case in which the resin part R is formed from the thermosetting type resin.

Moreover, in the case in which the resin forming the resin part R is the thermosetting type resin or the thermoplastic type resin, the resin shaping device may be configured such that, when the mold M is pressed against the substrate WT, the resin placed in the mold M may be heated and softened by the aforementioned heating unit.

However, when contact surface area between the mold M and the resin part R is large, the force to be applied to the mold M in the state in which the mold M is pressed against the resin part R increases. Further, when the force applied to the mold M increases, probability increases that the stage 2031 bends such that the accuracy of forming of the resin part R decreases. In contrast, according to the present configuration, in the state in which the mold M is pressed against the resin part R, the resin forming the resin part R is heated to a temperature in the predetermined temperature range for softening of the resin, thereby enabling a lowering of the pressure to be applied to the mold M. Therefore during the forming of the resin part R, bending of the stage 2031 is suppressed, thereby enabling an increase in the accuracy of forming of the resin part R.

In Embodiment 2, an example is described in which the distance between the forming face WTf of the substrate WT and the flat surface MF of the mold M is measured by the distance measuring unit 511 irradiating with laser light from above the substrate WT and the mold M. However, this configuration is not limiting, and for example, the distance measuring unit 511 may be configured to measure the distance between the forming face WTf of the substrate WT and the flat surface MF of the mold M by irradiating with laser light from below the substrate WT and the mold M.

In Embodiment 2, an example is described in which the distance measuring unit 511 uses laser light to measure the distance between the substrate WT and the forming face WTf and the distance between the mold M and the flat surface MF. However, in this configuration, when part of the resin part R protrudes on the flat surface MF between the substrate WT and the mold M, the distance measuring unit 511 preforms the measurement in a state in which the part of the resin part R is interposed between the substrate WT and the mold M. When this occurs, the laser light is attenuated by absorption by the resin part R interposed between the substrate WT and the mold M, and sometimes the reflecting light cannot be suitably detected.

Therefore, the distance measuring unit may measure the distance between the substrate WT and the mold M in a region where the resin part R is not interposed between the substrate WT and the step part MS of the mold M. In this case, the attenuation of laser light due to absorption by the resin part R interposed between the substrate WT and the mold M is suppressed, and thus the distance between the substrate WT and the mold M can be measured with good accuracy.

In Embodiment 1, although an example is described in which the alignment marks MC1a and MC1b of the chip CP are provided on the connecting face CPf, this configuration is not limiting, and for example, the alignment marks MC1a and MC1b may be provided on the surface opposite to the connecting face CPf side of the chip CP. Moreover, in Embodiment 2, although an example is described in which the alignment marks MM1a and MM1b are provided on the flat surface MF of the mold M, this configuration is not limiting, and for example, the alignment marks MM1a and MM1b may be provided on the surface opposite to the flat surface MF of the mold M. Furthermore, the alignment marks MM1a and MM1b may be provided of the step part MS of the mold M.

In Embodiment 2, although an example is described in which the mold M made from a material such is metal is pressed from above against the transparent substrate WT, and irradiation with ultraviolet light is performed by the ultraviolet irradiating unit 52 from above the substrate WT so that the resin R1 cures, this configuration is not limiting. For example, in the case in which the substrate WT is made of a non-transparent material such as Si, the mold M may be formed from a transparent material, and the irradiation with ultraviolet light may be performed from above the mold M. Moreover, when an imaging unit is used that uses infrared radiation, the imaging of the alignment marks by the imaging unit may be performed from above the Si substrate.

In Embodiment 2, although an example is described in which the gap between the flat surface MF of the mold M and the forming face WTf of the substrate WT is measured directly by laser, this configuration is not limiting. For example, in circumstances such as when reflection of laser light is difficult or the resin R1 is interposed between the flat surface MF of the mold M and the forming face WTf of the substrate WT, a mirror may be provided for the head 2033H supporting the mold M, and laser light reflected from the mirror may be used to measure the distance between the flat surface MF of the mold M and the forming face WTf of the substrate WT. In this case, the distance between the mirror and the flat surface MF of the mold M is measured beforehand, and the distance between the flat surface MF of the mold M and the forming face WTf of the substrate WT may be calculated by subtracting the distance measured beforehand between the mirror and the flat surface MF of the mold M from the distance between the mirror and the forming face WTf of the substrate WT. Furthermore, the mirror may be provided on the stage 2033 that supports the substrate WT.

Although an example is described in Embodiment 2 in which the resin R1 is poured into the concavity MT of the mold M, this configuration is not limiting. For example, the resin may be applied beforehand to the forming face WTf of the substrate WT. In the case in which the resin poured into the concavity MT of the mold M is recessed toward the inner part of the concavity MT, the recessed portion can be filled in by resin applied to the forming face WTf of the substrate WT. Moreover, such operation is advantageous for increasing adhesion between the substrate WT and the resin R1. Application of the resin just to the forming face WFf of the substrate WT is also permissible.

Although in Embodiment 2 forming the resin at high aspect ratio is mentioned, this configuration is not limiting. For example, the present method is suitable also in cases in which the formed object is formed with a high film thickness and gas bubbles readily remain at the bottom of the formed object. Examples of formed objects having a high film thickness include lenses, such as when the resin is used to form a lens upon a glass wafer.

Although in Embodiment 2 an example is described in which the distance between the mold M and the substrate WT is measured using laser light, this configuration is not limiting, and for example, a method may be adopted that performs measurement by using interference of reflected laser light. In this case, measurement accuracy improves due to the measurement being unaffected by temperature changes of the mold M or the substrate WT. Moreover, at least one of the substrate WT or the mold M may be formed from a material transparent to laser light.

Although an example is described in Embodiment 2 in which laser light is used to measure the distance between the mold M and the substrate WT, this configuration is not limiting, and measurement may be performing using a distance sensor such as a photosensor or a magnetic sensor. Alternatively, the distance between the mold M and the substrate WT may be measured on the basis of focal distance during imaging of the alignment marks by the camera.

Although an example is described in Embodiment 2 in which the ultraviolet light-curing reins is used, this configuration is not limiting, and an effect similar to that of Embodiment 2 can be achieved also when using the thermosetting type resin or the thermoplastic type resin. In the case of the thermosetting type resin, the resin softens in a predetermined temperature region lower than the temperature of setting of the resin. Alternatively, even though the temperature is set to a value beforehand that is at least as high as the curing temperature, the resin may soften during the curing. In the case of the thermoplastic resin, the resin is softened by heating to raise the temperature of the resin.

In Embodiment 2, a configuration is described in which, by the head drive unit 36 raising the head 2033H toward the substrate WT, the head 2033H approaches the stage 2031 so as to press the mold M from vertically below the substrate WT. However, this configuration is not limiting, and for example, a configuration may be used that is equipped with a non-illustrated stage drive unit that, after causing the head 2033H to face the position on the substrate WT where the resin part R is formed, moves the stage 2031 in the vertically downward direction, thereby causing the stage 2031 to approach the head 2033H so that the mold M is pressed from vertically below the substrate WT.

A nanoimprint device that performs finely detailed resin molding can be cited as the resin shaping device according to the embodiments.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-021953, filed on Feb. 9, 2017, International Application PCT/JP2017/040651, filed on Nov. 10, 2017, and International Application PCT/JP2018/001467, filed on Jan. 18, 2018, of which the entirety of the disclosures is incorporated by reference herein.

INDUSTRIAL APPLICABILITY

The present disclosure is suitable for manufacture of devices such as CMOS image sensors or memory, computing elements, and MEMS.

REFERENCE SIGNS LIST

1 Chip mounting system
2, 4, 6, 7021 Resin shaping device
10 Chip supplying device
11 Chip supplying unit
13 Chip moving unit
15 Supply chip imaging unit
30 Bonding device
31, 2031, 7204 Stage
33, 2033 Bonding unit
33H, 2033H, 8633H, 8733H, 8833H, 8933H Head
34 Z direction drive unit
35a, 35b First imaging unit
36 Head drive unit
37 θ direction drive unit
38 Linear guide
39, 10039 Chip conveying unit
41 Second imaging unit
50, 2050 Cover
52, 4052, 6052, 7052 Dispenser
53 Ultraviolet irradiating unit
55 Supporting unit
60 Hydrophilization treating device
65 Water washing unit
70 Conveying device
71 Conveying robot
80 Loading-unloading unit
90, 2090 Control unit
111 Picking mechanism
111a Needle
112 Tape holding part
113 Tape holding part drive unit
131 Chip inverting unit
132 Chip delivering unit
301 Fixing member
302, 3336 Base member
311 X direction moving unit
312, 314, 316, 8524d, 8924d Opening part
313 Y direction moving unit
315, 2315 Substrate placing unit
321 X direction drive unit
323 Y direction drive unit
331 Z direction moving member
332 First disc member
333 Piezo actuator
334 Second disc member
334a, 334b Hole
336 Mirror-fixing member
337 Mirror
337a, 337b Inclined surface
351a, 351b, 418 Image sensor
352a, 352b, 419 Optical system
361 Rotation member
363 Camera Z direction drive unit
365 Camera F direction drive unit
391, 10391, 11391 Plate
391a Chip holding unit
391b, 86413a Suction part
391c Protrusion part
392 Plate drive unit
411, 86411, 87411, 88411, 89411 Chip tool
413, 2413, 86413, 87413, 88413 Head main unit
415, 416 Hollow part
511 Distance measuring unit
520, 4520, 7520 Main unit
521, 4521, 7521 Dispenser drive unit
522, 4522, 7522 Nozzle
523, 4523, 7523 Dispensing control unit
901 MPU
902 Main memory
903 Auxiliary memory
904, 2904 Interface
905 Bus
1311 Arm
1311a Suction part
1312 Arm drive unit
2031a, 6524d, 7524d Through hole
2041 Imaging unit
6524, 8524, 8924 Cap
6524a, 7201a, 7524a, 8524a, 8924a Exhaust port
6524b Bottom wall
6524c Side wall
6525, 6526, 7525, 7526, 8525, 8526, 8528, 8926, 8928 O-ring
6526, 7202 Vacuum pump
7022 Resin placing device
7201 Chamber
7527 Flange member
8520 Flange part
10391b Cleaning unit
10391c Water supplying unit
11039 Supplying unit
86411a, 86411b, 87411b Through hole
87413b Dispensing port CP Chip
CPf Connecting face
CPk Cutout part
TE Dicing tape
L6 Exhaust pipe
M, MB Mold
MC1a, MC1b, MC2a, MC2b, MM1a, MM1b, MM2a, MM2b Alignment mark
MF Flat surface
MT Concavity
OB1 Orbit
R Resin part
R1, R2 Resin
WC, WT Substrate
WTf Mounting face (forming face)

The invention claimed is:

1. A component mounting system for mounting a component on a substrate, the mounting system comprising:
   a component supplying unit configured to supply the component;
   a substrate holding unit configured to hold the substrate in an orientation such that a mounting face for mounting the component on the substrate is facing vertically downward;
   a head configured to hold the component from vertically below; and
   a head drive unit connectively attached to the head configured to perform a vertically upward movement of the head while holding the holding component, causes the head to approach the substrate holding unit to mount the component on the mounting face of the substrate.

2. The component mounting system according to claim 1, wherein the component supplying unit comprises (i) a sheet holding unit configured to hold a dicing substrate such that a sheet is positioned vertically upward of the dicing substrate, the dicing substrate being the substrate diced and attached to the sheet, and (ii) a picking mechanism configured to the component included in the dicing substrate by pick out vertically downward from vertically above the sheet.

3. The component mounting system according to claim 1, wherein
   the component mounting system further comprises a component conveying unit configured to convey the component supplied from the component supplying unit to a receiving position for the head to receive the component.

4. The component mounting system according to claim 3, wherein the component conveying unit conveys the component by holding an upper surface side in a state in which a side of the substrate for mounting the component faces vertically upward.

5. The component mounting system according to claim 4, wherein
   the component mounting system further comprises (i) a component inverting unit configured to vertically invert the component supplied from the component supplying unit, and (ii) a component delivering unit configured to receive the inverted component from the component inverting unit and to pass the received component to the component conveying unit,
   the component conveying unit comprises an even number of plates, each plate having at one end thereof a component holding unit configured to hold the component, the one end rotating around the other end of the plate, the rotation being centered on a point positioned between the component supplying unit and the head,
   in a first state in which the one end of one of the even number of plates overlaps the head in a vertical direction, the component conveying unit executes (i) mounting, by the head drive unit, on the substrate the component held by the head, (ii) supplying of the component to the inverting unit from the component supplying unit, (iii) delivering the component from the component delivering unit to the component conveying unit, and
   in a second state in which one end of one of the even number of places does not overlap the head in the vertical direction, the component conveying unit executes (i) mounting, the head drive unit, on the substrate the component, (ii) inverting the component by the component inverting unit, and (iii) delivering the component from the component inverting unit by the component delivering unit.

6. The component mounting system according to claim 5, wherein
   the plate further comprises at least one of (i) a water supplying unit configured to apply water to the side of the substrate for mounting the component, by supplying water to the side of the substrate for mounting the component, or (ii) a cleaning unit configured to clean the side of the substrate for mounting the component.

7. The component mounting system according to claim 3, wherein
   the component has a rectangular parallelepiped shape and has a cutout part formed in an outer peripheral part of a connecting face for connecting to the substrate,
   the component conveying unit further comprises (i) a suction part and (ii) a protrusion part protruding at a periphery of the suction part, a protrusion amount of the protrusion part being greater than a height of the cutout part in a direction perpendicular to the connecting face of the cutout part, and
   the component holding unit holds the component by suction attachment by the suction part in a state in which a distal part of the protrusion part abuts against the cutout part.

8. The component mounting system according to claim 1, further comprising:
   a first imaging unit configured to, in a state in which the component is disposed at a position for mounting the component on the substrate, image a first alignment mark of the component from vertically below the component.

9. The component mounting system according to claim 8, further comprising:
   a control unit configured to (i) calculate a relative positional error between the substrate and the component based on images obtained by the imaging of the first alignment mark of the component and the second alignment mark of the substrate in the state of contact between the substrate and the component, and (ii) in response to the relative positional error, cause the head drive unit and the substrate holding unit to correct a position and an orientation of the component relative to the substrate.

10. The component mounting system according to claim 1, further comprising:
   a second imaging unit configured to, in a state in which the component is disposed at the position for mounting the component on the substrate, image a second alignment mark of the substrate from vertically above the component.

11. The component mounting system according to claim 1, wherein
the head drive unit, by causing the head holding the component to move vertically upward, causes the head to approach the substrate holding unit so that the component abuts against the mounting face of the substrate.

12. The component mounting system according to claim 11, further comprising:
a hydrophilization treating device configured to hydrophilize the mounting face of the substrate and the side of the component for mounted on the substrate, wherein
the head drive unit contacts the component against the substrate by contacting the component against the mounting face of the substrate hydrophilized by the hydrophilization treating device.

13. The component mounting system according to claim 10, further comprising:
a water supplying unit configured to apply water to at least the side of the component for mounting on the substrate, by supplying water to at least the side of the component for mounting on the substrate, wherein
the water supplying unit supplies water to the side of the component for mounting to the substrate during a period until the component held by the head contacts the mounting of the substrate after supplying of the component from the component supplying unit.

14. The component mounting system according to claim 13, further comprising:
a cleaning unit configured to clean the side of the component for mounting on the substrate, wherein
the cleaning unit cleans the side of the component for mounting on the substrate in the period until the component held by the head contacts the mounting face of the substrate after supplying of the component from the component supplying unit.

15. The component mounting system according to claim 14, further comprising:
a supplying unit comprising a plurality of plates, one of the plates having at one end thereof at least one of the water supplying unit or the cleaning unit, the one end rotating around the other end of the plate.

16. The component mounting system according to claim 11, wherein an electrode surface and a dielectric surface are present in a bonding surface mounted on the mounting face of the component.

17. The component mounting system according to claim 1, further comprising:
a component orientation adjusting unit configured to adjust at least one of (i) distance between the mounting face and the component or (ii) tilt of the component relative to the mounting face.

18. The component mounting system according to claim 17, further comprising:
a distance measuring unit configured to measure a distance between the mounting face of the substrate and a flat surface, the component having the flat surface, wherein
the head drive unit, based on the distance measured by the distance measuring unit, causes the head holding the component to approach the substrate holding unit holding the substrate.

19. The component mounting system according to claim 18, wherein
the distance measuring unit measures the distance between the mounting face and the flat surface for at least three locations on the flat surface, and
the component orientation adjusting unit, based on the distance between the mounting face and the flat surface measured by the distance measuring unit, adjusts at least one of (i) distance between the mounting face and the component or (ii) tilt of the component relative to the mounting face.

20. The component mounting system according to claim 17, wherein the component orientation adjusting unit comprises a plurality of piezo actuators configured to support the head, and adjusts at least one of (i) the distance between the mounting face and the component or (ii) the tilt of the component relative to the mounting face by causing expansion and contraction of the piezo actuators individually.

21. The component mounting system according to claim 1, wherein
the head comprises (i) a peripheral part holding unit configured to hold a peripheral part of the component, and (ii) a pressing part configured to press a central part of the component in a vertically upward direction, and
the head drive unit causes the central part of the component to firstly abut against the mounting face of the substrate, with the peripheral part holding unit holding the peripheral part of the component, by the head drive unit pressing part pressing the central part of the component in a state in which the component bends such that the central part of the component projects toward the substrate more in comparison to the peripheral part of the component.

22. The component mounting system according to claim 1, wherein
the component has a connecting face for connecting to the substrate,
the head comprises a variably-tiltable holding unit configured to hold the component with a variable tilt of the connecting face of the component relative to the mounting face of the substrate,
in a state in which the component is held by the variably-tilted holding unit with the connecting face tilted relative to the mounting face, the head drive unit causes firstly an edge of the connecting face of the component to abut against the mounting face of the substrate.

23. The component mounting system according to claim 1, further comprising:
a cap disposed on the head and configured to abut against the substrate and to form a hermetically sealed space against the substrate in a state in which the head approaches the substrate by a predetermined distance; and
a vacuum source configured to raise a degree of vacuum of the space by evacuating a gas present in the space, wherein
after raising of the degree of vacuum within the cap while the head drive unit causes the cap to abut against the substrate, the head drive unit causes the head to approach the substrate holding unit and mount the component on the mounting face of the substrate.

24. The component mounting system according to claim 1, wherein
the component mounting system causes surface bonding of the at least one of the components to the substrate by pressing the at least one of the components against the mounting face so as to contact a connecting face of the at least one of the components against the mounting face of the substrate.

25. The component mounting system according to claim 24, wherein an electrode surface and a dielectric surface are present in a bonding surface mounted on the mounting face of the at least one of the components.

26. The component mounting system according to claim 1, wherein the component mounting system mounts the components on the substrate in a state in which a gap of 1 μm or less is provided in at least one part between the substrate and the components.

\* \* \* \* \*